US007083891B2

(12) United States Patent
Shimomura et al.

(10) Patent No.: US 7,083,891 B2
(45) Date of Patent: *Aug. 1, 2006

(54) MULTI-COLOR IMAGE FORMING MATERIAL AND MULTI-COLOR IMAGE FORMING METHOD

(75) Inventors: Akihiro Shimomura, Shizuoka (JP); Shinichi Yoshinari, Shizuoka (JP); Kazuhito Miyake, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/499,127

(22) PCT Filed: Dec. 17, 2002

(86) PCT No.: PCT/JP02/13196

§ 371 (c)(1),
(2), (4) Date: Jun. 17, 2004

(87) PCT Pub. No.: WO03/051644

PCT Pub. Date: Jun. 26, 2003

(65) Prior Publication Data

US 2005/0112493 A1 May 26, 2005

(30) Foreign Application Priority Data

| | | |
|---|---|---|
| Dec. 17, 2001 | (JP) | 2001-383316 |
| Jan. 30, 2002 | (JP) | 2002-022013 |
| Jan. 30, 2002 | (JP) | 2002-022014 |
| Mar. 14, 2002 | (JP) | 2002-070721 |

(51) Int. Cl.
*G03F 7/34* (2006.01)
*G03F 7/11* (2006.01)
*G03F 7/09* (2006.01)

(52) U.S. Cl. ....................... 430/200; 430/201; 430/939

(58) Field of Classification Search ................ 430/200, 430/201, 939; 428/32.51, 32.39

See application file for complete search history.

(56) References Cited

U.S. PATENT DOCUMENTS 5,252,533 A * 10/1993 Yasuda et al. .............. 503/227
6,027,850 A * 2/2000 Kawakami et al. ......... 430/201
(Continued)

FOREIGN PATENT DOCUMENTS

EP 0 696 518 A1 2/1996
EP 0 830 941 A1 3/1998
(Continued)

OTHER PUBLICATIONS

International Search Report dated Mar. 18, 2003.

*Primary Examiner*—Richard L. Schilling
(74) *Attorney, Agent, or Firm*—Sughrue Mion, PLLC

(57) ABSTRACT

A multicolor image forming material in which a laser beam irradiated region of an image forming layer of a thermal transfer sheet is transferred onto an image receiving layer of an image receiving sheet, wherein: (a) a rate of heat shrinkage in the machine direction and a rate of heat shrinkage in the traverse direction of the image receiving sheet are both not more than 1% with the rate of heat shrinkage in the traverse direction being smaller than the rate of heat shrinkage in the machine direction, (b) a coefficient of dynamic friction between the thermal transfer sheet surface and the image receiving sheet surface is not more than 0.70, (c) a stiffness in the machine direction (Msh) and a stiffness in the traverse direction (Tsh) of the thermal transfer sheet are both from 30 to 70 g, a stiffness in the machine direction (Msr) and in the traverse direction (Tsr) of the image receiving sheet are both from 40 to 90 g, Msh/Tsh and Msr/Tsr are each from 0.75 to 1.20 and (Msr−Msh) and (Tsr−Tsh) are each from 10 g to 40 g or (d) at least the magenta thermal transfer sheet has a breaking stress from 150 to 300 MPa in both machine (MD) and crosswise (CD) directions with the breaking stress in the crosswise direction being at least 10 MPa larger than in the machine direction and a breaking elongation of from 80 to 300% in both machine and crosswise directions with the breaking elongation in the machine direction being at least 5 % larger than in the crosswise direction.

4 Claims, 6 Drawing Sheets

U.S. PATENT DOCUMENTS 6,326,121 B1 * 12/2001 Takahashi .................. 430/200
6,790,492 B1 * 9/2004 Shimomura et al. ..... 428/32.52
6,830,863 B1 * 12/2004 Wachi et al. ............... 430/200
6,864,033 B1 * 3/2005 Nakamura et al. .......... 430/200

FOREIGN PATENT DOCUMENTS

JP 5-16553 A 1/1993
JP 6-79980 A 3/1994
JP 6-219052 A 8/1994
JP 7-125466 A 5/1995
JP 8-224975 A 9/1996
JP 8-300840 A 11/1996
JP 9-1947 A 1/1997
JP 10-114149 A 5/1998
JP 11-223938 A 8/1999
JP 11-301117 A 11/1999
JP 2003-37956 A 2/2000
JP 2000-85253 A 3/2000
JP 2000-135862 A 5/2000

* cited by examiner

MULTI-COLOR IMAGE FORMING MATERIAL AND MULTI-COLOR IMAGE FORMING METHOD

TECHNICAL FIELD

The present invention relates to a multicolor image forming material for forming a full-color image with high resolution using laser beam and a multicolor image forming method using the subject material. In particular, the invention relates to a multicolor image forming material and a color image forming method useful for preparing a color proof in the printing field by laser recording from digital image signals (DDCP: direct digital color proof) or a mask image.

BACKGROUND ART

In the graphic art field, printing on a printing plate is carried out using one set of color separating film prepared using a lith film from a color original. In general, prior to regular printing (actual printing works), for the sake of checking errors in the color separation step or necessity of color correction, etc., a color proof is prepared from the color separating film. The color proof is desired to realize a high resolving power enabling high reproducibility of intermediate tone images and have such a performance as high step stability. Also, for the sake of a color proof resembling to an actual printed matter, it is preferred to use materials actually used in the printed matters as materials to be used for the color proof, for example, an actual paper stock as a substrate and a pigment as a coloring material. Also, as the method of preparing a color proof, a demand for a developing solution-free dry method is high.

As the dry color proof preparation method, following the recent spread of electronic system in the pre-printing step (pre-press field), a recording system of preparing a color proof directly from digital signals is developed. Such an electronic system is aimed to prepare a color proof having an especially high image quality and reproduces halftone dot images of 150 lines or more per inch. In order to record a high-image quality proof from digital signals, laser beam capable of being modulated by digital signals and of finely limiting recording light is used for a recording head. For this reason, development of an image forming material exhibiting a high recording sensitivity to laser beam and having a high resolving power enabling reproduction of high-definition halftone dots becomes necessary.

As an image forming material to be used in the transferred image forming method utilizing laser beam, a thermofusible transfer sheet comprising a support having thereon a photothermal converting layer of absorbing laser beam to generate heat and an image forming layer having a pigment dispersed in a thermofusible component such as waxes and binders in this order is known (JP-A-5-58045). In the image forming method using such an image forming material, the image forming layer corresponding to a laser beam irradiated region of the photothermal converting layer is melted by the heat generated in that region and transferred onto an image receiving sheet laminated and aligned on the transfer sheet, whereby a transferred image is formed on the image receiving sheet.

Also, JP-A-6-219052 discloses a thermal transfer sheet comprising a support having thereon a photothermal converting layer containing a photothermal converting substance, a thermal release layer that is a very thin layer (from 0.03 to 0.3 μm), and an image forming layer containing a coloring material in this order. In this thermal transfer sheet, a bonding force between the image forming layer and the photothermal converting layer bonded to each other via the foregoing thermal release layer is reduced upon irradiation with laser beam, whereby a high-definition image is formed on an image receiving sheet laminated and aligned on the thermal transfer sheet. The image forming method using the foregoing thermal transfer sheet utilizes so-called "abrasion" and concretely, utilizes a phenomenon in which since a part of the thermal release layer is decomposed and vaporized in a region where laser beam is irradiated, the bonding force between the image forming layer and the thermal conversion layer in that region becomes weak, whereby an image is transferred onto the image receiving sheet laminated on the image forming layer in that region.

These image forming methods have such advantages that an actual paper stock provided with an image receiving layer (adhesive layer) can be used as an image receiving sheet material and that a multicolor image can be easily obtained by transferring images having a different color onto an image receiving sheet one after another. In particular, the image forming method utilizing abrasion has such an advantage that a high-definition image is easily obtained and is useful for preparing a color proof (DDCP: direct digital color proof) or a high-definition mask image.

With the advance of the DTP circumstance, in the use destination of CTP (Computer To Plate), a film take-up step in the middle becomes unnecessary, and the need of proof by means of the DDCP system becomes strong in place of proof printing or proof of analog system. In recent years, a large-size DDCP having higher grade and higher stability and having excellent print conformity is being demanded.

The laser thermal transfer system can undergo photographic printing with high resolution, and there have hitherto been known systems such as (1) a laser sublimation system, (2) a laser abrasion system, and (3) a laser fusion system. However, all of these systems involved such a problem that the recording halftone dot shape is not sharp. The laser sublimation system (1) involved such problems that since it uses a dye as the coloring material, approximation property to a printed matter is not sufficient and that since it is a system in which the coloring material is sublimated, outlines of halftone dots get blurred so that the resolution is not sufficiently high. On the other hand, in the laser abrasion system, approximation property to a printed matter is good because a pigment is used as the coloring material. However, since this system is a system in which the coloring material scatters, it involved such a problem that likewise the sublimation system, outlines of halftone dots get blurred so that the resolution is not sufficiently high. Further, the laser fusion system (3) involved such a problem that since fused materials flow, clear outlines do not appear.

Also, for the sake of shortening the recording time in image recording using laser beam, laser beam made of multiple beams, which use a plurality of laser beams, is recently employed. If recording is performed with laser beam made of multiple beams using a conventional thermal transfer sheet, there may be the case where the image density of a transferred image formed on an image receiving sheet is insufficient. In particular, a reduction of the image density becomes remarkable in the case of performing laser recording with high energy. As a result of investigations made by the present inventor, it was noted that the reduction of the image density is caused by unevenness of transfer generated in the case of laser irradiation with high energy.

Further, there were encountered such problems that the register accuracy is not sufficient and that wrinkles are liable to be generated at the time of actual paper stock transfer.

Also, there was the case of causing such an inconvenience that in accumulating image receiving sheets having an transferred image onto a printed thermal transfer sheet as laminated after image transfer from a variety of thermal transfer sheets to image receiving sheets in a tray, etc., the thermal transfer sheets are dropped from the tray, or the image receiving sheets are curled.

Also, there was encountered such a problem that when the size is made large, traveling property of thermal transfer sheets or image receiving sheets becomes difficult, or jamming or other troubles are generated.

Moreover, there was encountered such a problem that the image quality is reduced by scuffing of the cut surface because of cutting failure of thermal transfer sheets, or foreign matters such as contaminants generated during cutting.

DISCLOSURE OF THE INVENTION

An object of the invention is to solve the foregoing problems of the prior art and to provide a multicolor image forming material and a multicolor image forming method, from which a large-size DDCP having high grade and high stability and having excellent print conformity is obtained. Concretely, an object of the invention is to provide a multicolor image forming material and a multi-color image forming method, in which 1) a thermal transfer sheet is excellent in sharpness and stability of halftone dots in transfer of a coloring material thin film without being influenced by an illumination light source, even in comparison with pigment coloring materials and printed matters; 2) an image receiving sheet can stably and surely receive an image forming layer of a laser energy thermal transfer sheet and is good in transfer property onto wood-free paper (paper having rough surface roughness) as an actual paper stock; 3) it is possible to undergo actual paper stock transfer corresponding to at least the range of from 64 to 157 $g/m^2$, such as art (coated) paper, mat paper, and finely coated paper, it is possible to undergo delicate texture drawing or reduction of accurate paper white (high-key area), and wrinkles are not generated at the time of actual paper stock transfer; and 4) even under a different temperature-humidity condition, in the case where laser recording is performed with high energy using laser beam as multiple beams, it is possible to form an image having good image quality and stable transfer density on an image receiving sheet.

Especially, one object of the invention is to provide a multicolor image forming material having improved register accuracy and controlled generation of wrinkles at the time of actual paper stock transfer.

Also, another object of the invention is to provide a multicolor image forming material having good accumulation property between a thermal transfer sheet and an image receiving sheet after image recording by transfer onto an image receiving layer of the image receiving layer from the thermal transfer sheet.

Also, a still another object of the invention is to provide a multicolor image forming material having excellent traveling property even in the case of large size.

Moreover, an even another object of the invention is to provide a multicolor image forming material provided with a thermal transfer sheet having excellent cutting performance, resulting in neither generation of scuffing in the cut surface of the sheet nor a reduction of image quality by foreign matters such as contaminants generated during cutting. That is, means for solving the foregoing problems are as follows.

(1) A multicolor image forming material comprising an image receiving layer-containing image receiving sheet and thermal transfer sheets of different colors of 4 or more kinds of at least yellow, magenta, cyan and black, each containing a support having thereon at least a photothermal converting layer and an image forming layer, wherein the image forming layer of each thermal transfer sheet and the image receiving layer of the image receiving sheet are superposed opposite to each other, and upon irradiation with laser beam, a laser beam irradiated region of the image forming layer is transferred onto the image receiving layer of the image receiving sheet to undergo multicolor image recording, characterized in that:

a) a ratio of an optical density (OD) to a film thickness (μm) (OD/film thickness) of the image forming layer of each thermal transfer sheet is 1.50 or more, b) a recording area of multicolor image of each thermal transfer sheet is of a size of 515 mm×728 mm or more, c) a resolution of the transferred image onto the image receiving layer of the image receiving sheet is 2,400 dpi or more, d) a rate of heat shrinkage in the machine direction (M) and a rate of heat shrinkage in the transverse direction (T) of the image receiving sheet are both not more than 1%, and e) the rate of heat shrinkage in the transverse direction (T) of the image receiving sheet is smaller than the rate of heat shrinkage in the machine direction (M) thereof.

(2) The multicolor image forming material as set forth above in (1), characterized in that the image forming layer in the laser beam irradiated region is transferred in the state of a thin film onto the image receiving sheet.

(3) The multicolor image forming material as set forth above in (1) or (2), characterized in that the resolution of the transferred image is 2,500 dpi or more.

(4) The multicolor image forming material as set forth above in any one of (1) to (3), characterized in that the thermal transfer sheets are made of thermal transfer sheets of different colors of 4 or more kinds of at least yellow, magenta, cyan and black.

(5) The multicolor image forming material as set forth above in any one of (1) to (4), characterized in that the ratio of an optical density COD) to a film thickness (μm) (OD/film thickness) of the image forming layer of each of the thermal transfer sheets is 1.80 or more.

(6) The multicolor image forming material as set forth above in (5), characterized in that the ratio of an optical density (OD) to a film thickness (μm) (OD/film thickness) of the image forming layer of each of the thermal transfer sheets is 2.50 or more.

(7) The multicolor image forming material as set forth above in any one of (1) to (6), characterized in that the image forming layer of each of the thermal transfer sheets and the image receiving layer of the image receiving sheet each has a contact angle against water in the range of from 7.0 to 120.0°.

(8) The multicolor image forming material as set forth above in any one of (1) to (8), characterized in that the recording area of the multicolor image is of a size of 594 mm×841 mm or more.

(9) The multicolor image forming material as set forth above in any one of (1) to (8), characterized in that the ratio of an optical density (OD) to a film thickness (μm) (OD/film thickness) of the image forming layer of each of the thermal transfer sheets is 1.80 or more and that the contact angle of the image receiving sheet against water is 86° or more.

(10) A multicolor image forming material comprising an image receiving layer-containing image receiving sheet and thermal transfer sheets of different colors of 4 or more kinds of at least yellow, magenta, cyan and black, each containing a support having thereon at least a photothermal converting layer and an image forming layer, characterized in that after laser thermal transfer, a coefficient of dynamic friction between the thermal transfer sheet surface and the image receiving sheet surface is not more than 0.70.

(11) The multicolor image forming material as set forth above in (10), characterized in that a stiffness of the image receiving sheet is 50 g or more.

(11) The multicolor image forming material as set forth above in (10) or (11), characterized in that a surface electrical resistance of the image receiving layer of the image receiving sheet is not more than $1.0\times10^{15}\Omega$/sq.

(13) A multicolor image forming material comprising an image receiving layer-containing image receiving sheet and thermal transfer sheets of different colors of 4 or more kinds of at least yellow, magenta, cyan and black, each containing a support having thereon at least a photothermal converting layer and an image forming layer, wherein the image forming layer of each thermal transfer sheet and the image receiving layer of the image receiving sheet are superposed opposite to each other, and upon irradiation with laser beam, a laser beam irradiated region of the image forming layer is transferred onto the image receiving layer of the image receiving sheet to undergo multicolor image recording, characterized in that a ratio OD/T of an optical density (OD) of the image forming layer of each of the thermal transfer sheets to a layer thickness (unit: μm) of the image forming layer is 1.50 or more; that a recording area of a multicolor image of each of the thermal transfer sheets is of a size of 515 mm or more×728 mm or more; that a resolution of the transferred image is 2,400 dpi or more; that a stiffness in the machine direction (Msh) and a stiffness in the transverse direction (Tsh) of the thermal transfer sheet are both from 30 to 70 g; that a stiffness in the machine direction (Msr) and a stiffness in the transverse direction (Tsr) of the image receiving sheet are both from 40 to 90 g; that Msh/Tsh and Msr/Tsr are each from 0.75 to 1.20; and that 10 g≦(Msr−Msh)≦40 g and 10 g≦(Tsr−Tsh)≦40 g.

(14) The multicolor image forming material as set forth above in (13), characterized in that the transferred image is an image having a resolution of 2,600 dpi or more.

(15) The multicolor image forming material as set forth above in (13) or (14), characterized in that the thermal transfer sheets are made of thermal transfer sheets of different colors of 4 or more kinds of at least yellow, magenta, cyan and black.

(16) The multicolor image forming material as set forth above in any one of (13) to (15), characterized in that the ratio OD/T of an optical density (OD) of the image forming layer of each of the thermal transfer sheets to a film thickness (unit: μm) of the image forming layer is 1.80 or more.

(17) The multicolor image forming material as set forth above in any one of (13) to (16), characterized in that the recording area of the multicolor image is of a size of 594 mm or more×841 mm or more.

(18) The multicolor image forming material as set forth above in any one of (13) to (17), characterized in that the image forming layer of each of the thermal transfer sheets and the image receiving layer of the image receiving sheet each has a contact angle against water in the range of from 7.0 to 120.0°.

(19) The multicolor image forming material as set forth above in any one of (13) to (18), characterized in that the ratio OD/T of an optical density (CD) of the image forming layer of each of the thermal transfer sheets to a film thickness (unit: μm) of the image forming layer is 1.80 or more and that the contact angle of the image receiving sheet against water is not more than 86°.

(20) The multicolor image forming material as set forth above in any one of (13) to (19), characterized in that the ratio OD/T of an optical density (OD) of the image forming layer of each of the thermal transfer sheets to a film thickness (unit: μm) of the image forming layer is 2.50 or more.

(21) A multicolor image forming material comprising an image receiving layer-containing image receiving sheet and thermal transfer sheets of different colors of 4 or more kinds of at least yellow, magenta, cyan and black, each containing a support having thereon at least a photothermal converting layer and an image forming layer, wherein the image forming layer of each thermal transfer sheet and the image receiving layer of the image receiving sheet are superposed opposite to each other, and upon irradiation with laser beam, a laser beam irradiated region of the image forming layer is transferred onto the image receiving layer of the image receiving sheet to undergo multicolor image recording, characterized in that a ratio OD/T of an optical density (OD) to a layer thickness (unit: μm) of the image forming layer of each of the thermal transfer sheets of the image forming layer is 1.50 or more; that a recording area of multicolor image of each of the thermal transfer sheets is of a size of 515 mm or more×728 mm or more; that a resolution of the transferred image is 2,400 dpi or more; and that at least the magenta thermal transfer sheet has a breaking stress of from 150 to 300 MPa in both the machine direction (MD) and the crosswise direction (CD), with the breaking stress in the crosswise direction (CD) being at least 10 MPa larger than that in the machine direction (MD), and a breaking elongation of from 80 to 300% in both the machine direction (MD) and the crosswise direction (CD), with the breaking elongation in the machine direction (MD) being at least 5% larger than that in the crosswise direction (CD).

(22) The multicolor image forming material as set forth above in (21), characterized in that the image forming layer in the laser beam irradiated region is transferred in the state of a thin film onto the image receiving sheet.

(23) The multicolor image forming material as set forth above in (21) or (22), characterized in that the transferred image is an image having a resolution of 2,600 dpi or more.

(24) The multicolor image forming material as set forth above in any one of (21) to (23), characterized in that the ratio OD/T of an optical density (OD) to a film thickness (unit: μm) of the image forming layer of each of the thermal transfer sheets is 1.80 or more.

(25) The multicolor image forming material as set forth above in any one of (21) to (24), characterized in that the ratio OD/T of an optical density (OD) to a film thickness (unit: μm) of the image forming layer of each of the thermal transfer sheets is 2.50 or more.

(26) The multicolor image forming material as set forth above in any one of (21) to (25), characterized in that the image forming layer of each of the thermal transfer sheets and the image receiving layer of the image receiving sheet each has a contact angle against water in the range of from 7.0 to 120.0°.

(27) The multicolor image forming material as set forth above in any one of (21) to (26), characterized in that the recording area of the multicolor image of each of the thermal transfer sheets is of a size of 594 mm×841 mm or more.

(28) The multicolor image forming material as set forth above in any one of (21) to (27), characterized in that the ratio OD/T of an optical density (OD) to a film thickness (unit: μm) of the image forming layer of each of the thermal transfer sheets is 1.80 or more and that the contact angle of the image receiving layer of the image receiving sheet against water is not more than 86°.

(29) A multicolor image forming method including using a multicolor image forming material comprising an image receiving layer-containing image receiving sheet and thermal transfer sheets of different colors of 4 or more kinds, each containing a support having thereon at least a photothermal converting layer and an image forming layer, superposing the image forming layer of each thermal transfer sheet and the image receiving layer of the image receiving sheet opposite to each other, and irradiating laser beam to transfer a laser beam irradiated region of the image forming layer onto the image receiving layer of the image receiving sheet, thereby undergoing multicolor image recording, characterized in that the multicolor image forming material is the multicolor image forming material as set forth above in any one of (1) to (28).

(30) The multicolor image forming method as set forth above in (29), characterized in that the photothermal converting layer is softened upon irradiation with laser beam, whereby the image forming layer is pushed up on the photothermal converting layer and transferred in the state of a thin film onto the image receiving sheet.

BEST MODE FOR CARRYING OUT THE INVENTION

Figure 1A:
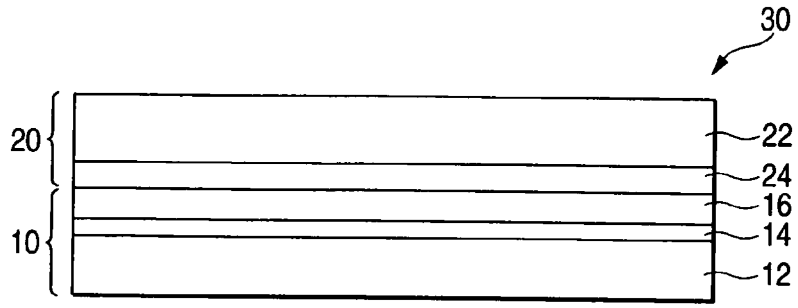
FIGS. 1*a*–1*c* are views to explain the outline of a mechanism of the multicolor image formation by thin-layer thermal transfer using laser.

For the sake of providing a large-size DDCP of B2/A2 or more and further B1/A1 or more having high grade and high stability and having excellent print conformity, we made extensive and intensive investigations. As a result, we have developed an image forming material of a B2 size or more, which is of an actual paper stock transfer, actual halftone dot output or pigment type, and a laser thermal transfer recording system for DDCP comprising an output machine and a high-grade CMS software.

Performance characteristics, system constitution and technical points of the thermal transfer recording system that we have developed are as follows. The performance characteristics reside in the matter that (1) since the dot shape is sharp, it is possible to reproduce halftone dots excellent in approximation property to a printed matter; the matter that (2) the hue has good approximation property to a printed matter; the matter that (3) the recording quality is hardly influenced by the ambient temperature-humidity, and repeat reproducibility is good, and hence, it is possible to prepare a stable proof; and the matter that (4) an image receiving sheet can stably and surely receive an image forming layer of a laser energy thermal transfer sheet and is good in transfer property onto wood-free paper (paper having rough surface roughness) and the like as an actual paper stock.

The technical points of the material in which such performance characteristics are obtained reside in the matters that a thin-layer transfer technology is established and that vacuum adhesion holding property and follow-up property to high resolution and heat resistance of a material, which are required for the laser thermal transfer system, are improved. Concretely, there are enumerated (1) to make a photothermal converting layer thin by introducing an infrared absorbing coloring matter, (2) to strengthen the heat resistance of the photothermal converting layer by introducing a high-Tg polymer, (3) to design to stabilize the hue by introducing a heat-resistant pigment, (4) to control the adhesive strength and cohesive strength by adding a low-molecular weight compound such as waxes and inorganic pigments, and (5) to impart vacuum adhesion without causing deterioration in image quality by adding a matting material to the photothermal converting layer. The technical points of the system include (1) conveyance of air for continuously accumulating a plural number of sheets in the recording device, (2) insertion on an actual paper stock for reducing curling after the transfer in the thermal transfer device, and (3) connection of a general-use output driver having system connection extension.

We made developments based on the thoughts that the individual materials, the respective coating layers such as the photothermal converting layer, the thermal transfer layer, and the image receiving layer, the respective thermal transfer sheets and image receiving sheets should not be present individually but should function organically and overall and that the image forming material should exhibit the maximum performance through a combination with the recording device and thermal transfer device. We investigated minutely the respective coating layer and constitutional materials of the image forming material, prepared coating layers from which the characteristic features of the constitutional materials are drawn to the maximum extent to fabricate an image forming material, and found adequate ranges of various physical characteristics such that this image forming material exhibits the maximum performance. As a result, we have been able to unthinkably find a high-performance image forming material by discovering the relationship among the respective constitutional materials, respective coating layers, respective sheets and physical characteristics and fuctionalizing the image forming material with the recording device and thermal transfer device.

In the system that we have developed, the positioning of the invention is to provide a multicolor image forming material suitable for such system. Especially, a first invention of the invention is an important invention for providing a multicolor image forming material in which the register accuracy is improved, and the generation of wrinkles at the time of actual paper stock transfer is suppressed. The register accuracy as referred to herein means the accuracy of deviations of the transfer positions of a plurality of colors.

In the multicolor image forming material that is the first invention of the invention, a rate of heat shrinkage in the machine direction (M) and a rate of heat shrinkage in the transverse direction (T) of the image receiving sheet are both not more than 1%, and the rate of heat shrinkage in the transverse direction (T) of the image receiving sheet is smaller than the rate of heat shrinkage in the machine direction (M) thereof. The rate of heat shrinkage in the machine direction (M) is preferably not more than 0.5%, and more preferably not more than 0.3%. Also, the rate of heat shrinkage in the transverse direction (T) is preferably not more than 0.5%, and more preferably not more than 0.3%. Also, the rate of heat shrinkage in the transverse direction (T) is preferably at least 0.1%, and more preferably at least 0.3% smaller than the rate of heat shrinkage in the machine direction (M).

When the rate of heat shrinkage in the machine direction (M) and the rate of heat shrinkage in the transverse direction (T) of the image receiving sheet meet the foregoing requirements, not only the register accuracy is improved, but also the generation of wrinkles at the time of actual paper stock transfer is suppressed. When at least one of the rate of heat shrinkage in the machine direction (M) and the rate of heat shrinkage in the transverse direction (T) of the image receiving sheet exceeds 1%, sufficient register accuracy is not obtained. Also, when the requirement that the rate of heat shrinkage in the transverse direction (T) be smaller than the rate of heat shrinkage in the machine direction (M) is not met, wrinkles are generated at the time of actual paper stock transfer. The foregoing requirements with respect to the rate of heat shrinkage in the machine direction (M) and the rate of heat shrinkage in the transverse direction (T) of the image receiving sheet can be met by choosing an adequate support.

Also, in the invention, a ratio of an optical density (OD) to a film thickness (μm) (OD/film thickness) of the image forming layer is 1.50 or more, preferably 1.8 or more, and more preferably 2.5 or more. When the ratio of the optical density (OD) to the film thickness is satisfied with the foregoing range, an image having a sufficient transfer density and a high resolving power is obtained, leading to preferred results. Also, the optical density (OD) of the image forming layer is preferably from 0.5 to 2.5, and more preferably from 0.8 to 2.0. The film thickness of the image forming layer is preferably from 0.1 to 1.0 μm, and more preferably from 0.3 to 0.7 μm. The optical density of the image forming layer means an absorbance of the image forming layer at the peak wavelength of laser beam to be used in recording the image forming material of the invention and can be measured using a known spectrophotometer. In the invention, a UV-spectrophotometer UV-240 manufactured by Shimadzu Corporation was used. Incidentally, the optical density (OD) of the image forming layer can be adjusted by choosing the pigment to be used or changing the particle size of the pigment to be dispersed.

Also, in the invention, a recording area of a multicolor image of the thermal transfer sheet is of a size of 515 mm×728 mm or more, and preferably 594 mm×841 mm or more, and DDCP having a size larger than this is obtained. The recording area of the multicolor image of the thermal transfer sheet is an area of the image forming layer. Further, a resolution of the image to be transferred onto the image receiving layer of the image receiving sheet from the image forming layer of the thermal transfer sheet is 2,400 dpi or more, and preferably 2,500 dpi or more.

Next, a second invention of the invention is to provide a multicolor image forming material suitable for the subject system that we have developed as described previously. Especially, this second invention is positioned as an important invention for providing a multicolor image forming material in which the accumulation property between a thermal transfer sheet and an image receiving sheet after image recording by transfer onto an image receiving layer of the image receiving sheet from the thermal transfer sheet is good.

In the multicolor image forming material of the second invention of the invention, the thermal transfer sheet and the image receiving sheet are controlled in such a manner that after laser thermal transfer, a coefficient of dynamic friction between the thermal transfer sheet surface and the image receiving sheet surface is not more than 0.70.

In measuring the coefficient of dynamic friction, the thermal transfer sheet surface after laser thermal transfer as referred to herein means the surface in the state that after transferring a solid image of the image forming layer by laser thermal transfer, the photothermal converting layer is exposed, and the image receiving sheet surface as referred to herein means the image receiving sheet surface of the side where after transferring the image forming layers of at least four colors onto the image receiving layer from the thermal transfer sheets, desired multicolor images are present. The solid image as referred to herein means that the transfer rate of the image forming layer is 100%.

In the invention, the coefficient of dynamic friction is a value measured according to JIS K7125 by superposing the subject surfaces of the foregoing thermal transfer sheet and image receiving sheet on each other and is not more than 0.70, and preferably from 0.30 to 0.60. In the invention, it is necessary to adjust the coefficient of dynamic friction at the foregoing value in all of combinations of the thermal transfer sheet of a different color and the image receiving sheet.

In the invention, according to this way, in the case of accumulating the image receiving sheet after transfer and the thermal transfer sheet in the same tray, the accumulation property becomes good.

In the invention, the measure for controlling the coefficient of dynamic friction within the foregoing range includes control of the respective formulations of the photothermal converting layer, the image forming layer and the image receiving layer. Such control is adjusted with various technologies described later such that the multicolor image forming material of the invention functions effectively.

The multicolor image forming material of the invention is used in a multicolor image forming method including the steps of using the foregoing image receiving sheet and the foregoing thermal transfer sheets of at least four colors, superposing the image forming layer of each thermal transfer sheet and the image receiving layer of the foregoing image receiving sheet opposite to each other, irradiating laser beam from the support side of the subject thermal transfer sheet, and transferring a laser beam irradiated region of the image receiving layer onto the image receiving layer of the image receiving sheet to undergo image recording, the thermal transfer sheet that has completed laser thermal transfer is separated from the image receiving sheet and discarded, and after completion of the transfer of the final thermal transfer sheet, an image receiving sheet having a multicolor image carried thereon is obtained. In such a multicolor image forming method, a laser exposure recording device in which trays are disposed such that the thermal transfer sheet to be discarded is accumulated in such a manner that the image forming layer side is laminated upwardly and that the image receiving sheet is accumulated together with the thermal transfer sheet in such a manner that its multicolor image forming side is faced downwardly is suitable. By accumulating the thermal transfer sheet and the image receiving sheet in this way, there is an effect for enabling simplification of a separation mechanism and a traveling mechanism of the multicolor image forming material.

Further next, a third invention of the invention is to provide a multicolor image forming material suitable for the subject system that we have developed as described previously. Especially, this third invention is positioned as an important invention for providing a multicolor image forming material having excellent traveling property.

The multicolor image forming material of the third invention of the invention is characterized in that a ratio OD/T of an optical density (OD) of the image forming layer of the thermal transfer sheet to a layer thickness (unit: μm) of the image forming layer is 1.50 or more; that a recording area of a multicolor image of each of the thermal transfer sheets is of a size of 515 mm or more×728 mm or more; that a resolution of the transferred image is 2,400 dpi or more; that a stiffness in the machine direction (Msh) and a stiffness in the transverse direction (Tsh) of the foregoing thermal transfer sheet are both from 30 to 70 g; that a stiffness in the machine direction (Msr) and a stiffness in the transverse direction (Tsr) of the foregoing image receiving sheet are both from 40 to 90 g; that Msh/Tsh and Msr/Tsr are each from 0.75 to 1.20; and that $10\ g \leqq (Msr-Msh) \leqq 40\ g$ and $10\ g \leqq (Tsr-Tsh) \leqq 40\ g$, and especially, is characterized by specifying the stiffness of each of the thermal transfer sheet and the image receiving sheet.

In the invention, the four kinds of stiffness, i.e., Msh, Tsh, Msr and Tsr, are measured by a loop stiffness tester manufactured by Toyo Seiki Seisaku-sho, Ltd. The stiffness (Msh and Tsh) of the thermal transfer sheet was measured in a sample width of 3 cm, and the stiffness (Msr and Tsr) of the image receiving sheet was measured in a sample width of 2 cm. The length was a length sufficient for applying to the analyzer. Also, the measurement was carried out in such a manner that the film surface was faced upwardly. Also, the machine direction as referred to herein means the longitudinal direction of a roll, and the transverse direction as referred to herein means the width direction of the roll.

Msh and Tsh are each defined to be from 30 to 70 g, and preferably from 35 to 50. Msr and Tsr are each defined to be 40 to 90 g, and preferably from 60 to 80. Msh/Tsh and Msr/Tsh are each defined to be from 0.75 to 1.20, and preferably from 0.90 to 1.10. A difference in stiffness between the thermal transfer sheet and the image receiving sheet is defined to be $10\ g \leqq (Msr-Msh) \leqq 40\ g$ and $10\ g \leqq (Tsr-Tsh) \leqq 40\ g$, and preferably $20\ g \leqq (Msr-Msh) \leqq 40\ g$ and $20\ g \leqq (Tsr-Tsh) \leqq 40\ g$, respectively.

By forming the multicolor image forming material by adjusting Msh and Tsh of the thermal transfer sheet and Msr and Tsr of the image receiving sheet so as to have the foregoing relationships, a smooth traveling property in the recording device described later can be ensured.

As the measure for controlling Msh and Tsh of the thermal transfer sheet and Msr and Tsr of the image receiving sheet, the following measures can be enumerated, but the invention is never limited thereto.

(1) To choose the material of the support to be used for the thermal transfer sheet and the image receiving sheet.

(2) To control the kinds and amounts of constitutional binders, powders, additives, and so on of various layers to be formed on the support such as a photothermal converting layer, an image forming layer, and an image receiving layer.

The details of the foregoing measures will be described later in the organic unification with other technical problems.

Also, in the invention, the ratio OD/T of an optical density (OD) of the image forming layer of the thermal transfer sheet to a layer thickness (unit: μm) of the image forming layer is 1.50 or more, preferably 1.80 or more, and further preferably 2.50 or more. The upper limit of OD/T is not particularly defined, and a larger value is preferable. However, at the point of present time, taking into consideration a balance with other characteristics, the upper limit is about 6.

OD/T is an index for the transfer density of the image forming layer and the resolution of the transferred image. By making OD/T fall within the foregoing range, it is possible to obtain an image having a high transfer density and a good resolution. Also, by making the image forming layer thinner, it is possible to enhance the color reproducibility.

In the invention, as the thermal transfer sheet of the image forming material, thermal transfer sheets for at least found kinds of colors are used. It is preferable that the thermal transfer sheets are made of four or more kinds of thermal transfer sheets having at least yellow, magenta, cyan and black image forming layers, respectively.

OD means a reflection optical density obtained by further subjecting an image having been transferred onto the image receiving sheet from the thermal transfer sheet to actual paper stock transfer onto tokubishi art paper and measuring the transferred image at the color mode of each of yellow (Y), magenta (M), cyan (C) and black (K) colors by a densitometer (X-rite 938, manufactured by X-rite).

OD is preferably from 0.5 to 3.0, and more preferably from 0.8 to 2.0.

In the invention, it is possible to record an image at a resolution of the transferred image of 2,400 dpi or more, and preferably 2,600 dpi or more and a size of the recording area of the thermal transfer sheet of 515 mm or more×728 mm or more, and preferably 594 or more×841 mm or more. The image receiving sheet is of a size of 465 mm or more×686 mm or more, and preferably 544 mm or more×800 mm or more.

In the invention, for the sake of obtaining the foregoing size and resolution, it is preferred to control the ratio OD/T of an optical density (OD) of the photothermal converting layer of the thermal transfer sheet to a layer thickness (unit: μm) of the photothermal converting layer at 4.36 or more. The upper limit of OD/T is not particularly defined, and a larger value is preferable. However, at the point of present time, taking into consideration a balance with other characteristics, the upper limit is about 10.

OD of the thermal transfer layer means an absorbance of the photothermal converting layer at the peak wavelength of laser beam to be used in recording the image forming material of the invention and can be measured using a known spectrophotometer. In the invention, a UV-spectrophotometer UV-240 manufactured by Shimadzu Corporation was used. Also, the foregoing OD is defined as a value resulting from subtraction of a value of the only support from a value of the support-containing sheet.

OD/T is related to heat conductivity at the time of recording and is an index of largely influencing the sensitivity and the temperature-humidity dependency of recording. By making OD/T fall within the foregoing range, it is possible to not only enhance the transfer sensitivity to the image receiving sheet at the time of recording but also make the temperature-humidity dependency at the time of recording small.

Also, the layer thickness of the photothermal converting layer is preferably from 0.03 to 1.0 μm, and more preferably from 0.05 to 0.5 μm.

Further, it is preferable that the image forming layer of each of the thermal transfer sheets and the image receiving layer of the foregoing image receiving sheet each has a contact angle against water in the range of from 7.0 to 120.0°. The contact angle is an index relating to affinity between the image forming layer and the image receiving layer, namely transfer property, and is preferably from 30.0 to 100.0°. Also, the contact angle of the image receiving layer against water is further preferably not more than 86°. By making the contact angle fall within the foregoing range, it is possible to enhance the transfer sensitivity. Also, such is preferable in view of the matter that the temperature-humidity dependency of the recording characteristic can be made small.

Also, the contact angle of the surface of each layer of the invention against water is a value measured using a contact angle meter CA-A Model (manufactured by Kyowa Interface Science Co., Ltd.).

As described previously, by defining the stiffness of the thermal transfer sheet and the image receiving sheet, the invention is characterized by providing a multicolor image forming material having excellent traveling property even when the recording image is formed of a large picture.

Moreover next, a fourth invention of the invention is to provide a multicolor image forming material suitable for the subject system that we have developed as described previously. Especially, this fourth invention is positioned as an important invention for providing a multicolor image forming material provided with a thermal transfer sheet having excellent cutting performance, resulting in no reduction in the image quality caused by scuffing in the cut surface or foreign matters such as contaminants generated during cutting.

The multicolor image forming material of the fourth invention of the invention is characterized in that at least the magenta thermal transfer sheet has a breaking stress of from 150 to 300 MPa in both the machine direction (MD) and the crosswise direction (CD), with the breaking stress in the crosswise direction (CD) being at least 10 MPa larger than that in the machine direction (MD), and a breaking elongation of from 80 to 300% in both the machine direction (MD) and the crosswise direction (CD), with the breaking elongation in the machine direction (MD) being at least 5% larger than that in the crosswise direction (CD).

As described later, the thermal transfer sheet of the invention is fed in the roll state into a recording device and cut into a prescribed length within the device. With respect to the magenta thermal transfer sheet, in view of the cutting performance of the sheet, when the breaking stress and the breaking elongation fall within the foregoing ranges, it is possible to cut the sheet smoothly without generating scuffing and the like on the cut surface, and it is possible to prevent a deterioration of the image quality caused by attachment of scuffs, contaminants, dusts, and the like generated due to the matter that cutting does not go smoothly, onto the image forming material.

The machine direction (MD) of the thermal transfer sheet as referred to herein means the same direction as the traveling direction of the sheet within the device and is vertical to the cutting direction of the sheet. The crosswise direction (CD) as referred to herein means the direction parallel to the cutting direction of the sheet.

Also, the breaking stress as referred to herein means a force required for breakage of the sheet. What the breaking stress in the machine direction is small means that when the sheet is drawn in the machine direction, the sheet is liable to be broken.

The breaking elongation as referred to herein means an amount in which the sheet elongates until breakage, and taking into account the cutting adaptability, it is preferable that the breaking elongation is small.

Further, from the viewpoint of the cutting performance, with respect to the magenta thermal transfer sheet, it is preferable that the breaking stress is from 150 to 250 MPa in the machine direction (MD) and from 200 to 300 MPa in the crosswise direction (CD), respectively, with the breaking stress in the crosswise direction (CD) being at least 10 MPa larger than that in the machine direction (MD), and that the breaking elongation is from 150 to 300% in the machine direction (MD) and from 80 to 200% in the crosswise direction (CD), respectively, with the breaking elongation in the crosswise direction (CD) being at least 5% larger than that in the machine direction (MD).

Also, with respect to thermal transfer sheets of other colors including yellow, cyan and black than magenta, it is preferable that the breaking stress and the breaking elongation fall within the foregoing ranges, and most preferably, the breaking stress and the breaking elongation with respect to all of the sheets fall within the foregoing ranges.

The breaking stress and the breaking elongation of the thermal transfer sheet are substantially determined by the support, but the adjustment thereof can be performed by controlling the material of the support, stretching method, additives, and the like.

In the multicolor image forming material of the invention, a ratio OD/T of an optical density (OD) to a layer thickness (unit; μm) of the image forming layer of each thermal transfer sheet is 1.50 or more. The optical density OD as referred to herein a reflection optical density obtained by further subjecting an image that has been transferred onto the image sheet from the thermal transfer sheet to actual paper stock transfer onto tokubishi art paper and measuring the transferred image at the color mode of each of yellow (Y), magenta (M), cyan (C) and black (K) colors by a densitometer (X-rite 938, manufactured by X-rite). The layer thickness of the image forming layer can be measured by observing the cross section of the thermal transfer sheet before image recording using a scanning electron microscope.

By defining the OD/(layer thickness) to be 1.50 or more, not only an image density required as a print proof is easily obtained, but also it is possible to make the image forming layer thin. Also, transfer onto the image receiving layer can be performed with good efficiency, the breaking property of the image forming layer is stable, the dot shape can be made sharp, and the follow-up property to high-resolution recording and excellent halftone dot reproduction corresponding to the image information can be realized. Also, since the image forming layer can be made thinner, the influence of the ambient temperature-humidity can be minimized as far as possible, the repeat reproducibility of the image is good, stable transfer separation property is obtained, and a proof having higher approximation property to a printed matter can be prepared. Further, when the OD/(layer thickness) is 1.80 or more, the effects can be further promoted, and further, when the OD/(layer thickness) is 2.50 or more, the transfer density and resolving power can be largely increased.

When the OD/(layer thickness) is less than 1.50, a sufficient image density is not obtained, or the breaking property of the image forming layer is bad, and the resolution lowers. In both of the cases, a good image is not obtained.

In the multicolor image forming material of the invention, it is preferable that not only the OD/(layer thickness) is 1.50 or more as described previously, but also the image forming layer of each thermal transfer sheet and the image receiving layer of the image receiving sheet each has a contact angle against water in the range of from 7.0 to 120.0°. By making the contact angle against water fall within the foregoing range, a sufficient adhesive strength is obtained at the time of image formation, the dot shape can be made sharp, and excellent halftone dot reproduction corresponding to the image information can be realized. Also, even by transfer onto the printing actual paper stock, it is possible to prepare a proof free from defects without causing transfer failure. Further, in view of the foregoing point, it is more preferable that the contact angle against water of each of the image forming layer and the image receiving layer is in the range of from 30 to 100.0°, and it is further preferable that the contact angle of the image receiving layer against water is not more than 86°.

In the invention, the contact angle of the surface of each of the foregoing layers against water is a value measured using a contact angle meter CA-A Model (manufactured by Kyowa Interface Science Co., Ltd.).

Also, the invention is to provide a multicolor image forming method using the multicolor image forming material of each of the foregoing first to fourth inventions. Specifically, the multicolor image forming method of the invention is a multicolor image forming method including using a multicolor image forming material comprising an image receiving layer-containing image receiving sheet and thermal transfer sheets of different colors of 4 or more kinds, each containing a support having thereon at least a photothermal converting layer and an image forming layer, superposing the image forming layer of each thermal transfer sheet and the image receiving layer of the image receiving sheet opposite to each other, and irradiating laser beam to transfer a laser beam irradiated region of the image forming layer onto the image receiving layer of the image receiving sheet, thereby undergoing multicolor image recording, characterized in that the multicolor image forming material is the multicolor image forming material as set forth above in any one of the multicolor image forming materials of the foregoing first to fourth inventions.

Next, the whole of the system that we have developed, including the contents of the invention, will be described below. In the system of the invention, by inventing and employing a thin-layer thermal transfer system, high resolution and high image quality were achieved. The system of the invention is a system capable of obtaining a transferred image having a resolution of 2,400 dpi or more, and preferably 2,600 dpi or more. The thin-layer thermal transfer system is a system in which a thin-layer image forming layer having a layer thickness of from 0.01 to 0.9 μm is transferred onto an image receiving sheet in the state that it is not partially melted or not substantially melted. That is, since the recorded portion is transferred as a thin film, a thermal transfer system with an extremely high resolution has been developed. As a preferred method of efficiently performing the thin-layer thermal transfer, the inside of the photothermal converting layer is deformed into the dome shape by optical recording, to push up the image forming layer, thereby enhancing an adhesive strength between the image forming layer and the image receiving layer and making the transfer easy. When the deformation is large, since the force to press the image forming layer onto the image receiving layer, the transfer becomes easy, whereas when the deformation is small, since the force to press the image forming layer onto the image receiving layer is small, a portion where the transfer is not sufficiently performed is revealed. Then, the deformation preferable for the thin-layer transfer is observed by a laser microscope (VK850, manufactured by Keyence Corporation), and the size of the deformation can be evaluated by a deformation rate calculated by dividing a value obtained by adding a cross-sectional area (a) of the recording area of the photothermal converting layer after optical recording to a cross-sectional area (b) of the recording area of the photothermal converting layer before optical recording and the cross-sectional area (b) of the recording area of the photothermal converting layer before optical recording and multiplying the resulting value by 100. That is, (deformation rate)={(a+b)/(b)}×100. The deformation rate is 110% or more, preferably 125% or more, and further preferably 150% or more. When the breaking elongation is large, the deformation rate may exceed 250%, but in general, it is preferable to control the deformation rate to not more than about 250%.

The technical points of the image forming material in the thin-layer transfer are as follows.

1. Coexistence of high heat responsibility and preservability:

In order to achieve high image quality, transfer of a thin film of sub-micron order is necessary. However, in order to reveal a desired density, it is necessary to prepare a layer in which a pigment is dispersed in a high concentration, an aspect of which is reciprocal to the heat responsibility. Also, the heat responsibility is in the reciprocal relation with preservability (adhesion). These reciprocal relations have been solved by the development of novel polymer and additives.

2. Insurance of high vacuum adhesion:

In thin-layer transfer pursuing a high resolution, it is preferable that the transfer interface is smooth, but in such case, sufficient vacuum adhesion is not obtained. Free from the conventional common knowledge in imparting vacuum adhesion, by adding a some larger amount of a matting agent having a relatively small particle size to a layer beneath the image forming layer, vacuum adhesion was imparted while uniformly keeping an adequate gap between the thermal transfer sheet and the image receiving sheet and ensuring the characteristic features of the thin-layer transfer without causing deletion in the image by the matting agent.

3. Use of heat-resistant organic material:

At the time of laser recording, the photothermal converting layer of converting laser beam into heat reaches about 700° C., and the image forming material containing a pigment coloring material reaches about 500° C. Not only modified polyimides that can be coated in an organic solvent were developed as the material of the photothermal converting layer, but also pigments that are high in heat resistance as compared with pigments for printing, are safety and are coincident in hue were developed as the pigment coloring material.

4. Insurance of surface cleanness:

In the thin-layer transfer, contaminants between the thermal transfer sheet and the image receiving sheet become an image defect, the issue of which is of an important problem. The contaminants enter from the outside of an instrument or are generated during cutting of the material, and the removal of the contaminants is insufficient only by the material management. Thus, it was necessary to equip the instrument with a mechanism for removing contaminants. By finding materials capable of keeping proper adhesion such that the transfer material surface can be cleaned and changing the quality of traveling rolls, it was realized to removal contaminants without reducing the productivity.

The system of the invention will be described below in detail.

In the invention, it is preferable that a thermally transferred image is realized by sharp halftone dots and that actual paper stock transfer and recording of a B2 size or more (515 mm×728 mm or more) can be performed. More preferably, the B2 size is 543 mm×765 mm or more, and the system can perform recording in a size of this size or more.

One of the characteristic features of the system developed by the invention resides in the matter that a sharp dot shape is obtained. The thermally transferred image obtained in this system can be converted into a halftone dot image corresponding to the printing line number with a resolution of 2,400 dpi or more. Since the individual halftone dots are substantially free from blurs or defects and have a very sharp shape, it is possible to form clear halftone dots over a wide range of from highlight to shadow. As a result, it is possible to output high-grade halftone dots with a resolution the same as in image setters or CTP setters and to reproduce halftone dots with good approximation property to a printed matter and gradations.

Also, a second characteristic feature of the performance of the system developed by the invention resides in the matter that repeat reproducibility is good. In the thermally transferred image, since the halftone dot shape is sharp, it is possible to faithfully reproduce halftone dots corresponding to laser beam. Also, since the ambient temperature-humidity dependency of the recording characteristic is very small, it is possible to obtain repeat reproducibility with stable hue and density over a wide range of the temperature-humidity ambient.

Further, a third characteristic feature of the performance of the system developed by the invention resides in the matter that color reproduction is good. The thermally transferred image obtained by this system is formed using colored pigments used in printing inks, and repeat reproducibility is good, and therefore, high-definition CMS (color management system) can be realized.

Also, this thermally transferred image can be made substantially coincident with a hue such as Japan color and SWOP color, namely, a hue of the printed matter, and with respect to the sight of color when a light source such as fluorescent lamps and incandescent lamps is changed, it can exhibit the same change as in the printed matter.

Also, a fourth characteristic feature of the performance of the system developed by the invention resides in the matter that the letter quality is good. In the thermally transferred image obtained by this system, since the dot shape is sharp, it is possible to reproduce thin lines of fine letters with good sharpness.

Next, the characteristic features of the material technology of the system of the invention will be described in more detail. Examples of the DDCP thermal transfer system include (1) a sublimation system, (2) an abrasion system, and (3) a heat fusion system. In the systems (1) and (2), since the coloring material is of a sublimation or scattering system, outlines of halftone dots get blurred. On the other hand, in the system (3), since the fused material flows, clear outlines are not revealed. For the sake of solving new problems in the laser thermal transfer system to obtain a higher image quality, we have incorporated the following technologies based on the thin-layer transfer technology.

A first characteristic feature of the material technology is to make the halftone dot shape sharp. Laser beam is converted into heat in the photothermal converting layer, the heat is transmitted into the adjacent image forming layer, and the image forming layer is bonded to the image receiving layer, thereby undergoing image recording. In order to make the dot shape sharp, the heat generated from laser beam is not diffused in the plane direction but transmitted to the transfer interface, whereby the image forming layer is broken sharply at the interface between the heated area and the non-heated area. In this way, thinning of the photothermal converting layer and the dynamic characteristic of the image forming layer are controlled.

The technology 1 for making the dot shape sharp is to make the photothermal converting layer thin. According to simulation, it is estimated that the photothermal converting layer instantaneously reaches about 700° C., and when the film is thin, deformation or breakage is liable to occur. When deformation or breakage occurs, there are caused actual damages such that the photothermal converting layer is transferred onto the image receiving sheet together with the image forming layer and that the transferred image becomes non-uniform. On the other hand, in order to obtain a prescribed temperature, a photothermal converting substance must be made present in a high concentration in the film, resulting in a problem such as deposition or transition into the adjacent layer of the coloring matter. As the photothermal converting substance, carbon has hitherto been often used, but in the present material, an infrared absorbing coloring matter that may be used in a smaller amount than that of carbon was used. As a binder, a polyimide based compound having a sufficient dynamic strength even at high temperatures and having good holding property of an infrared absorbing coloring matter was introduced.

In this way, it is preferred to make the photothermal converting layer thin to a degree of not more than about 0.5 μm by choosing an infrared absorbing coloring matter having excellent photothermal converting characteristic and a heat-resistant binder such as polyimide based compounds.

Also, the technology 2 for making the dot shape sharp is to improve the characteristic of the image forming layer. When deformation of the photothermal converting layer occurs, or the image forming layer itself is deformed by high heat, the image forming layer transferred onto the image receiving layer causes thickness unevenness corresponding to the sub-scanning pattern of laser beam, whereby the image becomes non-uniform, leading to a reduction of the apparent transfer density. This trend becomes remarkable as the thickness of the image forming layer is thin. On the other hand, when the thickness of the image forming layer is thick, the sharpness of dots is injured, and the sensitivity lowers.

In order to make these reciprocal performances coexistent, it is preferred to improve the transfer unevenness by adding a low-melting substance such as waxes to the image forming layer. Also, by adding inorganic fine particles in place of the binder to adequately increase the layer thickness such that the image forming layer is sharply broken at the interface between the heated area and the non-heated area, it is possible to improve the transfer unevenness while keeping the sharpness and sensitivity of dots.

Also, in general, a low-melting substance such as waxes tends to bleed out on the surface of the image forming layer or cause crystallization, and therefore, there may be caused a problem in image quality or elapsing stability of the thermal transfer sheet.

In order to cope with this problem, it is preferred to use a low-melting substance having a small Sp value difference between the image forming layer and the polymer and increase compatibility with the polymer, whereby separation of the low-melting substance from the image forming layer can be prevented. Also, it is preferred to mix several kinds of low-melting substances having a different structure to form an eutectic crystal, thereby preventing crystallization. As a result, an image having a sharp dot shape and less unevenness is obtained.

Also, a second characteristic feature of the material technology is to find that the recording sensitivity depends upon the temperature-humidity. In general, when the coating layer of the thermal transfer sheet is made hygroscopic, the dynamic physical properties and thermophysical properties change, whereby the humidity dependency of the recording ambient is generated.

In order to make this temperature-humidity dependency small, it is preferable that the coloring matter/binder system of the photothermal converting layer and the binder system of the image forming layer are an organic solvent system. Also, it is preferred to choose polyvinyl butyral as a binder of the image receiving layer and to introduce a technology for making polymers hydrophobic for the purpose of making the water absorption small Examples of the technology for making polymers hydrophobic include reaction of a hydroxyl group with a hydrophobic group as described in JP-A-8-238858 and crosslinking of two or more hydroxyl groups with a film hardener.

A third characteristic feature of the material technology is to improve the approximation property to a printed matter of hue. In addition to color matching of a pigment and stable dispersion technology in a color proof of a thermal head system (for example, First Proof, manufactured by Fuji Photo Film Co., Ltd.), the following problem as newly generated in the laser thermal transfer system was solved. That is, a technology 1 for improving the approximation property to a printed matter of hue is to use a pigment having high heat resistance. In general, at the time of printing by laser exposure, heat of about 500° C. is applied to the image forming layer, and conventionally employed pigments caused thermal decomposition. However, by employing a pigment having high heat resistance in the image forming layer, this can be prevented.

Further, a technology 2 for improving the approximation property to a printed matter of hue is to prevent diffusion of an infrared absorbing coloring matter. When an infrared absorbing coloring matter is transmitted from the photothermal converting layer to the image forming layer due to high temperature at the time of printing, the change of the hue is prevented. Accordingly, it is preferred to design the photothermal converting layer with an infrared absorbing coloring matter/binder combination having a strong holding property as described previously.

A fourth characteristic feature of the material technology is to make the sensitivity high. In general, at high-speed printing, the energy becomes insufficient, and especially, a space corresponding to a gap of the laser sub-scanning is generated. As described previously, by increasing the coloring matter density of the photothermal converting layer and making the photothermal converting layer and image forming layer thin, it is possible to increase an efficiency of generation and conduction of heat. Further, for the purposes of enhancing an effect such that the image forming layer slightly flows at the time of heating to fill the spacing and increasing adhesion to the image receiving layer, it is preferred to add a low-melting substance to the image forming layer. Also, for the sake of increasing adhesion between the image receiving layer and the image forming layer to sufficiently keep the strength of the transferred image, for example, it is preferred to employ polyvinyl butyral the same as in the image forming layer as the binder of the image receiving layer.

A fifth characteristic feature of the material technology is to improve vacuum adhesion. It is preferable that the image receiving sheet and the thermal transfer sheet are held on a drum by vacuum adhesion. This vacuum adhesion is important because an image is formed by controlling the adhesive strength between the both sheets, and the image transfer behavior is very sensitivity to a clearance between the image receiving layer surface of the image receiving sheet and the image forming layer surface of the transfer sheet. When the clearance between the materials is widened with foreign matters such as contaminants as a start, image defects or image transfer unevenness is generated.

In order to prevent such image defects or image transfer unevenness, it is preferred to provide the thermal transfer sheet with uniform irregularities, thereby making air pass therethrough smoothly and obtaining a uniform clearance.

A technology 1 for improving the vacuum adhesion is to provide the thermal transfer sheet with surface irregularities. In order to sufficiently reveal the vacuum adhesion effect even for superposed prints of two or more colors, the thermal transfer sheet was provided with irregularities. As a method of providing the thermal transfer sheet with irregularities, in general, post treatment such as embossing and addition of a matting agent to the coating layer are enumerated. Among them, the addition of a matting agent is preferable for the purposes of simplifying the manufacture step and stabilizing the materials with time. The matting agent is required to have a size larger than the thickness of the coating layer. When the matting agent is added to the image forming layer, there is generated such a problem that an image in an area where the matting agent is present fails. Accordingly, it is preferred to add the matting agent having an optimum particle size to the photothermal converting layer. In this way, the image forming layer itself becomes substantially uniform, whereby an image free from breakage can be obtained on the image receiving sheet.

Next, the characteristic features of the systematization technology of the system of the invention will be described. A characteristic feature 1 of the systematization technology resides in a construction of the recording device. As described previously, in order to surely reproduce sharp dots, a design with high definition is also required in the recording device side. A basic construction is the same as in conventional thermal transfer recording devices. This construction is a so-called outer drum recording system in which a plurality of recording heads provided with high-power laser irradiate laser to the thermal transfer sheet and the image receiving sheet fixed on the drum to undergo recording. Of these, the following embodiments are preferred constructions.

A construction 1 of the recording device is to avoid incorporation of contaminations. Feeding of the image receiving sheet and the thermal transfer sheet relies on fully automatic roll feeding. According to sheet feeding of a small number of sheets, since incorporation of contaminants generated from human bodies likely occurs, roll feeding was employed.

With respect to the thermal transfer sheet, one roll is provided for every color of the four colors, and when a loading unit is rotated, the roll of each color is switched. Each film is cut into a prescribed length by a cutter during loading and then fixed onto the drum. A construction 2 of the recording device is to strengthen adhesion between the image receiving sheet and the thermal transfer sheet on the recording drum. Fixing of the image receiving sheet and the thermal transfer sheet onto the recording drum is performed by means of vacuum adsorption. Since it is impossible to strength an adhesive strength between the image receiving sheet and the thermal transfer sheet by means of mechanical fixing, vacuum adsorption was employed. A number of vacuum adsorption holes are formed on the recording drum, and the inside of the drum is evacuated using a blower or vacuum pump, whereby the sheets are adsorbed onto the drum. Since the thermal transfer sheet is further adsorbed above the adsorbed image receiving sheet, the size of the thermal transfer sheet is made larger than that of the image receiving sheet. Air between the thermal transfer sheet and the image receiving sheet, which most largely influences the recording performance, is sucked from an area of only the thermal transfer sheet outside the image receiving sheet.

A construction 3 of the recording device is to stably accumulate a plural number of sheets on a discharge table. In the present device, a plural number of sheets having a large area of a B2 size or more can be superposed and accumulated on the discharge table. When a next sheet B is discharged on the image receiving layer of an already accumulated film A having thermal adhesion, the both may possibly be stuck to each other. The occurrence of sticking is problematic because the next sheet is not discharged neatly, thereby generating jamming. In order to prevent sticking from occurrence, it is the best way to prevent the films A and B from contact with each other. As a countermeasure for preventing contact, there are known some methods. Examples thereof include (a) a method of forming a space between the films by providing the discharge table with a difference in level to make the film shape non-flat; (b) a method of employing a structure in which a discharge port is provided at a position higher than the discharge table, and a discharge film is dropped downwardly; and (a) a method of injecting air between the both films to float up a film to be discharged later. In this system, the sheet size is very large as B2. According to the methods (a) and (b), the structure becomes very large, and therefore, the air injection method (c) was employed. In this way, there is employed the method of injecting air between the both sheets to float up a sheet to be discharged later.

Figure 2:
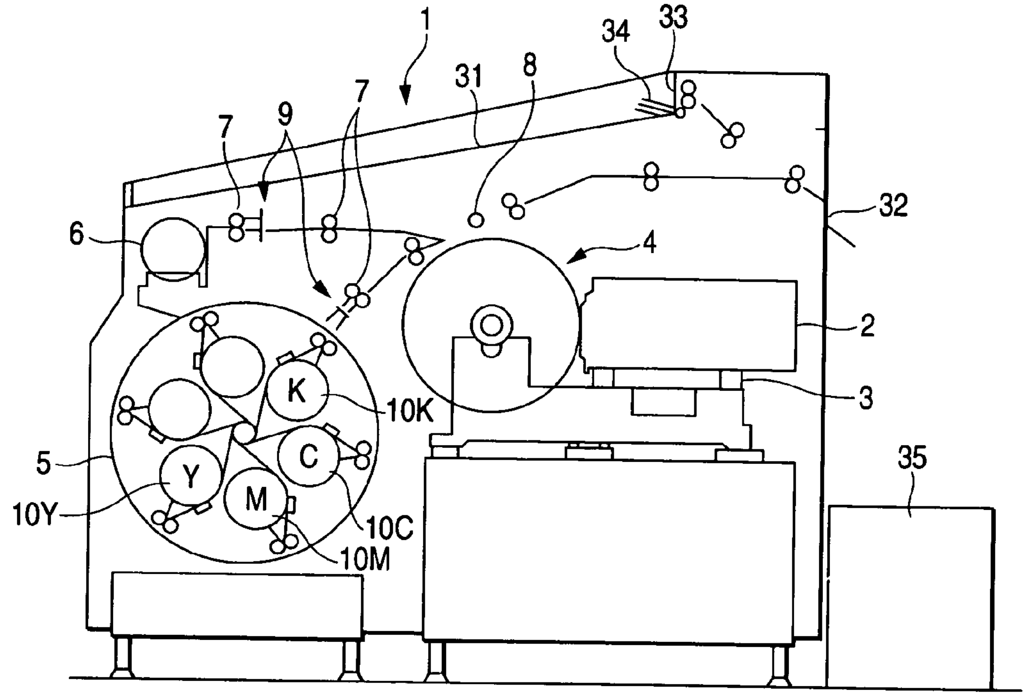
FIG. 2 is a view to show a constitutional example of a laser thermal transfer recording device.

An example of the construction of the present device is shown in FIG. 2.

A sequence of forming a full-color image by applying an image forming material to the present device as described previously (hereinafter referred to as "image forming sequence of the present system") will be described below.

1) A sub-scanning axis of a recording head 2 of a recording device 1 returns to origin through a sub-scanning rail 3, and a main scanning rotary axis of a recording drum 4 and a thermal transfer sheet loading unit 5 each return to origin.
2) An image receiving sheet roll 6 is untied by a traveling roll 7, and the front end of an image receiving sheet is vacuum sucked on and fixed to the recording drum 4 via suction holes provided on the recording drum.
3) A squeeze roll 8 comes down on the recording drum 4 and meets the image receiving sheet, and when a prescribed amount of the image receiving sheet is traveled by rotation of the drum, it is cut in a prescribed length by a stop cutter 9.
4) Further, the recording drum 4 makes a round, whereby loading of the image receiving sheet is finished.
5) Next, a first color (black) thermal transfer sheet K is sent out from a thermal transfer sheet roll 10K, cut, and then loaded according to the same sequence as in the image receiving sheet.
6) Next, the recording drum 4 starts high-speed rotation, the recording head 2 on the sub-scanning rail 3 starts to move, and when it reaches the start position of recording, recording laser is irradiated on the recording drum 4 by the recording head 2 according to a recording image signal. The irradiation is finished at the finish position of recording, whereby the sub-scanning rail movement and the drum rotation are stopped. The recording head on the sub-scanning rail is returned to origin.
7) Only the thermal transfer sheet K is peeled apart while retaining the image receiving sheet on the recording drum. In this way, the front end of the thermal transfer sheet K is hooked by a pawl and drawn out in the discharge direction, and then discarded from a discard port 32 into a discard box 35.
8) The operations 5) to 7) are repeated with respect to the remaining three colors. The recording order is an order of cyan, magenta and yellow sequent to black. That is, a second color (cyan) thermal transfer sheet C, a third color (magenta) thermal transfer sheet M, and a fourth color (yellow) thermal transfer sheet Y are sent out from a thermal transfer sheet roll 10C, a thermal transfer sheet roll 10M, and a thermal transfer sheet roll 10Y, respectively in that order. This is because though this order is reverse to the general printing order, the color order on the actual paper stock will be reversed by actual paper stock transfer of the subsequent step.
9) After completion of the four colors, the recorded image recording sheet is finally discharged to a discharge table 31. A method of peeling apart from the drum is the same as in the thermal transfer sheet of 7). However, since the image recording sheet is not discarded different from the case of the thermal transfer sheet, when it advances to the discharge port 32, it is returned to the discharge table by means of switch back. In discharging into the discharge table, air 34 is injected from the lower portion of a discharge port 33, thereby making it possible to accumulate a plural number of sheets.

Incidentally, an accumulation mechanism shown in FIGS. 5 to 7 as described later may be employed as the foregoing discard and accumulation mechanism of the thermal transfer sheet and image receiving sheet.

It is preferred to use an adhesive roll on the surface of which is provided an adhesive material as the traveling roll 7 in either of the feeding site or traveling site of the foregoing thermal transfer sheet roll and image receiving sheet roll.

By providing an adhesive roll, it is possible to clean up the surfaces of the thermal transfer sheet and image receiving sheet.

Examples of the adhesive material to be provided on the surface of the adhesive roll include ethylene-vinyl acetate copolymers, ethylene-ethyl acrylate copolymers, polyolefin resins, polybutadiene resins, styrene-butadiene copolymers (SBR), sytrene-ethylene-butene-styrene copolymers (SEBS), acrylonitrile-butadiene copolymers (NBR), polyisoprene resins (IN), styrene-isoprene copolymers (SIS), acrylic acid ester copolymers, polyester resins, polyurethane resins, acrylic resins, butyl rubbers, and polynorbornenes.

When the adhesive roll comes into contact with the surfaces of the thermal transfer sheet and image receiving sheet, it can clean up the surfaces, and the contact pressure is not particularly limited so far as it comes into contact therewith.

It is preferable that an adhesive material to be used for the adhesive roll has a Vickers hardness Hv of not more than 50 kg/mm$^2$ (≅490 MPa). This is because contaminants as foreign matters can be sufficiently removed, and image defects can be suppressed.

The Vickers hardness as referred to herein is a hardness measured by applying a static load to a pyramid diamond indenter having an angle between the opposite faces of 136°, and the Vickers hardness Hv is determined according to the following expression.

$$\text{Hardness } Hv=1.854\ P/d^2\ (\text{kg/mm}^2)\cong 18.1692\ p/d^2\ (\text{MPa})$$

Here, P denotes a weight of the load (kg); and d denotes a diagonal length of a square of depression (mm).

Also, in the invention, it is preferable that an adhesive material to be used for the adhesive roll has an elastic modulus at 20° C. of not more than 200 kg/cm$^2$ (≅19.6 MPa). Likewise the following case, this is because contaminants as foreign matters can be sufficiently removed, and image defects can be suppressed.

Next, a preferred example of the construction of an embodiment of the invention will be enumerated. An example of the construction in which the image receiving sheet and the thermal transfer sheet are cut into a desired size in advance and then fed from a cassette will be described with reference to FIGS. 5 to 7.

Figure 5:
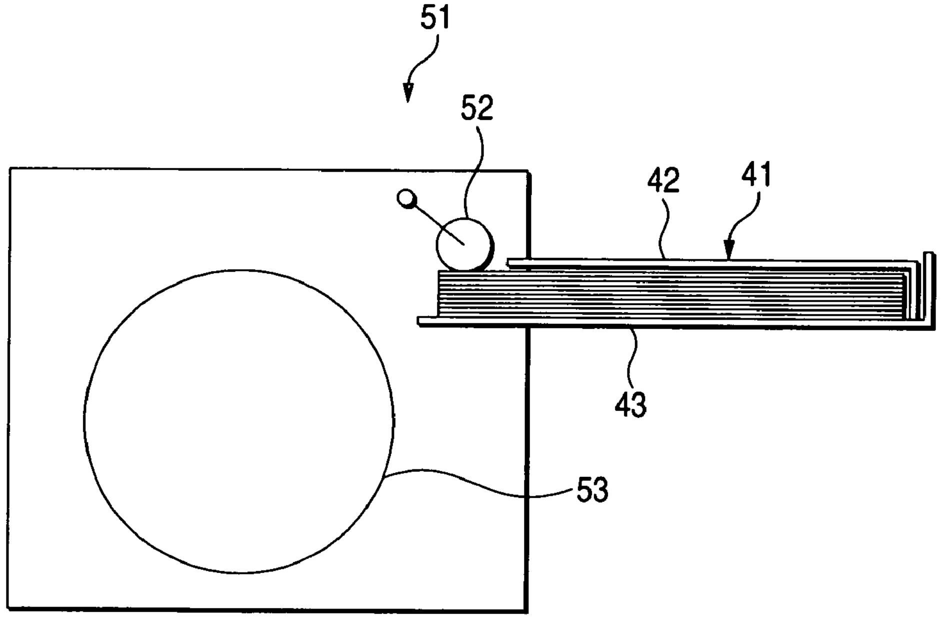
FIG. 5 is a view to show a constitutional example of a laser thermal transfer recording device using a simplified cassette for recording medium.
Figure 6:
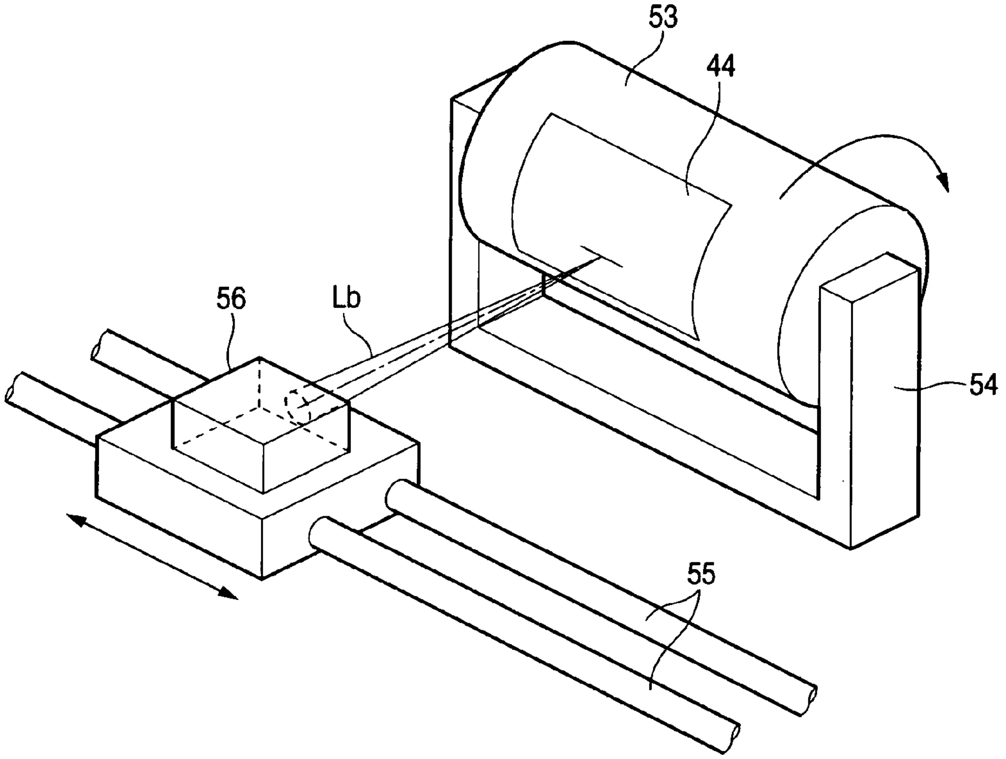
FIG. 6 is a view to show an example of especially a laser exposing section of a laser thermal transfer recording device using a simplified cassette for recording medium.
Figure 7:
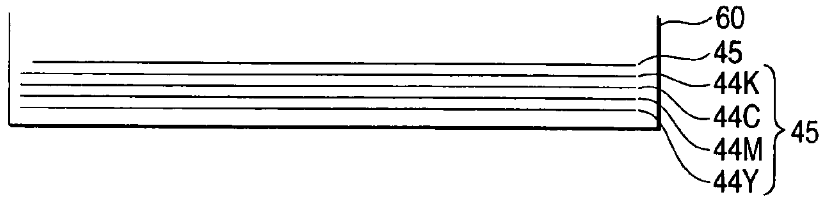
FIG. 7 is a view to show an accumulating tray of a laser thermal transfer recording device using a simplified cassette for recording medium.

As shown in FIGS. 5 to 7, a recording section of a recording device 51 is provided with a rotating drum 53 for recording that is a recording medium supporting member. The rotating drum 53 for recording has a hollow cylindrical shape and is held rotatably in a frame 54 shown in FIG. 6. In the recording device 51, the rotation direction of the rotating drum 53 for recording is the main scanning direction. The rotating drum 53 for recording is connected to a motor rotation axis and rotated and driven by a motor. Also, the recording device 51 is provided with a cassette main body 42.

Further, the recording section is provided with a recording head 56. The rotating drum 53 for recording gives out laser beam Lb. An image forming layer of a thermal transfer sheet 44 at the position where this laser beam Lb is irradiated is transferred onto the surface of an image receiving sheet 45. Also, the recording head 56 linearly moves in a direction parallel to the rotation axis of the rotating drum 53 for recording along a guide rail 55 by means of a non-illustrated driving mechanism. This moving direction becomes a sub-scanning direction. Accordingly, by a combination of the rotation movement of the rotating drum 53 for recording with the linear movement of the recording head 56, it is possible to expose a desired position on the thermal transfer sheet 44 covering the image receiving sheet 45 to laser. Accordingly, by scanning the thermal transfer sheet 44 with the laser beam Lb for drawing and exposing only the corresponding position based on image information with laser, it is possible to transfer a desired image on the image receiving sheet 45.

A cassette carrier 43 is provided in a recording medium installing section of the recording device 51, and a simplified cassette 41 for recording medium in which a multicolor image forming material (also called as "recording medium") composed of the image receiving sheet 45 and the thermal transfer sheet 44 is contained in the cassette main body 42 is detachably set directly in the cassette carrier 43. In the recording device 51, when the simplified cassette 41 is placed in this cassette carrier 43, a recording medium is taken out from the simplified cassette 41 and fed and traveled into the recording medium supporting member 53 of the recording device 51 by a traveling roll 52.

First of all, the image receiving sheet is supported such that the image layer is exposed on the drum 53 from the cassette 41. Next, for example, a thermal transfer sheet 44Y is supported on the subject drum such that the image forming layer of the thermal transfer sheet is superposed on the image receiving sheet. Next, laser beam is irradiated from the support side of the thermal transfer sheet 44Y, the laser beam-irradiated region of the image forming layer is transferred onto the image receiving layer of the image receiving sheet 45 to undergo image recording, and the subject thermal transfer sheet is then peeled apart, followed by accumulation in an accumulating tray 60 such that the image forming layer side turns upwardly. Next, for example, each of thermal transfer sheets 44M, 44C and 44K is subjected to laser thermal transfer and accumulation treatments in the same manner as in the case of the thermal transfer sheet K. After accumulating the final thermal transfer sheet K, the multicolor image-supported image receiving sheet 45 is accumulated on the thermal transfer sheet 44C such that the image receiving layer side turns downwardly (FIG. 7).

The accumulating tray 60 can be disposed at a desired position of the recording device 51. Also, as the accumulation mechanism comprising the peeling mechanism of the thermal transfer sheet and the image receiving sheet after completion of the thermal transfer, the traveling mechanism into a tray, and the like, known measures can be employed.

Here, for example, it is preferred to employ an adhesive roll on the surface of which is provided an adhesive material as the traveling roll 52. By providing the adhesive roll, it is possible to clean up the surfaces of the thermal transfer sheet and the image receiving sheet.

The adhesive material to be provided on the surface of the adhesive roll and its properties such as hardness and elastic modulus are the same as described above for FIG. 2.

A characteristic feature 2 of the systematization technology resides in a construction of the thermal transfer device.

For performing a step of transferring the image receiving sheet having an image printed by the recording device onto a printing actual paper stock (called as "actual paper stock"), a thermal transfer device is used. This step is exactly the same as in First Proof™. When the image receiving sheet and the actual paper stock are superposed and applied with heat and pressure, the both are bonded to each other. Thereafter, when the image receiving film is peeled apart from the actual paper stock, only an image and an adhesive layer remain on the actual paper stock, and an image receiving sheet support and a cushioning layer are peeled. Accordingly, the image is transferred from the image receiving sheet onto the actual paper stock in practical use.

Figure 3:
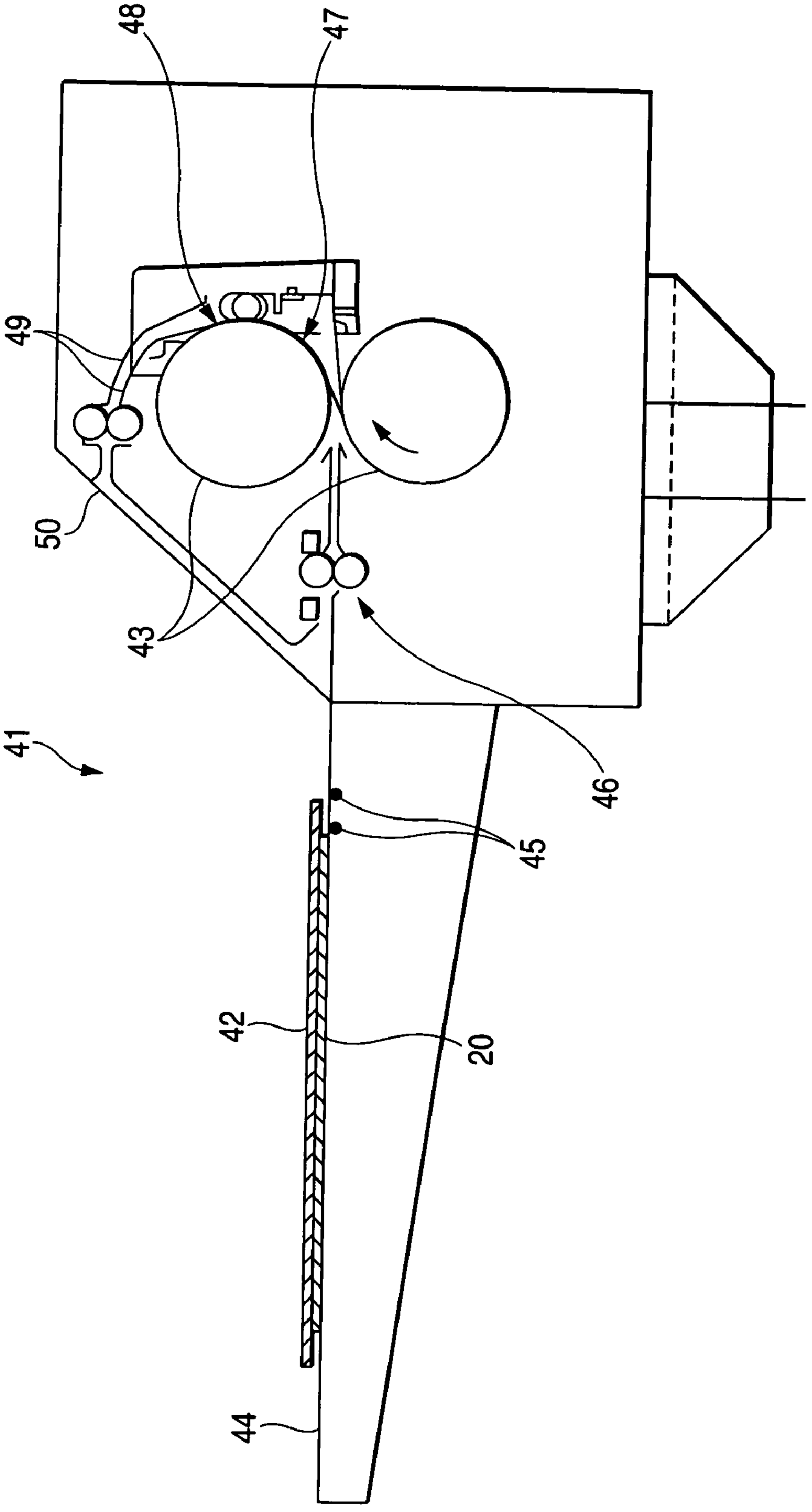
FIG. 3 is a view to show a constitutional example of a thermal transfer device.

In First Proof™, an actual paper stock and an image receiving sheet are superposed on an aluminum guide plate and passed between heat rolls to undergo transfer. The reason why the aluminum guide plate is used resides in preventing deformation of the actual paper stock. However, when this is employed in the present system of a B2 size, an aluminum guide plate larger than the B2 size is necessary, leading to generation of such a problem that an installation space of the device becomes large. Then, in the present system, a structure in which an aluminum guide plate is not used, and a traveling path is turned with 180°, thereby undergoing discharge into the insertion side was employed, the installation space became very compact (see FIG. 3). However, since an aluminum guide plate is not used, there was encountered such a problem that the actual paper stock was deformed. Concretely, a pair of the actual paper stock and the image receiving sheet as discharged curls inwardly and rolls over the discharge table. It is a very difficult work to peel apart the image receiving sheet from the curled actual paper stock.

Then, with respect to a method of preventing curling from occurrence, there are considered a bimetal effect due to a difference in the quantity of shrinkage between the actual paper stock and the image receiving sheet and an iron effect due to a structure of winding them around a heat roll. In the conventional case where the image receiving sheet is superposed on the actual paper stock and then inserted, since the heat shrinkage of the image receiving sheet to the insertion and advance direction is larger than that of the actual paper stock, curling due to the bimetal effect occurs in such a manner that the upper side becomes inward, and since this direction is identical with the direction of the iron effect, the curling becomes severe due to a synergist effect. However, when the image receiving sheet is inserted in such a manner that it is positioned beneath the actual paper stock, the curling due to the bimetal effect becomes downward, whereas the curling due to the iron effect becomes upward. Accordingly, the curling was set off, resulting in no problem.

The sequence of the actual paper stock transfer is as follows (hereinafter referred to as “actual paper stock transfer method used in the present system”). A thermal transfer device 41 shown in FIG. 3, which is used in this method, is a manual working device different from the recording device.

1) First of all, the temperature of heat rolls 43 (from 100 to 110° C.) and the traveling speed at the time of transfer are set up using dials (not shown) depending upon the kind of an actual paper stock 42.
2) Next, an image receiving sheet 20 is placed on an insertion table in such a manner that an image is positioned upwardly, and dusts on the image are removed by an antistatic brush (not shown). The actual paper stock 42 from which dusts have been removed is superposed thereon. In this regard, since the size of the actual paper stock 42 to be placed in the upper side is larger than that of the image receiving film 20 to be placed in the lower side, the position of the image receiving sheet 20 becomes unseen so that it is difficult to achieve alignment. In order to improve this workability, marks 45 to show the respective positions of the image receiving sheet and actual paper stock to be placed are given on the insertion table 44. The reason why the actual paper stock is larger resides in the purpose of preventing contamination of the heat rolls 43 by the image receiving layer of the image receiving sheet 20, which is caused by coming out of the image receiving sheet 20 from the actual paper stock 42.
3) When the image receiving sheet and the actual paper stock are pushed in the superposed state into an insertion port, insertion rolls 46 are rotated, thereby sending out the both toward the heat rolls 43.
4) When the front end of the actual paper stock reaches the position of the heat rolls 43, the heat rolls are nipped, thereby starting the transfer. The heat rolls are a heat-resistant silicon rubber roll. Here, when pressure and heat are simultaneously applied, the image receiving sheet and the actual paper stock are bonded to each other. A guide 47 made of a heat-resistant sheet is placed in the downstream of the heat rolls. The pair of the image receiving sheet and the actual paper stock is traveled upwardly in the state that heat is applied between the upper-side heat roll and the guide 47, peeled apart from the heat roll at the position of a peeling pawl 48; and introduced into a discharge port 50 along a guide plate 49.
5) The pair of the image receiving sheet and the actual paper stock coming out from the discharge port 50 is discharged in the bonded state onto the insertion table. Thereafter, the image receiving sheet 20 is manually peeled apart from the actual paper stock 42.

A characteristic feature 2 of the systematization technology resides in a construction of the system.

By connecting the foregoing devices onto a plate making system, the function as a color proof can be exhibited. The system is required such that a printed matter having an image quality closed to a printed matter output from a certain plate making data as far as possible is output from the proof. Then, a software for making the colors and halftone dots closed to the printed matter is necessary. A concrete connection example will be introduced below.

In the case where a proof of the printed matter from a plate making system Celebra™, manufactured by Fuji Photo Film Co., Ltd. is taken, the system connection is as follows. A CTP (Computer To Plate) system is connected to Celebra. By installing a printing plate output herein in a printing machine, a final printed matter is obtained. Luxel FINALPROOF 5600 (hereinafter sometimes referred to as “FINALPROOF”), manufactured by Fuji Photo Film Co., Ltd. that is the foregoing recording device is connected as a cool proof to Celebra. During this, in order to make the colors and halftone images closed to the printed matter, PD System™, manufactured by Fuji Photo Film Co., Ltd. is connected as a proof drive software thereto.

In Celebra, a contone (continuous tone) data converted into a raster data is converted into a binary value for halftone dot and output into the CTP system, whereby final printing is achieved. On the other hand, the same contone data is also output into a PD system. The PD system converts the received data according to a four-dimensional (black, cyan, magenta and yellow) table in such a manner that the colors are coincident to the printed matter. Further, the converted data is finally converted into a binary data for halftone dot so as to coincide with the halftone dots of the foregoing printed matter, thereby outputting into FINALPROOF (see FIG. 4).

The foregoing four-dimensional table is experimentally prepared in advance and stored within the system. The experiment for the preparation is as follows. An image in which an important color data is printed through the CTP system and an image in which the important color data is output into the FINALPROOF through the PD system are prepared, colorimetry values of the both are compared, and the table is prepared such that a difference therebetween becomes minimum.

In this way, the invention could realize the system construction such that the ability of a material having a high resolving power can be sufficiently exhibited.

Next, the thermal transfer sheet that is a material to be used in the system of the invention will be described.

It is preferable that an absolute value of a difference between a surface roughness Rz of the surface of the image forming layer of the thermal transfer sheet and a surface roughness Rz of the surface of the back layer thereof is not more than 3.0 and that an absolute value of a difference between a surface roughness Rz of the surface of the image receiving layer of the image receiving sheet and a surface roughness Rz of the surface of the back layer thereof is not more than 3.0. According to such a construction, in cooperation with the foregoing cleaning measure, it is possible to prevent the image defect, to avoid traveling jamming and to enhance the dot gain stability.

The surface roughness Rz as referred to in this description means a ten-point average surface roughness corresponding to Rz (maximum height) according to JIS and is a value obtained by inputting and calculating a distance between a mean value of heights of the maximum peak to the 5-th peak and a mean value of heights of from deepest valley to the 5-th valley while defining a mean surface of the portion after eliminating a standard area from the curved surface of the roughness as a standard surface. A tracer type three-dimensional roughness measuring instrument (SURFCOM 570A-3DF) manufactured by Tokyo Seimitsu Co., Ltd. is used. The measurement direction is the machine direction, the cut-off value is 0.08 mm, the measurement area is 0.6 mm×0.4 mm, the feed pitch is 0.005 mm, and the measuring speed is 0.12 mm/s.

It is preferable from the viewpoint of further enhancing the foregoing effect that an absolute value of a difference between a surface roughness Rz of the surface of the image forming layer of the thermal transfer sheet and a surface roughness Rz of the surface of the back layer thereof is not more than 1.0 and that an absolute value of a difference between a surface roughness Rz of the surface of the image receiving layer of the image receiving sheet and a surface roughness Rz of the surface of the back layer thereof is not more than 1.0.

Further, as another embodiment, it is preferable that the surface roughness of the surface of the image forming layer of the thermal transfer sheet and the surface of the back layer thereof and/or the surface roughness Rz of the front and back surfaces of the image receiving sheet is from 2 to 30 μm. According to such a construction, in cooperation with the foregoing cleaning measure, it is possible to prevent the image defect, to avoid traveling jamming and to enhance the dot gain stability.

Also, it is preferable that a glossiness of the image forming layer of the thermal transfer sheet is from 80 to 99.

The glossiness largely depends upon the smoothness of the surface of the image forming layer and influences uniformity of the layer thickness of the image forming layer. When the glossiness is high, the resulting image forming layer is more proper for applications to images that are uniform and have high definition, whereas when the smoothness is high, the resistivity at the time of traveling becomes larger, and therefore, the both are in the trade-off relation. When the glossiness falls within the range of from 80 to 99, the both can be made coexistent and balanced.

Figure 1B:
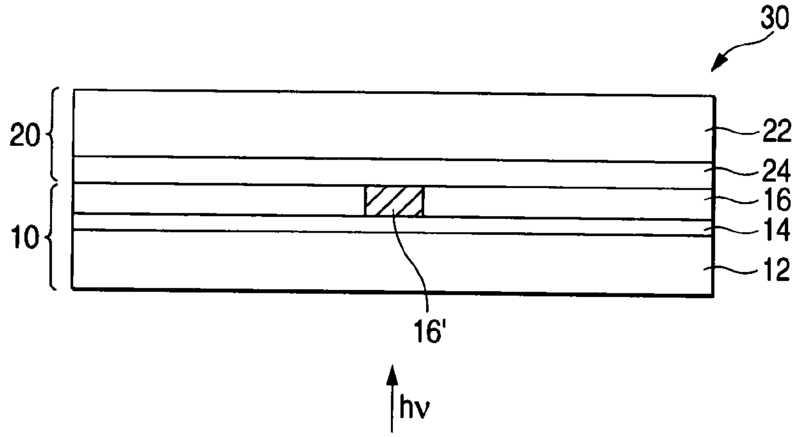
Figure 1C:
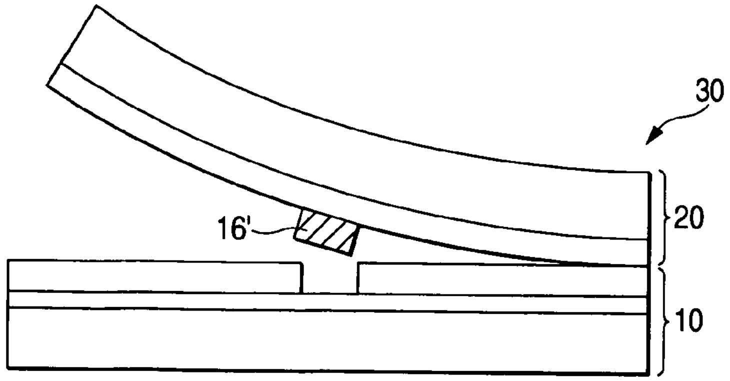

Next, the outline of a mechanism of the multicolor image formation by thin-layer thermal transfer using laser will be described with reference to FIG. 1.

An image receiving sheet 20 is laminated on the surface of an image receiving layer 16 of a thermal transfer sheet 10, which contains a black (K), cyan (C), magenta (M) or yellow (Y) pigment, to prepare an image forming laminate 30. The thermal transfer sheet 10 has a support 12 and a photothermal converting layer 14 thereon and further has the image forming layer 16 thereon; the image receiving sheet 20 has a support 22 and an image receiving layer 24 thereon; and the image receiving layer 24 is brought into contact with and laminated on the surface of the image forming layer 16 of the thermal transfer sheet 10 (see FIG. 1A). When laser beam is imagewise irradiated in time sequence from the side of the support 12 of the thermal transfer sheet 10 of the laminate 30, an laser beam-irradiated region of the photothermal converting layer 14 of the thermal transfer sheet 10 generates heat, whereby the adhesive strength to the image forming layer 16 lowers (see FIG. 1B). Thereafter, when the image receiving sheet 20 is peeled apart from the thermal transfer sheet 10, the laser beam-irradiated region 16' of the image forming layer 16 is transferred onto the image receiving layer 24 of the image receiving sheet 20 (see FIG. 1C).

In the multicolor image formation, the laser beam to be used for the irradiation is preferably multi-beam light, and especially preferably a multi-beam two-dimensional array. The multi-beam two-dimensional array as referred to herein means that when in recording upon laser irradiation, a plural number of laser beams are used, and spot arrays of these laser beams construct a two-dimensional planar array composed of plural lines along the main scanning direction and plural lines along the sub-scanning direction.

By using laser beam as the multi-beam two-dimensional array, it is possible to shorten the time required for laser recording.

The laser beam to be used can be used without particular limitations, and examples thereof include gas laser beams such as argon ion laser beam, helium neon laser beam, and helium cadmium laser beam; solid laser beams such as YAG laser beam; and direct laser beams such as semiconductor laser beam, coloring matter laser beam, and excimer laser beam. Alternatively, beams resulting from conversion of such laser beam into beam having a half wavelength through a secondary harmonic element can be used. In the multicolor image forming method, it is preferred to use semiconductor laser beams while taking into consideration an output power, easiness of modulation, etc. In the multicolor image forming method, it is preferable that the laser beam is irradiated under the condition that the beam size falls within the range of from 5 to 50 μm (especially from 6 to 30 μm) on the photothermal converting layer, and it is preferable that the scanning speed is 1 m/sec or more (especially 3 m/sec or more).

Also, in the multicolor image formation, it is preferable that the layer thickness of the image forming layer in the black thermal transfer sheet is larger than that of the image forming layer in each of the yellow, magenta and cyan thermal transfer sheets and is from 0.5 to 0.7 μm. In this way, it is possible to suppress a reduction of the density due to transfer unevenness in irradiating the black thermal transfer sheet with laser.

When the layer thickness of the image forming layer in the foregoing black thermal transfer sheet is 0.5 μm or more, in recording with high energy, the image density can be kept without causing transfer unevenness, and an image density necessary as a printing proof can be achieved. Since this trend becomes more remarkable under a high-humidity condition, the change in density due to the ambient can be suppressed. On the other hand, when the layer thickness is not more than 0.7 μm, the transfer sensitivity can be kept at the time of laser recording, and attachment of small spots and fine lines are improved. This trend is more remarkable under a low-humidity condition. Also, the resolving power can be made good. The layer thickness of the image forming layer in the foregoing black thermal transfer sheet is more preferably from 0.55 to 0.65 μm, and especially preferably 0.60 μm.

Further, it is preferable that the layer thickness of the image forming layer in the foregoing black thermal transfer sheet is from 0.5 to 0.7 μm and that the layer thickness of the image forming layer in each of the foregoing yellow, magenta and cyan thermal transfer sheets is 0.2 μm or more and less than 0.5 μm.

When the layer thickness of the image forming layer of each of the foregoing yellow, magenta and cyan thermal transfer sheets is 0.2 μm or more, it is possible to design to keep the density at the time of laser recording without causing transfer unevenness, whereas when it is not more than 0.5 μm, it is possible to improve the transfer sensitivity and resolving power. More preferably, the layer thickness is from 0.3 to 0.45 μm.

It is preferable that the image forming layer in the foregoing black thermal transfer sheet contains carbon black. It is preferable that the carbon black comprises at least two kinds of carbon blacks having a different coloring power because the reflection density can be adjusted while keeping a P/B (pigment/binder) ratio within a fixed range.

Though the coloring power of carbon black is expressed by various methods, for example, a PVC blackness described in JP-A-10-140033 is enumerated. The PVC blackness as referred to herein means that carbon black is added to a PVC resin and dispersed using two rolls to form a sheet, a blackness of each of Carbon Blacks "#40" and "#45", manufactured by Mitsubishi Chemical Corporation is defined as point 1 and point 10, respectively as the standard value, and the blackness of the sample is visually determined and evaluated. Two or more kinds of carbon blacks having a different PVC blackness can be properly chosen and used depending upon the purpose.

Specific preparation methods of samples will be described below.

<Preparation Method of Sample>

40% by weight of sample carbon black is compounded in an LDPE (low-density polyethylene) resin in a 250-cc Banbury mixer and kneaded at 115° C. for 4 minutes.

| Compounding condition: | |
|---|---|
| LPDE resin: | 101.89 g |
| Calcium stearate: | 1.39 g |
| Irganox 1010: | 0.87 g |
| Sample carbon black: | 69.43 g |

Next, the kneaded compound is diluted at 120° C. using a two-roll mill in such a manner that the carbon black concentration is 1% by weight.

| Preparation condition of diluted compound: | |
|---|---|
| LDPE resin: | 58.3 g |
| Calcium stearate: | 0.2 g |
| Resin compounded with 40% by weight of carbon black: | 1.5 g |

The diluted compound is formed into a sheet with a slit width of 0.3 mm, and this sheet is cut into chips and molded into a film of 65±3 μm on a hot plate at 240° C.

As a method of forming a multicolor image, the multicolor image may be formed by repeatedly superposing a number of image layers (image forming layers on which an image is formed) on the same image receiving sheet-using the foregoing thermal transfer sheets as described previously. Also, the multicolor image may be formed by once forming an image on the image forming layers of a plural number of image receiving sheets and then re-transferring it onto a printing actual paper stock, etc.

With respect to the latter, for example, thermal transfer sheets each having an image forming layer containing a coloring material having a different hue from each other are prepared, and four kinds (four colors of cyan, magenta, yellow and black) of image forming laminates comprising a combination of this thermal transfer sheet with an image receiving sheet are independently produced. For example, each laminate is irradiated with laser beam according to a digital signal based on the image through a color decomposing filter, and subsequently, the image receiving sheet is peeled apart from the thermal transfer sheet to independently form a color decomposed image of each color on each of the image receiving sheets. Next, the respective formed color decomposed images are successively laminated on a separately prepared actual support such as a printing actual paper stock or a support analogous thereto, whereby a multicolor image can be formed.

With respect to the thermal transfer sheet using laser beam irradiation, it is preferable that an image forming layer containing a pigment is subjected to thin-layer transfer on an image receiving sheet by converting the laser beam into heat and utilizing the heat energy, to form an image on the image receiving sheet. The technologies used for the development of an image forming material comprising the thermal transfer sheet and the image receiving sheet can be properly applied to the development of thermal transfer sheets and/or image receiving sheets by a fusion type transfer system, a transfer system by abrasion, a sublimation type transfer system, etc. The system of the invention includes image forming materials to be used in these systems.

The thermal transfer sheet and the image receiving sheet will be described below in detail.

[Thermal Transfer Sheet]

The thermal transfer sheet has at least a photothermal converting layer and an image forming layer on a support and further other layers, if desired.

(Support)

The material of the support of the thermal transfer sheet is not particularly limited, but various support materials can be used depending upon the purpose. It is preferable that the support has stiffness, is good in dimensional stability and is durable against heat in the image formation. Preferred examples of the support materials include synthetic resin materials such as polyethylene terephthalate, polyethylene-2,6-naphthalate, polycarbonates, polymethyl methacrylate, polyethylene, polypropylene, polyvinyl chloride, polyvinylidene chloride, polystyrene, styrene-acrylonitrile copolymers, (aromatic or aliphatic) polyamides, polyimides, polyamide-imides, and polysulfones. Of these, taking into consideration mechanical strength and dimensional stability against heat, biaxially stretched polyethylene terephthalate is preferable. Incidentally, in the case of use in preparing a color proof utilizing laser recording, it is preferable that the support of the thermal transfer sheet is formed of a transparent synthetic resin material through which laser beam passes. The thickness of the support is preferably from 25 to 130 μm, and especially preferably from 50 to 120 μm. It is preferable that a center line average surface roughness Ra (measured using a surface roughness measuring instrument (Surfcom, manufactured by Tokyo Seimitsu Co., Ltd.) according to JIS B0601) of the support in the side of the image forming layer is less than 0.1 μm. It is preferable that the support has a Young's modulus of from 200 to 1,200 $kg/mm^2$ (≅ from 2 to 12 GPa) in the longitudinal direction thereof and from 250 to 1,600 kg/mm$^2$ (≅ from 2.5 to 16 GPa) in the width direction thereof, respectively. The support preferably has an F-5 value of from 5 to 50 kg/mm$^2$ (≅ from 49 to 490 MPa) in the longitudinal direction thereof and from 3 to 30 kg/mm$^2$ (≅ from 29.4 to 294 MPa) in the width direction thereof, respectively. Though the F-5 value in the longitudinal direction of the support is generally higher than that in the width direction of the support, such is not applicable especially when it is necessary that the strength in the width direction be high. Also, the support preferably has a rate of heat shrinkage at 100° C. for 30 minutes of not more than 3%, and more preferably not more than 1.5% and a rate of heat shrinkage at 80° C. for 30 minutes of not more than 1%, and more preferably not more than 0.5% in both of the longitudinal direction and the width direction. It is preferable that a breaking strength is from 5 to 100 kg/mm$^2$ (≅ from 49 to 950 MPa) in the both directions and that an elastic modulus is from 100 to 2,000 kg/mm$^2$ (≅ from 0.98 to 19.6 GPa).

The support of the thermal transfer sheet may be subjected to surface activation treatment and/or provided with one or two or more undercoating layers. Examples of the surface activation treatment include glow discharge treatment and corona discharge treatment. As materials of the undercoating layer, ones exhibiting high adhesion to the both surfaces of the support and the photothermal converting layer and having small heat conductivity and excellent heat resistance are preferable. Examples of such materials of the undercoating layer include styrene, styrene-butadiene copolymers, and gelatin. A thickness of the whole of the undercoating layers is usually from 0.01 to 2 μm. Also, the surface of the thermal transfer sheet in the side opposite to the side at which the photothermal converting layer is provided may be provided with a variety of functional layers such as an antireflection layer and an antistatic layer, or subjected to surface treatment, if desired.

(Back Layer)

It is preferred to provide a back layer on the surface of the thermal transfer sheet of the invention in the side opposite to the side at which the photothermal converting layer is provided. It is preferable that the back layer is constructed of two layers of a first back layer adjacent to the support and a second back layer provided in the opposite side of the support of the first back layer in the invention, it is preferable that a ratio B/A of the weight B of an antistatic agent contained in the second back layer to the weight A of an antistatic agent contained in the first back layer is less than 0.3. When B/A is 0.3 or more, slipperiness and powder falling of the back layer tend to be deteriorated.

The first back layer preferably has a layer thickness C of from 0.01 to 1 μm, and more preferably from 0.01 to 0.2 μm. Also, the second back layer preferably has a layer thickness D of from 0.01 to 1 μm, and more preferably from 0.01 to 0.2 μm. It is preferable that a ratio C/D in layer thickness of the first back layer to the second back layer is from 1/2 to 5/1.

As antistatic agents that are used in the first and second back layers, compounds such as nonionic surfactants such as polyoxyethylene alkylamines and glycerin fatty acid esters; cationic surfactants such as quaternary ammonium salts; anionic surfactants such as alkyl phosphates; ampholytic surfactants, and conductive resins can be used.

Also, conductive fine particles can be used as the antistatic agent. Examples of such conductive fine particles include oxides such as ZnO, $TiO_2$, $SnO_2$, $Al_2O_3$, $In_2O_3$, MgO, BaO, CoO, CuO, $Cu_2O$, CaO, SrO, $BaO_2$, PbO, $PbO_2$, $MnO_3$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$, and $MgB_2O_5$; sulfides such as CuS and ZnS; carbides such as SiC, TiC, ZrC, VC, NbC, MoC, and WC; nitrides such as $Si_3N_4$, TiN, ZrN, VN, NbN, and $Cr_2N$; borides such as $TiB_2$, $ZrB_2$, $NbB_2$, $TaB_2$, CrB, MoB, WB, and $LaB_5$; silicides such as $TiSi_2$, $ZrSi_2$, $NbSi_2$, $TaSi_2$, $CrSi_2$, $MoSi_2$, and $WSi_2$; metal salts such as $BaCO_3$, $CaCO_3$, $SrCO_3$, $BaSO_4$, and $CaSO_4$; and composites such as $SiN_4$—SiC and $9Al_2O_3$—$2B_2O_3$. These may be used singly or in admixture of two or more thereof. Of these, $SnO_2$, ZnO, $Al_2O_3$, $TiO_2$, $In_2O_3$, MgO, BaO, and $MoO_3$ are preferable; $SnO_2$, ZnO, $In_2O_3$, and $TiO_2$ are more preferable; and $SnO_2$ is especially preferable.

Incidentally, in the case where the thermal transfer material of the invention is employed for the laser thermal transfer recording system, it is preferable that the anti static agent to be used in the back layer is substantially transparent so that it can transmit laser beam therethrough.

In the case where a conductive metal oxide is used as the antistatic agent, it is preferable that its particle size is small for the purpose of making light scattering small as far as possible. However, the particle size should be determined using a ratio in refractive index of the particle to a binder as a parameter and can be determined according to the Mie's theory. In general, the mean particle size is in the range of from 0.001 to 0.5 μm, and preferably in the range of from 0.003 to 0.2 μm. The mean particle size as referred to herein means a value including not only the particles size of primary particles of the conductive metal oxide and the particle size of higher-order structures thereof.

In addition to the antistatic agent, a variety of additives such as surfactants, slipping agents, and matting agents, and binders can be added to the first and second back layers. The amount of the antistatic agent to be contained in the first back layer is preferably from 10 to 1,000 parts by weight, and more preferably from 200 to 800 parts by weight based on 100 parts by weight of the binder. Also, the amount of the antistatic agent to be contained in the second back layer is preferably from 0 to 300 parts by weight, and more preferably from 0 to 100 parts by weight based on 100 parts by weight of the binder.

Examples of the binder that is used for the formation of the first and second back layers include homopolymers or copolymers of an acrylic acid based monomer such as acrylic acid, methacrylic acid, acrylic acid esters, and methacrylic acid esters, cellulose based polymers such as nitrocellulose, methyl cellulose, ethyl cellulose, and cellulose acetate, polyethylene, polypropylene, polystyrene, vinyl based polymers and copolymers of a vinyl compound such as vinyl chloride based copolymers, vinyl chloride-vinyl acetate copolymers, polyvinylpyrrolidone, polyvinyl butyral, and polyvinyl alcohol, condensed polymers such as polyesters, polyurethanes, and polyamides, rubber based thermoplastic polymers such as butadiene-styrene copolymers, polymers resulting from polymerization or crosslinking of a photopolymerizable compound or heat polymerizable compound such as epoxy compounds, and melamine compounds.

(Photothermal Converting Layer)

The photothermal converting layer contains a photothermal converting substance, a binder, and optionally a matting agent, and further optionally other components.

The photothermal converting substance is a substance having a function to convert light energy to be irradiated into heat energy. In general, it is a coloring matter (including a pigment, hereinafter the same) capable of absorbing laser beam. In the case where the image recording is carried out using laser beam, it is preferred to use an infrared absorbing coloring matter as the photothermal converting substance. Examples of the foregoing coloring matter include black pigments such as carbon black; pigments of a large ring compound having absorption in from visible light to near infrared regions, such as phthalocyanine and naphthalocyanine; organic dyes that are used as a laser absorbing material of high-density laser recording of an optical disk, etc. (cyanine dyes such as indolenine dyes, anthraquinone based dyes, azulene based coloring matters, and phthalocyanine based dyes), and organometallic compound coloring matters such as dithiol nickel complexes. Of these, since cyanine based coloring matters have a high absorptivity coefficient against light in the infrared region, when they are used as the photothermal converting substance, it is possible to make the photothermal converting layer thin. As a result, the recording sensitivity of the thermal transfer sheet can be further enhanced, and therefore, such is preferable.

Besides the coloring matters, inorganic materials such as particulate metallic materials such as blackened silver can be used as the photothermal converting substance.

As the binder to be contained in the photothermal converting layer, resins having at least a strength such that a layer can be formed on the support and having a high thermal conductivity are preferable. Further, resins having heat resistance such that they are not decomposed even by heat generated from the photothermal converting substance in the image recording are preferable because even upon irradiation with high energy light, they can smoothen the surface of the photothermal converting layer after the light irradiation. Concretely, resins having a thermal decomposition temperature (a temperature at which the weight is reduced by 5% in an air stream at a temperature-rise rate of 10° C./min according to the TGA method (thermogravimetric analysis method)) of 400° C. or higher are preferable, and resins having the foregoing thermal decomposition temperature of 500° C. or higher are more preferable. Also, the binder preferably has a glass transition temperature of from 200 to 400° C., and more preferably from 250 to 350 ° C. When the glass transition temperature is lower than 200° C., the formed image may possibly generate fogging, whereas when it is higher than 400° C., the solubility of the resin lowers so that the production efficiency may possibly lower.

Incidentally, it is preferable that the heat resistance (for example, heat deformation temperature or thermal decomposition temperature) of the binder in the photothermal converting layer is higher as compared with that of the materials to be used in other layers provided on the photothermal converting layer.

Specific examples thereof include acrylic acid based resins such as polymethyl methacrylate, polycarbonates, polystyrene, vinyl based resins such as vinyl chloride/vinyl acetate copolymers and polyvinyl alcohol, polyvinyl butyral, polyesters, polyvinyl chloride, polyamides, polyimides, polyether imides, polysulfones, polyether sulfones, aramids, polyurethanes, epoxy resins, and urea/melamine resins. Of these, polyimide resins are preferable.

Especially, polyimide resins represented by the following general formulae (I) to (VII) are soluble in an organic solvent, and when such a polyimide resin is used, the productivity of the thermal transfer sheet is enhanced, and therefore, such is preferable. Also, these polyimide resins are preferable from the standpoints of viscosity stability, long-term preservability and moisture resistance of the coating solution for photothermal converting layer.

(I)

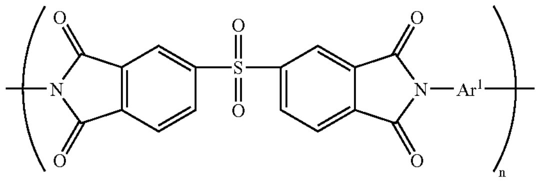

(II)

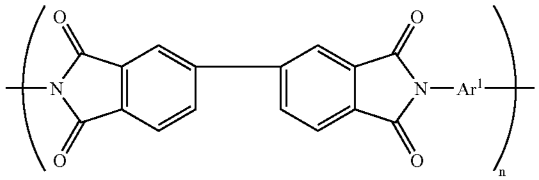

In the foregoing general formulae (I) and (II), $Ar^1$ represents an aromatic group represented by any one of the following structural formulae (1) to (3); and n represents an integer of from 10 to 100.

(1)

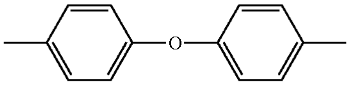

(2)

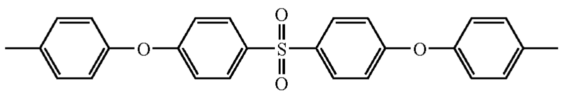

(3)

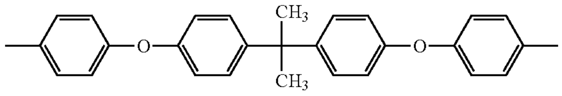

(III)

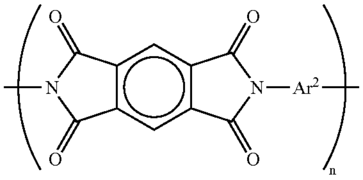

(IV)

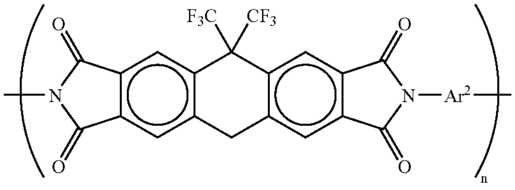

In the foregoing general formulae (III) and (IV) $Ar^2$ represents an aromatic group represented by any one of the following structural formulae (4) to (7); and n represents an integer of from 10 to 100.

(4)

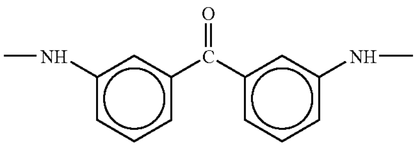

(5)

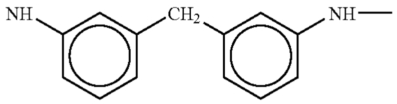

(6)

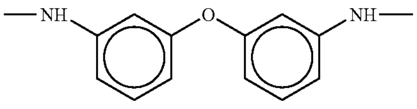

(7)

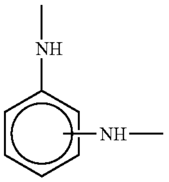

(V)

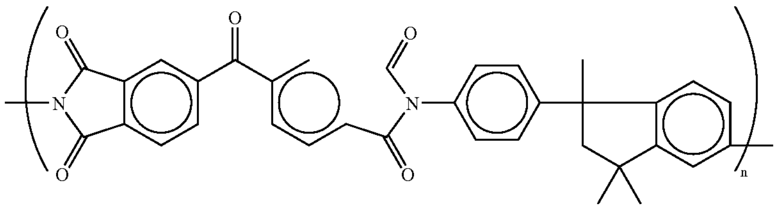

(VI)

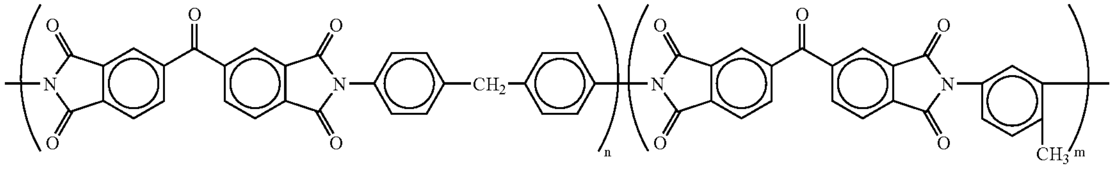

(VII)

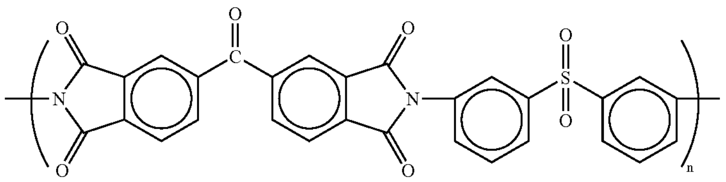

In the foregoing general formulae (V) to (VII), n and m each represents an integer of from 10 to 100; and in the formula (VI), a ratio of n/m is from 6/4 to 9/1.

Incidentally, the standard for judging whether or not the resin is soluble in an organic solvent is a standard that the resin is dissolved in a proportion of 10 parts by weight or more based on 100 parts by weight of N-methylpyrrolidone at 25° C. In the case there the resin is dissolved in a proportion of 10 parts or more, it is preferably used as a resin for the photothermal converting layer. Resins that are dissolved in a proportion of 100 parts by weight or more based on 100 parts by weight of N-methylpyrrolidone are more preferable.

Examples of the matting agent to be contained in the photothermal converting layer include inorganic fine particles and organic fine particles. Examples of the inorganic fine particles include metal salts such as silica, titanium oxide, aluminum oxide, zinc oxide, magnesium oxide, barium sulfate, magnesium sulfate, aluminum hydroxide, magnesium hydroxide, and boron nitride, kaolin, clay, talc, zinc powder, white lead, Zeeklite, quartz, diatomaceous earth, barite, bentonite, mica, and synthetic mica. Examples of the organic fine particles include resin particles such as fluorine resin particles, guanamine resin particles, acrylic resin particles, styrene-acrylic copolymer resin particles, silicone resin particles, melamine resin particles, and epoxy resin particles.

The particle size of the matting agent is usually from 0.3 to 30 μm, and preferably from 0.5 to 20 μm, and its addition amount is preferably from 0.1 to 100 $mg/m^2$.

If desired, surfactants, thickening agents, antistatic agents, and the like may be further added to the photothermal converting layer.

The photothermal converting layer can be provided by dissolving a photothermal converting substance and a binder and optionally further adding a matting agent and other components to prepare a coating solution and coating the coating solution on a support, followed by drying. Examples of an organic solvent for dissolving the polyimide resin include n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethyl sulfoxide, dimethylformamide, dimethylacetamide, γ-butyrolactone, ethanol, and methanol. The coating and drying can be carried out utilizing usual coating and drying methods. The drying is usually carried out at a temperature of not higher than 300° C., and preferably at a temperature of not higher than 200° C. In the case where polyethylene terephthalate is used as the support, it is preferable that the drying is carried out at a temperature of from 80 to 150° C.

When the amount of the binder in the photothermal converting layer is too small, a cohesive strength of the photothermal converting layer lowers so that in transferring the formed image onto the image receiving sheet, the thermal converting layer is liable to be transferred together, leading to a cause of color mixture of the image. Also, when the amount of the polyimide resin is too large, in order to achieve a fixed light absorption rate, the layer thickness of the photothermal converting layer becomes large, thereby likely resulting in a reduction of the sensitivity. A solids content weight ratio of the photothermal converting substance to the binder in the photothermal converting layer is preferably from 1/20 to 2/1, and especially preferably from 1/10 to 2/1.

Also, when the photothermal converting layer is made thin, it is possible to increase the sensitivity of the thermal transfer sheet as described previously, and therefore, such is preferable. The photothermal converting layer is preferably from 0.03 to 1.0 μm, and more preferably from 0.05 to 0.5 μm. Also, when the photothermal converting layer has an optical density of from 0.80 to 1.26 against light having a wavelength of 808 nm, the transfer sensitivity of the image forming layer increases, and therefore, such is preferable. It is more preferable that the photothermal converting layer has an optical density of from 0.92 to 1.1 against light having the foregoing wavelength. When the optical density at the laser peak wavelength is less than 0.80, it becomes insufficient to convert the irradiated light into heat so that the transfer sensitivity may possibly lower. On the other hand, when it exceeds 1.26, the function of the photothermal converting layer is likely influenced at the time of recording to cause fogging. In the invention, the optical density of the photothermal converting layer of the thermal transfer sheet means an absorbance of the photothermal converting layer at the peak wavelength of laser beam to be used in recording the image forming material of the invention and can be measured using a known spectrophotometer. In the invention, a UV-spectrophotometer UV-240 manufactured by Shimadzu Corporation was used. Also, the foregoing optical density is defined as a value resulting from subtraction of a value of the only support from a value of the support-containing sheet.

(Image Forming Layer)

The image forming layer contains at least a pigment for forming an image transferred onto the image receiving sheet and further contains a binder for forming a layer and optionally other components.

A pigment is generally divided broadly into an organic pigment and an inorganic pigment. The former is especially excellent in transparency of the coating film, and the latter generally has characteristics such as excellent hiding property. Accordingly, the pigment may be properly chosen depending upon the application. In the case where the foregoing thermal transfer sheet is used for printing color correction, organic pigments having a color tone coincident with or closed to yellow, magenta, cyan and black generally used in printing inks are suitably used. Besides, there may be the case where metallic powders, fluorescent pigments, etc. are used. Examples of the pigment to be suitably used include azo based pigments, phthalocyanine based pigments, anthraquinone based pigments, dioxazine based pigments, quinacridone based pigments, isoindolinone based pigments, and nitro based pigments. The pigments to be used in the image forming layer will be enumerated below for every hue, but it should not be construed that the invention is limited thereto.

1) Yellow Pigment:

Pigment Yellow 12 (C.I. No. 21090):

Examples include Permanent Yellow DHG (manufactured by Clariant (Japan) K.K.), Lionol Yellow 1212B (manufactured by Toyo Ink Mfg. Co., Ltd.), Irgalite Yellow LCT (manufactured by Ciba Speciality Chemicals), and Symuler Fast Yellow GTF 219 (manufactured by Dainippon Ink and Chemicals, Incorporated).

Pigment Yellow 13 (C.I. No. 21100):

Examples include Permanent Yellow GR (manufactured by Clariant (Japan) K.K.) and Lionol Yellow 1313 (manufactured by Toyo Ink Mfg. Co., Ltd.).

Pigment Yellow 14 (C.I. No. 21095)

Examples include Permanent Yellow G (manufactured by Clariant (Japan) K.K.), Lionol Yellow 1401-G (manufactured by Toyo Ink Mfg. Co., Ltd.), Seika Fast Yellow 2270 (manufactured by Dainichiseika Color & Chemicals Mfg Co., Ltd.), and Symuler Fast Yellow 4400 (manufactured by Dainippon Ink and Chemicals, Incorporated).

Pigment Yellow 17 (C.I. No. 21105):

Examples include Permanent Yellow GG02(manufactured by Clariant (Japan) K.K.) and Symuler Fast Yellow 8GF (manufactured by Dainippon Ink and Chemicals, Incorporated).

Pigment Yellow 155:

Examples include Graphtol Yellow 3GP (manufactured by Clariant (Japan) K.K.).

Pigment Yellow 180 (C.I. No. 21290):

Examples include Novoperm Yellow P-HG (manufactured by Clariant (.Japan) K. K.) and PV Fast Yellow HG (manufactured by Clariant (Japan) K.K.).

Pigment Yellow 139 (C.I. No. 56298):

Examples include Novoperm Yellow M2R 70 (manufactured by Clariant (Japan) K.K.).

2) Magenta Pigment:

Pigment Red 57:1 (C.I. No. 15850:1):

Examples include Graphtol Rubine L6B (manufactured by Clariant (Japan) K.K.), Lionol Red 6B-4290G (manufactured by Toyo Ink Mfg. Co., Ltd.), Irgalite Rubine 4BL (manufactured by Ciba Speciality Chemicals), and Symuler Brilliant Carmine 6B-229 (manufactured by Dainippon Ink and Chemicals, Incorporated).

Pigment Red 122 (C.I. No. 73915):

Examples include Hosterperm Pink E (manufactured by Clariant (Japan) K.K.), Lionogen Magenta 5790 (manufactured by Toyo Ink Mfg. Co., Ltd.), and Fastogen Super Magenta RH (manufactured by Dainippon Ink and Chemicals, Incorporated).

Pigment Red 53:1 (C.I. No. 15585:1):

Examples include Permanent Lake Red LCY (manufactured by Clariant (Japan) K.K.) and Symuler Lake Red C conc (manufactured by Dainippon Ink and Chemicals, Incorporated).

Pigment Red 48:1 (C.I. No. 15865:1):

Examples include Lionol Red 2B 3300 (manufactured by Toyo Ink Mfg. Co., Ltd.) and Symuler Red NRY (manufactured by Dainippon Ink and Chemicals, Incorporated).

Pigment Red 48:2 (C.I. No. 15865:2):

Examples include Permanent Red W2T (manufactured by Clariant (Japan) K.K.), Lionol Red LX235 (manufactured by Toyo Ink Mfg. Co., Ltd.), and Symuler Red 3012 (manufactured by Dainippon Ink and Chemicals, Incorporated).

Pigment Red 48:3 (C.I. No. 15865:3);

Examples include Permanent Red 3RL (manufactured by Clariant (Japan) K.K.) and Symuler Red 2BS (manufactured by Dainippon Ink and Chemicals, Incorporated).

Pigment Red 177 (C.I. No. 65300):

Examples include Cromophtal Red A2B (manufactured by Ciba Speciality Chemicals)

3) Cyan Pigment:

Pigment Blue 15 (C.I. No. 74160):

Examples include Lionol Blue 7027 (manufactured by Toyo Ink Mfg. Co., Ltd.) and Fastogen Blue BB (manufactured by Dainippon Ink and Chemicals, Incorporated).

Pigment Blue 15:1 (C.I. No. 74160):

Examples include Hosterperm Blue A2R (manufactured by Clariant (Japan) K.K.) and Fastogen Blue 5050 (manufactured by Dainippon Ink and Chemicals, Incorporated).

Pigment Blue 15:2 (C.I. No. 74160):

Examples include Hosterperm Blue AFL (manufactured by Clariant (Japan) K.K.), Irgalite Blue BSP (manufactured by Ciba speciality Chemicals), and Fastogen Blue GP (manufactured by Dainippon Ink and Chemicals, Incorporated).

Pigment Blue 15:3 (C.I. No. 74160):

Examples include Hosterperm Blue B2G (manufactured by Clariant (Japan) K.K.), Lionol Blue FG7330 (manufactured by Toyo Ink Mfg. Co., Ltd.), Cromophtal Blue 4GNP (manufactured by Ciba Speciality Chemicals), and Fastogen Blue FGF (manufactured by Dainippon Ink and Chemicals, Incorporated).

Pigment Blue 15:4 (C.I. No. 74160):

Examples include Hosterperm Blue BFL (manufactured by Clariant (Japan) K.K.), Cyanine Blue 700-10FG (manufactured by Toyo Ink Mfg. Co., Ltd.), Irgalite Blue GLNF (manufactured by Ciba Speciality Chemicals), and Fastogen Blue FGS (manufactured by Dainippon Ink and Chemicals, Incorporated).

Pigment Blue 15:6 (C.I. No. 74160):

Examples include Lionol Blue ES (manufactured by Toyo Ink Mfg. Co., Ltd.).

Pigment blue 60 (C.I. No. 69800):

Examples include Hosterperm Blue RL01 (manufactured by Clariant (Japan) K.K.) and Lionogen Blue 6501 (manufactured by Toyo Ink Mfg. Co., Ltd.).

4) Black Pigment:

Pigment Black 7 (Carbon Black C.I. No. 77266):

Examples include Mitsubishi Carbon Black MA100 (manufactured by Mitsubishi Chemical Corporation), Mitsubishi Carbon Black #5 (manufactured by Mitsubishi Chemical Corporation), and Black Pearls 430 (manufactured by Cabot Co.).

Also, as the pigment that can be used in the invention, commodities can be properly chosen by referring to *GANRYO BINRAN,* compiled by Nihon Ganryo Gijutsu Kyokai and published by Seibundo Shinkosha Inc., 1989, *COLOUR INDEX, THE SOCIETY OF DYES & COLOURIST, THIRD EDITION,* 1987, and so on.

The mean particle size of the foregoing pigment is preferably from 0.03 to 1 μm, and more preferably from 0.05 to 0.5 μm.

When the foregoing particle size is 0.03 μm or more, the dispersion cost does not increase, and the dispersion does not cause gelation or the like. On the other hand, when it is not more than 1 μm, since coarse particles are not present in the pigment, adhesion between the image forming layer and the image receiving layer is good, and transparency of the image forming layer can be improved.

As the binder of the image forming layer, amorphous organic high-molecular polymers having a softening point of from 40 to 150° C. are preferable. Examples of the forgoing amorphous organic high-molecular polymers that can be used include butyral resins, polyamide resins, polyethyleneimine resins, sulfonamide resins, polyester polyol resins, petroleum resins, homopolymers or copolymers of styrenes such as styrene, vinyl toluene, α-methylstyrene, 2-methylstyrene, chlorostyrene, vinylacetic acid, sodium vinylbenzenesulfonate, and aminosytrene, or derivatives or substitution products thereof, and homopolymers of methacrylic acid esters such as methyl methacrylate, ethyl methacrylate, butyl methacrylate, and hydroxyethyl methacrylate, and methacrylic acid, acrylic acid esters such as methyl acrylate, ethyl acrylate, butyl acrylate, and α-ethylhexyl acrylate, and acrylic acid, dienes such as butadiene and isoprene, acrylonitrile, vinyl ethers, maleic acid and maleic acid esters, maleic anhydride, cinnamic acid, or vinyl based monomers such as vinyl chloride and vinyl acetate, or copolymers thereof with other monomer. These resins can be used in admixture of two or more thereof.

The image forming layer preferably contains from 30 to 70% by weight, and more preferably from 30 to 50% by weight of the pigment. Also, the image forming layer preferably contains from 70 to 30% by weight, and more preferably from 70 to 40% by weight of the resin.

The foregoing image forming layer can contain the following components (1) to (3) as other components.

(1) Wax:

Examples of waxes include mineral waxes, natural waxes, and synthetic waxes. Examples of the foregoing mineral waxes include petroleum waxes such as paraffin wax, microcrystalline wax, ester wax, and oxidized wax, montan wax, ozokerite, and ceresin. Of these, paraffin wax is preferable. The paraffin wax is one separated from petroleum, and a variety of waxes are marketed depending upon the melting point.

Examples of the foregoing natural wax include vegetable waxes such as carnauba wax, Japan wax, ouricury wax, and esparto wax; and animal waxes such as bees wax, insect wax, shellac wax, and spermaceti wax.

The foregoing synthetic waxes are generally used as a lubricant and usually composed of a higher fatty acid based compound. Examples of such synthetic waxes include the following waxes.

1) Fatty Acid Based Wax:

Linear saturated fatty acids represented by the following general formula:

$CH_3(CH_2)_nCOOH$

In the formula, n represents an integer of from 6 to 28. Specific examples include stearic acid, behenic acid, palmitic acid, 12-hydroxystearic acid, and azelaic acid. Also, metal salts (for example, K, Ca, Zn, and Mg) of the foregoing fatty acids are enumerated.

2) Fatty Acid Ester Based Wax:

Examples of esters of the foregoing fatty acids include ethyl stearate, lauryl stearate, ethyl behenate, hexyl behenate, and behenyl myristate.

3) Fatty Acid Amide Based Wax:

Specific examples of amides of the foregoing fatty acids include stearic acid amide and lauric acid amide.

4) Aliphatic Alcohol Based Wax:

Linear saturated aliphatic alcohols represented by the following general formula:

$CH_3(CH_2)_nOH$

In the formula, n represents an integer of from 6 to 28. Specific examples include stearyl alcohol.

Of the foregoing synthetic waxes 1) to 4), higher fatty acid amides such as stearic acid amide and lauric acid amide are especially suitable. Incidentally, the foregoing wax based compounds can be used singly or in admixture, if desired.

(2) Plasticizer:

As the foregoing plasticizer, ester compounds are preferable. Examples includes known plasticizers such as phthalic acid esters such as dibutyl phthalate, di-n-octyl phthalate, di(2-ethylhexyl) phthalate, dinonyl phthalate, dilauryl phthalate, butyllauryl phthalate, and butylbenzyl phthalate; aliphatic dibasic acid esters such as di(2-ethylhexyl)adipate and di(2-ethylhexyl)sebacate; phosphoric acid triesters such as tricresyl phosphate and tri(2-ethylhexyl)phosphate; polyol polyesters such as polyethylene glycol esters; and epoxy compounds such as epoxy fatty acid esters. Of these, esters of vinyl monomers, especially esters of acrylic acid or methacrylic acid, are preferable because an effect for enhancing the transfer sensitivity or improving the transfer unevenness and an effect for adjusting the breaking elongation due to the addition thereof are large.

Examples of the foregoing ester compounds of acrylic acid or methacrylic acid include polyethylene glycol dimethacrylate, 1,2,4-butanetriol trimethacrylate, trimethylolethane triacrylate, pentaerythritol acrylate, pentaerythritol tetraacrylate, and dipentaerythritol polyacrylate.

Also, the foregoing plasticizer may be a high-molecular compound. Above all, polyesters are preferable in view of a large addition effect and hard diffusion under the storage condition. Examples of the polyesters include sebacic acid based polyesters and adipic acid based polyesters.

Incidentally, it should not be construed that the foregoing additives to be contained in the image forming layer are limited to these compounds. Also, the plasticizer may be used singly or in admixture of two or more thereof.

When the content of the additive in the image forming layer is too large, the resolution of the transferred image may possibly lower, the film strength of the image forming layer itself may possibly lower, or transfer of an unexposed area onto the image receiving sheet may possibly occur due to a reduction of adhesion between the photothermal converting layer and the image forming layer. From the foregoing viewpoints, the content of the wax is preferably from 0.1 to 30% by weight, and more preferably from 1 to 20% by weight of the whole of solids in the image forming layer. Also, content of the plasticizer is preferably from 0.1 to 20% by weight, and more preferably from 1 to 10% by weight of the whole of solids in the image forming layer.

(3) Others:

In addition to the foregoing components, the image forming layer may further contain surfactants, inorganic or organic fine particles (such as metallic powders and silica gel), oils (such as linseed oil and mineral oils), thickening agents, antistatic agents, and the like. With the exception of the case of obtaining a black image, when the image forming layer contains a substance capable of absorbing the wavelength of a light source to be used for image recording, it is possible to make energy necessary for transfer small. Though the substance capable of absorbing the wavelength of a light source may be any of pigments or dyes, in the case of obtaining a color image, it is preferable in view of color reproduction that a light source of infrared light such as a semiconductor laser in image recording is used, and a dye having low absorption in a visible area and large absorption of the wavelength of a light source is used. Examples of near infrared dyes include compounds described in JP-A-3-103476.

The image forming layer can be provided by preparing a coating solution having a pigment and the foregoing binder and so on dissolved or dispersed therein and coating it on the photothermal converting layer (on a thermosensitive release layer described below when it is provided on the photothermal converting layer), followed by drying. Examples of solvents that are used in the preparation of the coating solution include n-propyl alcohol, methyl ethyl ketone, propylene glycol monomethyl ether (MFG), methanol, and water. The coating and drying can be carried out utilizing a usual coating and drying method.

A thermosensitive release layer that generates a gas or releases attached water, etc., thereby weakening bonding strength between the photothermal converting layer of the foregoing thermal transfer sheet and the image forming layer can be provided on the photothermal converting layer. For such a thermosensitive material, it is possible to use a compound (polymer or low-molecular compound) that decomposes or denatures itself due to heat to generate a gas, a compound (polymer or low-molecular compound) that absorbs or adsorbs a considerable amount of an easily volatile gas such as moisture, etc. These compounds may be used in combination.

Examples of polymers that decompose or denature to generate a gas due to heat include self-oxidizing polymers such as nitro cellulose; halogen-containing polymers such as chlorinated polyolefins, chlorinated rubbers, polychlorinated rubbers, polyvinyl chloride, and polyvinylidene chloride; acrylic polymers having a volatile compound such as moisture adsorbed thereon, such as polyisobutyl methacrylate; cellulose esters having a volatile compound such as moisture adsorbed thereon, such as ethyl cellulose; and natural high-molecular compounds having a volatile compound such as moisture adsorbed thereon, such as gelatin. Examples of low-molecular compounds that decompose or denature to generate a gas due to heat include compounds that cause heat generation and decomposition to generate a gas, such as diazide compounds and azide compounds.

Incidentally, it is preferable that the foregoing decomposition or denaturation of the thermosensitive material due to heat occurs at not higher than 280° C., and especially preferably at not higher than 230° C.

In the case where a low-molecular compound is used as the thermosensitive material of the thermosensitive release layer, it is preferred to use it in combination with a binder. Though a polymer that decomposes or denatures itself due to heat to generate a gas can be used as the binder, usual binders not having such a characteristic can also be used. In the case of using a thermosensitive low-molecular compound and a binder together, a weight ratio of the former to the latter is preferably from 0.02/1 to 3/1, and more preferably from 0.05/1 to 2/1. It is preferable that the thermosensitive release layer covers substantially the whole surface of the photothermal converting layer, and its thickness is generally in the range of from 0.03 to 1 μm, and preferably from 0.05 to 0.5 μm.

In the case of a thermal transfer sheet having a construction in which the photothermal converting layer, the thermosensitive release layer and the image forming layer are laminated in this order, the thermosensitive release layer decomposes or denatures due to heat conducted from the photothermal converting layer, to generate a gas. Further, because of this decomposition or gas generation, a part of the thermosensitive release layer disappears, or cohesive failure occurs within the thermosensitive release layer, whereby a bonding force between the photothermal converting layer and the image forming layer lowers. For this reason, a part of the thermosensitive release layer attaches to the image forming layer and finally appears on the surface of the formed image, causing color mixture of the image depending upon the behavior of the thermosensitive release layer. Accordingly, it is desired that the thermosensitive release layer is not substantially colored, i.e., it exhibits high transmission against visible light such that even when transfer of the thermosensitive release layer occurs, visual color mixture does not appear on the formed image. Concretely, the thermosensitive release layer has a light absorption rate against visible light of not more than 50%, and preferably not more than 10%.

Incidentally, in place of providing an independent thermosensitive release layer, the foregoing thermal transfer sheet can be constructed such that the foregoing thermosensitive material is added to a coating solution for photothermal converting layer to form a photothermal converting layer, thereby functioning as both a photothermal converting layer and a photosensitive release layer.

The outmost surface layer in the side at which the image forming layer of the thermal transfer sheet is provided has a coefficient of static friction of not more than 0.35, and preferably not more than 0.20. By defining the coefficient of static friction of the outermost surface layer to be not more than 0.35, it is possible to make the rolls free from staining in traveling the thermal transfer sheet and make the formed image have high image quality. The measurement of the coefficient of static friction is according to the method described in paragraph (0011) of JP-A-2001-47753.

The surface of the image forming layer preferably has a Smooster's value at 23° C. and 55% RH of from 0.5 to 50 mmHg (≅ from 0.0665 to 6.65 kPa) and an Ra of from 0.05 to 0.4 μm. In this way, it is possible to make the number of many micro voids in which the contact surface cannot come into contact with the image receiving layer and the image forming layer small, and such is preferable in view of transfer and further image quality. The foregoing Ra value can be measured using a surface roughness measuring instrument (Surfcom, manufactured by Tokyo Seimitsu Co., Ltd.) according to JIS B0601. The image forming layer preferably has a surface hardness of 10 g or more in terms of a sapphire stylus. It is preferable that one second after grounding the thermal transfer sheet having been charged, the electrification potential of the image forming layer is from −100 to 100 v according to Federal Test Method Standard 4046. It is preferable that the image forming layer has a surface electrical resistance at 23° C. and 55% RH of not more than $10^9 \Omega$.

Next, the image receiving sheet that can be used in combination with the foregoing thermal transfer sheet will be described below.

[Image Receiving Sheet]

(Layer Construction)

The image receiving sheet usually has a construction in which at least one image receiving layer is provided on a support, and if desired, one or two or more layers of a cushioning layer, a release layer, and an interlayer are provided between the support and the image receiving layer. Also, it is preferable in view of traveling property that a back layer is provided on the surface of the support opposite to the image receiving layer.

(Support)

Examples of the support include usual sheet-like base materials such as plastic sheets, metallic sheets, glass sheets, resin coated papers, papers, and various composites. Examples of plastic sheets include polyethylene terephthalate sheets, polycarbonate sheets, polyethylene sheets, polyvinyl chloride sheets, polyvinylidene chloride sheets, polystyrene sheets, styrene-acrylonitrile sheets, and polyester sheets. Also, as papers, printing actual paper stocks, coated papers, and the like can be used.

It is preferable that the support has fine voids. This is because the image quality can be enhanced. Such a support can be prepared by forming a mixed melt comprising a thermoplastic resin having mixed therewith a filler composed of an inorganic pigment, a high-molecular compound incompatible with the foregoing plastic resin, etc. into a single-layered or multilayered film by a melt extruder and further uniaxially or biaxially stretching the film. In this case, the porosity is determined by selection of the resin and the filler, the mixing ratio, the stretching condition, and the like.

As the foregoing thermoplastic resin, a polyolefin resin such as polypropylene and a polyethylene terephthalate resin are preferable because these resins are good in crystallizability and good in stretching property and easy for formation of voids. It is preferable that the foregoing polyolefin resin or polyethylene terephthalate resin is contained as the major component and properly used together with a small amount of other thermoplastic resin. As the inorganic pigment to be used as the filler, ones having a mean particle size of from 1 to 20 μm are preferable, and examples thereof include calcium carbonate, clay, diatomaceous earth, titanium oxide, aluminum hydroxide, and silica. Also, as the incompatible resin to be used as the filler, in the case where polypropylene is used as the thermoplastic resin, it is preferred to combine polyethylene terephthalate as the filler. Details of the support having fine voids are described in JP-A-2001-105752.

Incidentally, the content of the filler such as inorganic pigments in the support is generally from about 2 to 30% in terms of volume.

The support of the image receiving sheet usually has a thickness of from 10 to 400 μm, and preferably from 25 to 200 μm. Also, the surface of the support may be subjected to surface treatment such as corona discharge treatment and glow discharge treatment for the purpose of enhancing adhesion to the image receiving layer (or the cushioning layer) or adhesion to the image forming layer of the thermal transfer sheet.

(Image Receiving Layer)

It is preferable that at least one image receiving layer is provided on the support for the purpose of transferring the image forming layer onto the surface of the image receiving sheet and fixing it. It is preferable that the image receiving layer is a layer formed mainly of an organic polymer binder. As the foregoing binder, thermoplastic resins are preferable, and examples thereof include homopolymers of acrylic monomers such as acrylic acid, methacrylic acid, acrylic acid esters, and methacrylic acid esters and copolymers thereof; cellulose based polymers such as methyl cellulose, ethyl cellulose, and cellulose acetate; homopolymers of vinyl based monomers, such as polystyrene, polyvinylpyrrolidone, polyvinyl butyral, polyvinyl alcohol, and polyvinyl chloride, and copolymers thereof; condensed polymers such as polyesters and polyamides; and rubber based polymers such as butadiene-styrene copolymers. For the sake of obtaining an adequate bonding force to the image forming layer, the binder of the image receiving layer is preferably a polymer having a glass transition temperature (Tg) of lower than 90° C. For achieving this, it is possible to add a plasticizer to the image receiving layer. Also, the binder polymer preferably has a Tg of 30° C. or higher for the purpose of preventing blocking between the sheets. With respect to the binder polymer of the image receiving layer, it is especially preferred to use a polymer the same as or analogous to the binder polymer of the image forming layer from the standpoints of enhancing the adhesion to the image forming layer at the time of laser recording and enhancing the sensitivity and image strength.

The surface of the image receiving layer preferably has a Smooster's value at 23° C. and 55% RH of from 0.5 to 50 mmHg (≅ from 0.0665 to 6.65 kPa) and an Ra of from 0.05 to 0.4 μm. In this way, it is possible to make the number of many micro voids in which the contact surface cannot come into contact with the image receiving layer and the image forming layer small, and such is preferable in view of transfer and further image quality. The foregoing Ra value can be measured using a surface roughness measuring instrument (Surfcom, manufactured by Tokyo Seimitsu Co., Ltd.) according to JIS B0601. It is preferable that one second after grounding the image receiving sheet having been charged, the electrification potential of the image receiving layer is from −100 to 100 V according to Federal Test Method Standard 4046. It is preferable that the coefficient of static friction of the surface of the image receiving layer is not more than 0.8. It is preferable that the surface energy of the surface of the image receiving layer is from 23 to 35 $mg/m^2$.

The image receiving layer of the image receiving sheet preferably has a surface electrical resistance of not more than $1.0\times10^{15}\Omega/sq$, and more preferably from $1.0\times10^{8}$ to $1.0\times10^{13}\Omega/sq$. In this way, not only the attachment of dusts or foreign matters which cause an image defect on the surface of the image receiving layer can be prevented, but also such is a measure for adjusting the image receiving layer so as to have the coefficient of dynamic friction in the invention. The surface electrical resistance is adjusted by selecting the kind and amount of additives to be added to the image receiving layer of the image receiving sheet, such as surfactants and antistatic agents.

In the case where an image is once formed on the image receiving layer and then re-transferred onto an actual paper stock or the like, it is also preferable that at least one layer of the image receiving layer is formed of a photo-curable material. Examples of formulations of such a photo-curable material include a combination comprising a) a photopolymerizable monomer comprising at least one kind of polyfunctional vinyl or vinylidene compounds capable of forming a photopolymer by means of addition polymerization, b) an organic polymer, c) a photopolymerization initiator, and if desired, additives such as thermal polymerization inhibitors. As the foregoing polyfunctional vinyl monomer, unsaturated esters of polyols, especially acrylic acid or methacrylic acid esters (for example, ethylene glycol diacrylate and pentaerythritol tetraacrylate) are used.

Examples of the foregoing organic polymer include the foregoing polymers for image receiving layer. Also, as the photopolymerization initiator, a photo radical polymerization initiator such as benzophenone and Michler's ketone is used in a proportion of from 0.1 to 20% by weight in the layer.

The image receiving layer has a thickness of from 0.3 to 7 μm, and preferably from 0.7 to 4 μm. In the case where the thickness is 0.3 μm or more, it is possible to ensure the film strength in re-transfer onto a printing actual paper stock. By defining the thickness to be not more than 4 μm, gloss of the image after re-transfer onto the actual paper stock is suppressed, and approximation property to a printed matter is improved.

(Other Layers)

A cushioning layer may be provided between the support and the image receiving layer. When a cushioning layer is provided, it is possible to enhance adhesion between the image forming layer and the image receiving layer at the time of laser thermal transfer, thereby enhancing the image quality. Also, even when foreign matters are incorporated between the thermal transfer sheet and the image receiving sheet at the time of recording, the space between the image receiving layer and the image forming layer becomes small due to a deformation action of the cushioning layer, and as a result, the size of image defects such as deletion can be made small. Further, in the case where an image is transferred and formed, and then transferred onto a separately prepared printing actual paper stock, since the image receiving surface is deformed corresponding to the uneven paper surface, it is possible to enhance the transfer property of the image receiving layer. Also, by lowering the gloss of a material to be transferred, approximation property to a printed matter can be enhanced.

The cushioning layer has such a construction that it is readily deformed when a stress is applied to the image receiving layer. For achieving the foregoing effects, it is preferable that the cushioning layer is made of a material having a low elastic modulus, a material having rubber elasticity, or a thermoplastic resin that is easily softened upon heating. The elastic modulus of the cushioning layer is preferably from 0.5 MPa to 1.0 GPa, especially preferably from 1 MPa to 0.5 GPa, and more preferably from 10 to 100 MPa at room temperature. Also, in order to compress foreign matters such as contaminants, it is preferable that the penetration (at 25° C. by 100 g for 5 seconds) defined in JIS K2530 is 10 or more. Also, the cushioning layer has a glass transition temperature of not higher than 80° C., and preferably not higher than 25° C. and preferably has a softening point of from 50 to 200° C. For the sake of adjusting these physical properties such as Tg, a plasticizer can be suitably added in the binder.

Specific examples of a material to be used as the binder of the cushioning layer include polyethylene, polypropylene, polyesters, styrene-butadiene copolymers, ethylene-vinyl acetate copolymers, ethylene-acrylic copolymers, vinyl chloride-vinyl acetate copolymers, vinylidene chloride resins, plasticizer-incorporated vinyl chloride resins, polyamide resins, and phenol resins as well as rubbers such as urethane rubbers, butadiene rubbers, nitrile rubbers, acrylic rubbers, and natural rubbers.

Incidentally, though the thickness of the cushioning layer varies depending upon the resin to be used and other conditions, it is usually from 3 to 100 μm, and preferably from 10 to 52 μm.

Although it is necessary that the image receiving layer and the cushioning layer are bonded until the stage of laser recording, for the sake of transferring an image onto a printing actual paper stock, it is preferable that the both layers are provided such that they can be released. For the sake of making the release easy, it is also preferable that a release layer is provided in a thickness of from about 0.1 to 2 μm between the cushioning layer and the image forming layer. When the layer thickness is too thick, the performance of the cushioning layer hardly appears, and therefore, it is necessary to adjust the layer thickness depending upon the kind of the release layer.

In the case where a release layer is provided, specific examples of a binder thereof include thermo-curable resins having a Tg of 65° C. or higher and cured materials of these resins such as polyolefins, polyesters, polyvinyl acetal, polyvinyl formal, polyparabanic acid, polymethyl methacrylate, polycarbonates, ethyl cellulose, nitrocellulose, methyl cellulose, carboxymethyl cellulose, hydroxypropyl cellulose, polyvinyl alcohol, polyvinyl chloride, urethane resins, fluorine based resins, styrenes such as polystyrene and acrylonitrile styrene, and ones resulting from crosslinking of these resins, polyamides, polyether imides, polysulfones, polyether sulfones, and aramids. As a curing agent, general curing agents such as isocyanates and melamines can be used.

When the binder of the release layer is chosen adapting to the foregoing physical properties, polycarbonates, acetal, and ethyl cellulose are preferable from the standpoint of preservability. Further, when an acrylic resin is used in the image receiving layer, the release property in re-transferring an image after laser thermal transfer becomes good, and such is especially preferable.

Also, a layer in which adhesion to the image receiving layer becomes extremely low at the time of cooling can be separately utilized as the release layer. Concretely, the release layer can be a layer composed mainly of a heat fusible compound such as waxes and binders or a thermoplastic resin.

Examples of the heat fusible compound include substances described in JP-A-63-193886. In particular, microcrystalline wax, paraffin wax, carnauba wax, and the like are preferably used. As the thermoplastic resin, ethylene based copolymers such as ethylene-vinyl acetate based resins, cellulose based resins, and the like are preferably used.

If desired, higher fatty acids, higher alcohols, higher fatty acid esters, amides, higher amines, and the like can be added as additives to such a release layer.

Another construction of the release layer is a layer that is fused or softened at the time of heating to cause itself cohesive failure, thereby having release property. It is preferable that a supercooled substance is contained to the release layer.

Examples of supercooled substances include poly-ε-caprolactone, polyoxyethylene, benzotriazole, tribenzylamine, and vanillin.

Further, in a release layer of a still another construction, a compound capable of lowering adhesion to the image receiving layer is contained. Examples of such a compound include silicone based resins such as silicone oil; fluorine based resins such as fluorine-containing acrylic resins; polysiloxane resins; acetal based resins such as polyvinyl butyral, polyvinyl acetal, and polyvinyl formal; solid waxes such as polyethylene waxes and amide waxes; and fluorine based or phosphoric acid ester based surfactants.

With respect to the formation method of a release layer, a solution or latex-formed dispersion of the foregoing materials in a solvent can be coated on the cushioning layer to form the release layer by means of the coating method using a blade coated, a roll coater, a bar coater, a curtain coater, a gravure cater, etc., the extrusion lamination method by a hot melt, or the like. Also, there is a method in which a solution or wax-formed dispersion of the foregoing materials in a solvent is coated on a temporary base by the foregoing method and struck to the cushioning layer, followed by releasing the temporary base.

The image receiving sheet to be combined with the thermal transfer sheet may be of a construction in which the image receiving layer also functions as the cushioning layer. In that case, the image receiving sheet may be of a support/cushioning image receiving layer or support/undercoating layer/cushioning image receiving layer construction. Even in this case, it is preferable that the cushioning image receiving layer is provided in the releasable state such that an image can be re-transferred onto a printing actual paper stock. In this case, the imager after re-transfer onto the printing actual paper stock becomes an image having excellent gloss.

Incidentally, the thickness of the cushioning image receiving layer is from 5 to 100 μm, and preferably from 10 to 40 μm.

Also, it is preferred to provide the image receiving sheet with a back layer on the surface of the support in the side opposite to the side at which the image receiving layer is provided because the traveling property of the image receiving sheet becomes good. It is preferred to add an antistatic agent made of a surfactant or tin oxide fine particles and a matting agent made of silicon oxide, PMMA particles, etc. to the back layer because the traveling property within the recording device becomes good.

The foregoing additives can be added to not only the back layer but also the image receiving layer or other layers, as the need arises. While the kinds of additives cannot be unequivocally defined depending upon the purpose, for example, in the case of a matting agent, particles having a mean particle size of from 0.5 to 10 μm can be added in an amount of from about 0.5 to 80% in the layer. As the antistatic agent, various surfactants and conducting agents can be properly chosen and used such that the layer has a surface resistance of not more than $10^{12}\Omega$, and more preferably not more than $10^{9}\Omega$ under conditions at 23° C. and 50% RH.

As a binder to be used in the back layer, generally used polymers such as gelatin, polyvinyl alcohol, methyl cellulose, nitrocellulose, acetylcellulose, aromatic polyamide resins, silicone resins, epoxy resins, alkyd resins, phenol resins, melamine resins, fluorocarbon resins, polyimide resins, urethane resins, acrylic resins, urethane-modified silicone resins, polyethylene resins, polypropylene resins, polyester resins, Teflon resins, polyvinyl butyral resins, vinyl chloride based resins, polyvinyl acetate, polycarbonates, organic boron compounds, aromatic esters, fluorinated polyurethanes, and polyether sulfones.

To use a crosslinkable water-soluble binder as the binder of the back layer and crosslink it is effective for preventing powder falling of the matting agent and enhancing flaw resistance of the back layer. Also, the effect against blocking at the time of storage is large.

As this crosslinking measure, any one of heat, active rays or pressure or a combination thereof can be employed without particular limitations depending upon the characteristic of a crosslinking agent to be used. As the case may be, for the sake of imparting adhesion to the support, an arbitrary adhesive layer may be provided on the support in the side at which the back layer is provided.

As the matting agent that is preferably added to the back layer, organic or inorganic fine particles can be used.

Examples of organic matting agents include fine particles of polymethyl methacrylate (PMMA), polystyrene, polyethylene, polypropylene, and other radical polymerization based polymers and fine particles of condensed polymers such as polyesters and polycarbonates.

It is preferable that the back layer is provided at a coverage of from about 0.5 to 5 $g/m^2$. When the coverage is less than 0.5 $g/m^2$, the coating property is instable so that a problem such as powder falling of the matting agent is liable to occur. Also, when the back layer is coated at a coverage largely exceeding 5 $g/m^2$, the particle size of the suitable matting agent becomes very large so that the surface of the image receiving layer causes embossing due to the back layer at the time of storage, especially, in thermal transfer of a thin-layer image forming layer, the recorded image is liable to cause deletion or unevenness.

It is preferable that the matting agent has a number average particle size of from 2.5 to 20 μm larger than the layer thickness of the back layer composed only of the binder. In the matting agent, the particles having a particle size of 8 μm or more are required to be present in an amount of 5 $mg/m^2$ or more, and preferably from 6 to 600 $mg/m^2$. In this way, an obstacle of foreign matters is especially improved. Also, when a matting agent having a narrow particle size distribution such that a value σ/rn (=coefficient of variation of particle size distribution) obtaining by dividing a standard deviation of the particle size distribution by a number average particle size is not more than 0.3 is used, not only a defect generated by particles having an abnormally large particle size can be improved, but also a desired performance is obtained in a smaller addition amount. This coefficient of variation is further preferably not more than 0.15.

For the sake of preventing the attachment of foreign matters due to frictional electrification against the traveling rolls, it is preferred to add an antistatic agent. As the antistatic agent, in addition to cationic surfactants, anionic surfactants, nonionic surfactants, high-molecular antistatic agents, and conductive fine particles, compounds described in 11290 *no Kagaku Shohin,* Kagaku Kogyo Nipposha, pp. 875–876 and the like are widely used.

Of the foregoing substances, carbon black, metal oxides such as zinc oxide, titanium oxide, and tin oxide, and conductive fine particles such as organic semiconductors are preferably used as the antistatic agent that can be used in combination in the back layer. In particular, use of conductive fine particles is preferable because the antistatic agent is free from dissociation from the back layer, and a stable antistatic effect is obtained irrespective of the ambient.

Also, for the sake of imparting coating property or release property to the back layer, it is possible to add various activators, releasing agents such as silicone oil and fluorine based resins, and the like.

In the case where the cushioning layer and the image receiving layer have a softening point as measured by TMA (thermomechanical analysis) of not higher than 70° C., the back layer is especially preferable.

The TMA softening point is determined by subjecting a measurement objective to temperature rising at a fixed temperature rising rate while applying a fixed load and observing a phase of the objective. In the invention, a temperature at which the phase of the measurement objective starts to change is defined as the TMA softening point. The measurement of the softening point by TMA can be carried out using a device such as Thermoflex, manufactured by Rigaku Denki Co., Ltd.

The image receiving sheet to be used in the invention has a stiffness of 50 g or more, and preferably from 60 to 90 g.

This is especially effective in traveling of the image receiving sheet in the case of accumulating the transferred image receiving sheet and thermal transfer sheet in the same tray and also effective in ensuring adhesion to a multicolor image forming material-supported body such as a drum, especially adhesion to the thermal transfer sheet to obtain a good image quality.

As a measure of adjusting the stiffness of the image receiving sheet within the foregoing range, a material of the support to be used in the image receiving sheet is chosen, or the kinds and amounts of constitutional binders, powders, additives, and the like of various layers to be formed on the support, such as the image receiving layer and the cushioning layer, are controlled.

The foregoing thermal transfer sheet and the foregoing image receiving sheet can be utilized for the image formation as a laminate resulting from superposition of the image forming layer of the thermal transfer sheet and the image receiving layer of the image receiving sheet.

At this time, from the viewpoints of making the temperature-humidity dependency of recording characteristic small and increasing the transfer sensitivity, the image forming layer of the thermal transfer sheet and the image receiving layer of the image receiving sheet each preferably has a contact angle against water in the range of from 7.0 to 120.0°, and more preferably in the range of from 30 to 120. Also, from the viewpoint of obtaining an image having a sufficient transfer density and a high resolving power, it is preferable that the ratio of an optical density (OD) to a film thickness (μm) (OD/film thickness) of the image forming layer of each of the thermal transfer sheets is 1.80 or more and that the image receiving sheet has a contact angle against water of 86° or more.

The laminate of the thermal transfer sheet and the image receiving sheet can be formed by various methods. For example, the laminate can be easily obtained by superposing the image forming layer of the thermal transfer sheet and the image receiving layer of the image receiving sheet and passing them between pressure heat rolls. In this case, the heating temperature is not higher than 160° C., and preferably not higher than 130° C.

As another method of obtaining the laminate, the foregoing vacuum contact method is also suitably employed. The vacuum contact method is a method in which an image receiving sheet is first wound around a drum provided with suction holes for drawing a vacuum, and a thermal transfer sheet having a size slightly larger than the image receiving sheet is then brought into vacuum contact with the image receiving sheet while uniformly extruding air using a squeeze roll. A still another method is a method in which an image receiving sheet is mechanically stuck onto a metallic drum while drawing it, and a thermal transfer sheet is then similarly stuck thereonto and brought into contact therewith while mechanically drawing it. Of these methods, the vacuum contact method is especially preferable because the temperature control of the heat rolls, etc. is not necessary, and the lamination is liable to be achieved rapidly and uniformly.

The invention will be specifically described below with reference to the following Examples, but it should not be construed that the invention is limited thereto. Incidentally, the term “parts” means “parts by weight” unless otherwise indicated in the description.

EXAMPLE 1-1

Preparation of Thermal Transfer Sheet K (Black)

[Formation of Back Layer]

| [Preparation of coating solution for first back layer] | |
|---|---|
| Aqueous dispersion of acrylic resin (Jurymer ET410, manufactured by Nihon Junyaku Co., Ltd., solids content: 20% by weight): | 2 parts |
| Antistatic agent (aqueous dispersion of tin oxide-antimony oxide) (mean particle size: 0.1 μm, 17% by weight): | 7.0 parts |
| Polyoxyethylene phenyl ether: | 0.1 parts |
| Melamine compound (Sumitics Resin M-3, manufactured by Sumitomo Chemical Co., Ltd.): | 0.3 parts |
| Distilled water: | To make 100 parts in total |

[Formation of First Back Layer]

One surface (back surface) of a biaxially stretched polyethylene terephthalate support having a thickness of 75 μm (the both surfaces of which had an Ra of 0.01 μm) was subjected to corona treatment, and the coating solution for first back layer was coated in a dry layer thickness of 0.03 μm, followed by drying at 180° C. for 30 seconds to form a first back layer. The support has a Young's modulus of 450 kg/mm$^2$ (≅4.4 GPa) in the longitudinal direction and 500 kg/mm$^2$ (≅4.9 GPa) in the width direction, respectively. The support has an F-5 value of 10 kg/mm$^2$ (≅98 MPa) in the longitudinal direction thereof and 13 kg/mm$^2$ (≅127.4 MPa) in the width direction thereof, respectively and has a rate of heat shrinkage at 100° C. for 30 minutes of 0.3% in the longitudinal direction and 0.1% in the width direction, respectively. The support has a breaking strength of 20 kg/mm$^2$ (≅196 MPa) in the longitudinal direction and 25 kg/mm$^2$ (≅245 MPa) in the width direction, respectively and an elastic modulus of 400 kg/mm$^2$ (≅3.9 GPa).

| [Preparation of coating solution for second back layer] | |
|---|---|
| Polyolefin (Chemipearl S-120, manufactured by Mitsui Chemicals, Inc., 27% by weight): | 3.0 parts |
| Antistatic agent (aqueous dispersion of tin oxide-antimony oxide) (mean particle size: 0.1 μm, 17% by weight): | 2.0 parts |
| Colloidal silica (Snowtex C, manufactured by Nissan Chemical Industries, Ltd., 20% by weight): | 2.0 parts |
| Epoxy compound (Denacol EX-614B, manufactured by Nagase Kasei Kogyo Co., Ltd.): | 0.3 parts |
| Distilled water: | To make 100 parts in total |

[Formation of Second Back Layer]

The coating solution for second back layer was coated in a dry layer thickness of 0.03 μm on the first back layer, followed by drying at 170° C. for 30 seconds to form a second back layer.

[Formation of Photothermal Converting Layer]

[Preparation of Coating Solution for Photothermal Converting Layer]

The following respective components were mixed while stirring using a stirrer to prepare a coating solution for photothermal converting layer.

| [Formulation of coating solution for photothermal converting layer] | |
|---|---|
| Infrared absorbing coloring matter (NK-2014, manufactured by Nihon Kanko Shikiso Corporation, which is a cyanine coloring matter having the following structure): | 7.6 parts |
| 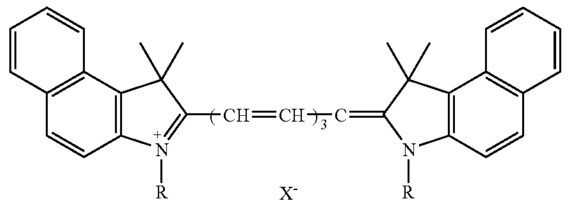 | |
| In the formula, R represents $CH_3$; and $X^-$ represents $ClO_4^-$.) | |
| Polymide resing having the following structure (Rikacoat SN-20F, manufactured by New Japan Chemical Co., Ltd., thermal decomposition temperature: 510° C.): | 29.3 parts |
| 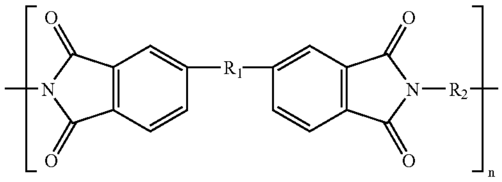 | |
| In the formula, $R_1$ represents $SO_2$; and $R_2$ represents either one of the following groups. | |
| 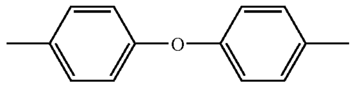 | |
| 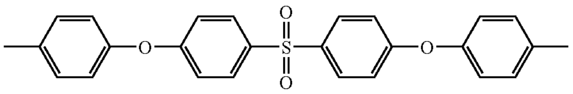 | |
| Exxon naphtha: | 5.8 parts |
| N-Methylpyrrolidone (NMP): | 1,500 parts |
| Methyl ethyl ketone: | 360 parts |
| Surfactant (Megafac F-176PF, manufactured by Dainippon Ink and Chemicals, Incorporated, which is a fluorine based surfactant): | 0.5 parts |
| Matting agent dispersion having the following formulation: | 14.1 parts |

(Preparation of Matting Agent Dispersion)

10 parts of completely spherical silica fine particles having a mean particle size of 1.5 μm (Seahostar KE-P150, manufactured by Nippon Shokubai Co., Ltd.), 2 parts of a dispersant polymer (Joncryl 611, manufactured by Johnson Polymer Corporation, which is an acrylic acid ester-styrene copolymer), 16 parts of methyl ethyl ketone, and 64 parts of N-methylpyrrolidone were mixed and then charged in a polyethylene-made container having a volume of 200 mL together with 30 parts of glass beads having a diameter of 2 mm, and the mixture was dispersed for 2 hours by a paint shaker (manufactured by Toyo Seiki Seisaku-sho, Ltd.) to obtain a dispersion of silica fine particles.

[Formation of Photothermal Converting Layer on the Support Surface]

The foregoing coating solution for photothermal converting layer was coated on one surface of a polyethylene terephthalate film (support) having a thickness of 75 μm using a wire bar, and the coated material was dried for 2 minutes in an oven at 120° C. to form a photothermal converting layer on the support. The resulting photothermal converting layer was measured for optical density at a wavelength of 808 nm using a UV spectrophotometer, UV-240, manufactured by Shimadzu Corporation and found to be OD=1.03. As a result of observation of the cross section of the photothermal converting layer by a scanning electron microscope, the layer thickness was 0.3 μm in average.

[Formation of Image Forming Layer]

[Preparation of Coating Solution for Black Image Forming Layer]

The following respective components were charged in a mill of a kneader and subjected to dispersion pre-treatment by applying a shear force while adding a solvent step by step. A solvent was further added to the dispersion so as to finally have the following formulation, and the mixture was subjected to sand mill dispersion for 2 hours to obtain a pigment dispersion mother liquor.

| [Formulation of coating solution for black image forming layer] | |
|---|---|
| Formulation 1: | |
| Polyvinyl butyral (S-Lec B BL-SH, manufactured by Sekisui Chemical Co., Ltd.): | 12.6 parts |
| Pigment Black 7 (carbon black C.I. No. 77266) (Mitsubishi Carbon Black #5, manufactured by Mitsubishi Chemical Corporation, PVC blackness: 1): | 4.5 parts |
| Dispersing agent (Solsperse S-20000, manufactured by ICI): | 0.8 parts |
| n-Propyl alcohol: | 79.4 parts |
| Formulation 2: | |
| Polyvinyl butyral (S-Lec B BL-SH, manufactured by Sekisui Chemical Co., Ltd.): | 12.6 parts |
| Pigment Black 7 (carbon black C.I. No. 77266) (Mitsubishi Carbon Black MA100, manufactured by Mitsubishi Chemical Corporation, PVC blackness: 10): | 10.5 parts |
| Dispersing agent (Solsperse S-20000, manufactured by ICI): | 0.8 parts |
| n-Propyl alcohol: | 79.4 parts |

Next, the following components were mixed while stirring using a stirrer to prepare a coating, solution for black image forming layer.

| [Formulation of coating solution for black image forming layer] | |
|---|---|
| The foregoing black pigment dispersion mother liquor, formulation 1/formulation 2 = 70/30 (parts): | 185.7 parts |
| Polyvinyl butyral (S-Lec B BL-SH, manufactured by Sekisui Chemical Co., Ltd.): | 11.9 parts |
| Wax based compounds: | |
| (Stearic amide, Neutron 2, manufactured by Nippon Fine Chemical Co., Ltd.): | 1.7 parts |
| (Behenic amide, Diamid BM, manufactured by Nippon Kasei Chemical Co., Ltd.): | 1.7 parts |
| (Lauric amide, Diamid Y, manufactured by Nippon Kasei Chemical Co., Ltd.): | 1.7 parts |
| (Palmitic amide, Diamid KP, manufactured by Nippon Kasei Chemical Co., Ltd.): | 1.7 parts |
| (Erucic amide, Diamid L-200, manufactured by Nippon Kasei Chemical Co., Ltd.): | 1.7 parts |
| (Oleic amide, Diamid O-200, manufactured by Nippon Kasei Chemical Co., Ltd.): | 1.7 parts |

-continued

| [Formulation of coating solution for black image forming layer] | |
|---|---|
| Rosin (KE-311, manufactured by Arakawa Chemical Industries, Ltd.) (Components: resin acid, 80 to 97%; resin acid components: abietic acid, 30 to 40%; neoabietic acid, 10 to 20%; dihydroabietic acid, 14%; tetrahydroabietic acid, 14%): | 11.4 parts |
| Surfactant (Megafac F-176PF, manufactured by Dainippon Ink and Chemicals, Incorporated, solids content: 20%): | 2.1 parts |
| Inorganic pigment (MEK-ST, manufactured by Nissan Chemical Industries, Ltd., 30% methyl ethyl ketone solution) | 7.1 parts |
| n-Propyl alcohol: | 1,050 parts |
| Methyl ethyl ketone: | 295 parts |

Particles in the resulting coating solution for black image forming layer were measured using a particle size distribution analyzer of laser scattering system and found to have a mean particle size of 0.25 μm and a proportion of particles of 1 μm or more of 0.5%.

[Formation of Black Image Forming Layer on the Photothermal Converting Layer Surface]

The foregoing coating solution for black image forming layer was coated on the surface of the foregoing photothermal converting layer for one minute using a wire bar, and the coated material was dried for 2 minutes in an oven at 100° C. to form a black image forming layer on the photothermal converting layer. According to the foregoing steps, a thermal transfer sheet comprising the support having thereon the photothermal converting layer and the black image forming layer in this order (hereinafter referred to as "thermal transfer sheet K"; similarly, a thermal transfer sheet provided with a yellow image forming layer, a thermal transfer sheet provided with a magenta image forming layer and a thermal transfer sheet provided with a cyan image forming layer will be referred to as "thermal transfer sheet Y", "thermal transfer sheet M" and "thermal transfer sheet C", respectively) was prepared.

The image forming layer of the thermal transfer sheet K was measured for transmission optical density (optical density: OD) using a Macbeth densitometer (TD-904) (W filter) and found to be OD=0.91. Also, the black image forming layer was measured for layer thickness and found to have a layer thickness of 0.60 μm in average.

The resulting image forming layer had the following physical properties.

It is preferable that the image forming layer has a surface hardness of 10 g or more in terms of a sapphire stylus, and concretely, the surface hardness was 200 g or more.

It is preferable that the surface has a Smooster's value at 23° C. and 55% RH of from 0.5 to 50 mmHg (≅ from 0.0665 to 6.65 kPa), and concretely, the Smooster's value was 9.3 mmHg (≅1.24 kPa).

It is preferable that the surface has a coefficient of static friction of not more than 0.8, and concretely, the coefficient of static friction was 0.08.

Surface energy was 29 mJ/m$^2$. A contact angle against water was 94.8°.

At the time of recording using laser beam having a light intensity on the exposed surface of 1,000 W/mm$^2$ or more at a linear rate of 1 m/sec or more, the photothermal converting layer had a rate of deformation of 168%.

Preparation of Thermal Transfer Sheet Y

A thermal transfer sheet Y was prepared in the same manner as in the preparation of the thermal transfer sheet K, except that a coating solution for yellow image forming layer having the following formulation was used in place of the coating solution for black image forming layer in the preparation of the foregoing thermal transfer sheet K. The resulting thermal transfer sheet Y had a layer thickness of the image forming layer of 0.42 μm.

| [Formulation of yellow pigment dispersion mother liquor] Yellow pigment formulation 1: | |
|---|---|
| Polyvinyl butyral (S-Lec B BL-SH, manufactured by Sekisui Chemical Co., Ltd.): | 7.1 parts |
| Pigment Yellow 180 (C.I. No. 21290) (Novoperm Yellow P-HG, manufactured by Clariant (Japan) K.K.): | 12.9 parts |
| Dispersing agent (Solsperse S-20000, manufactured by ICI): | 0.6 parts |
| n-Propyl alcohol | 79.4 parts |

| [Formulation of yellow pigment dispersion mother liquor] Yellow pigment formulation 2: | |
|---|---|
| Polyvinyl butyral (S-Lec B BL-SH, manufactured by Sekisui Chemical Co., Ltd.): | 7.1 parts |
| Pigment Yellow 139 (C.I. No. 56298) (Novoperm Yellow M2R 70, manufactured by Clariant (Japan) K.K.): | 12.9 parts |
| Dispersing agent (Solsperse S-20000, manufactured by ICI): | 0.6 parts |
| n-Propyl alcohol | 79.4 parts |

| [Formulation of coating solution for yellow image forming layer] | |
|---|---|
| The foregoing yellow pigment dispersion mother liquor, yellow pigment formulation 1/yellow pigment formulation 2 = 95/5 (parts): | 126 parts |
| Polyvinyl butyral (S-Lec B BL-SH, manufactured by Sekisui Chemical Co., Ltd.): | 4.6 parts |
| Wax based compounds: | |
| (Stearic amide, Neutron 2, manufactured by Nippon Fine Chemical Co., Ltd.): | 0.7 parts |
| (Behenic amide, Diamid BM, manufactured by Nippon Kasei Chemical Co., Ltd.): | 0.7 parts |
| (Lauric amide, Diamid Y, manufactured by Nippon Kasei Chemical Co., Ltd.): | 0.7 parts |
| (Palmitic amide, Diamid KP, manufactured by Nippon Kasei Chemical Co., Ltd.): | 0.7 parts |
| (Erucic amide, Diamid L-200, manufactured by Nippon Kasei Chemical Co., Ltd.): | 0.7 parts |
| (Oleic amide, Diamid O-200, manufactured by Nippon Kasei Chemical Co., Ltd.): | 0.7 parts |
| Nonionic surfactant (Chemistat 1100, manufactured by Sanyo Chemical Industries, Ltd.): | 0.4 parts |
| Rosin (KE-311, manufactured by Arakawa Chemical Industries, Ltd.): | 2.4 parts |
| Surfactant (Megafac F-176PF, manufactured by Dainippon Ink and Chemicals, Incorporated, solids content: 20%): | 0.8 parts |
| n-Propyl alcohol: | 793 parts |
| Methyl ethyl ketone: | 198 parts |

The resulting image forming layer had the following physical properties.

It is preferable that the image forming layer has a surface hardness of 10 g or more in terms of a sapphire stylus, and concretely, the surface hardness was 200 g or more.

It is preferable that the surface has a Smooster's value at 23° C. and 55% RH of from 0.5 to 50 mmHg (≅ from 0.0665 to 6.65 kPa), and concretely, the Smooster's value was 2.3 mg (≅0.31 kPa).

It is preferable that the surface has a coefficient of static friction of not more than 0.8, and concretely, the coefficient of static friction was 0.1.

Surface energy was 24 mJ/m$^2$. A contact angle against water was 108.1°.

At the time of recording using laser beam having a light intensity on the exposed surface of 1,000 W/mm$^2$ or more at a linear rate of 1 m/sec or more, the photothermal converting layer had a rate of deformation of 150%.

Preparation of Thermal Transfer Sheet M

A thermal transfer sheet M was prepared in the same manner as in the preparation of the thermal transfer sheet K, except that a coating solution for magenta image forming layer having the following formulation was used in place of the coating solution for black image forming layer in the preparation of the foregoing thermal transfer sheet K. The resulting thermal transfer sheet M had a layer thickness of the image forming layer of 0.38 μm.

| [Formulation of magenta pigment dispersion mother liquor] Magenta pigment formulation 1: | |
|---|---|
| Polyvinyl butyral (Denka Butyral #2000-L, manufactured by Denki Kagaku Kogyo Kabushiki Kaisha, Vicat softening point: 57° C.): | 12.6 parts |
| Pigment Red 57:1 (C.I. No. 15850:1) (Symuler Brilliant Carmine SB-229, manufactured by Dainippon Ink and Chemicals, Incorporated): | 15.0 parts |
| Dispersing agent (Solsperse S-20000, manufactured by ICI): | 0.6 parts |
| n-Propyl alcohol | 80.4 parts |

| [Formulation of magenta pigment dispersion mother liquor] Magenta pigment formulation 2: | |
|---|---|
| Polyvinyl butyral (Denka Butyral #2000-L, manufactured by Denki Kagaku Kogyo Kabushiki Kaisha, Vicat softening point: 57° C.): | 12.6 parts |
| Pigment Red 57:1 (C.I. No. 15850: 1) (Linol Red 6B-4290G, manufactured by Toyo Ink Mfg. Co., Ltd.): | 15.0 parts |
| Dispersing agent (Solsperse S-20000, manufactured by ICI): | 0.6 parts |
| n-Propyl alcohol | 79.4 parts |

| [Formulation of coating solution for magenta image forming layer] | |
|---|---|
| The foregoing magenta pigment dispersion mother liquor, magenta pigment formulation 1/magenta pigment formulation 2 = 95/5 (parts): | 163 parts |
| Polyvinyl butyral (Denka Butyral #2000-L, manufactured by Denki Kagaku Kogyo Kabushiki Kaisha, Vicat softening point: 57° C.): | 4.0 parts |
| Wax based compounds: | |
| (Stearic amide, Neutron 2, manufactured by Nippon Fine Chemical Co., Ltd.): | 1.0 part |
| (Behenic amide, Diamid BM, manufactured by Nippon Kasei Chemical Co., Ltd.): | 1.0 part |
| (Lauric amide, Diamid Y, manufactured by Nippon Kasei Chemical Co., Ltd.): | 1.0 part |

-continued

| [Formulation of coating solution for magenta image forming layer] | |
|---|---|
| (Palmitic amide, Diamid KP, manufactured by Nippon Kasei Chemical Co., Ltd.): | 1.0 part |
| (Erucic amide, Diamid L-200, manufactured by Nippon Kasei Chemical Co., Ltd.): | 1.0 part |
| (Oleic amide, Diamid O-200, manufactured by Nippon Kasei Chemical Co., Ltd.): | 1.0 part |
| Nonionic surfactant (Chemistat 1100, manufactured by Sanyo Chemical Industries, Ltd.): | 0.7 parts |
| Rosin (KE-311, manufactured by Arakawa Chemical Industries, Ltd.): | 4.6 parts |
| Pentaerythritol tetraacrylate (NK Ester A-TMMT, manufactured by Shin-Nakamura Chemical Co., Ltd.): | 2.5 parts |
| Surfactant (Megafac F-176PF, manufactured by Dainippon Ink and Chemicals, Incorporated, solids content: 20%): | 1.3 parts |
| n-Propyl alcohol: | 848 parts |
| Methyl ethyl ketone: | 246 parts |

The resulting image forming layer had the following physical properties.

It is preferable that the image forming layer has a surface hardness of 10 g or more in terms of a sapphire stylus, and concretely, the surface hardness was 200 g or more.

It is preferable that the surface has a Smooster's value at 23° C. and 55% RH of from 0.5 to 50 mmHg (≅ from 0.0665 to 6.65 kPa), and concretely, the Smooster's value was 3.5 mmHg (≅0.47 kPa).

It is preferable that the surface has a coefficient of static friction of not more than 0.8, and concretely, the coefficient of static friction was 0.08.

Surface energy was 25 mJ/$m^2$. A contact angle against water was 98.8°.

At the time of recording using laser beam having a light intensity on the exposed surface of 1,000 W/$mm^2$ or more at a linear rate of 1 m/sec or more, the photothermal converting layer had a rate of deformation of 160%.

Preparation of Thermal Transfer Sheet C

A thermal transfer sheet C was prepared in the same manner as in the preparation of the thermal transfer sheet K, except that a coating solution for cyan image forming layer having the following formulation was used in place of the coating solution for black image forming layer in the preparation of the foregoing thermal transfer sheet K. The resulting thermal transfer sheet C had a layer thickness of the image forming layer of 0.45 μm.

| [Formulation of cyan pigment dispersion mother liquor] Cyan pigment formulation 1: | |
|---|---|
| Polyvinyl butyral (S-Lec B BL-SH, manufactured by Sekisui Chemical Co., Ltd.): | 12.6 parts |
| Pigment Blue 15:4 (C.I. No. 74160) (Cyanine Blue 700-10FG, manufactured by Toyo Ink Mfg. Co., Ltd.): | 15.0 parts |
| Dispersing agent (PW-36, manufactured by Kusumoto Chemicals, Ltd.): | 0.8 parts |
| n-Propyl alcohol | 110 parts |

| [Formulation of cyan pigment dispersion mother liquor] Cyan pigment formulation 2: | |
|---|---|
| Polyvinyl butyral (S-Lec B BL-SH, manufactured by Sekisui Chemical Co., Ltd.): | 12.6 parts |
| Pigment Blue 15 (C.I. No. 74160) (Linol Blue 7027, manufactured by Toyo Ink Mfg. Co., Ltd.): | 15.0 parts |
| Dispersing agent (PW-36, manufactured by Kusumoto Chemicals, Ltd.): | 0.8 parts |
| n-Propyl alcohol | 110 parts |

| [Formulation of coating solution for cyan image forming layer] | |
|---|---|
| The foregoing cyan pigment dispersion mother liquor, cyan pigment formulation 1/cyan pigment formulation 2 = 90/10 (parts): | 118 parts |
| Polyvinyl butyral (S-Lec B BL-SH, manufactured by Sekisui Chemical Co., Ltd.): | 5.2 parts |
| Inorganic pigment, MEK-ST: | 1.3 parts |
| Wax based compounds: | |
| (Stearic amide, Neutron 2, manufactured by Nippon Fine Chemical Co., Ltd.): | 1.0 part |
| (Behenic amide, Diamid BM, manufactured by Nippon Kasei Chemical Co., Ltd.): | 1.0 part |
| (Lavuric amide, Diamid Y, manufactured by Nippon Kasei Chemical Co., Ltd.): | 1.0 part |
| (Palmitic amide, Diamid KP, manufactured by Nippon Kasei Chemical Co., Ltd.): | 1.0 part |
| (Erucic amide, Diamid L-200, manufactured by Nippon Kasei Chemical Co., Ltd.): | 1.0 part |
| (Oleic amide, Diamid O-200, manufactured by Nippon Kasei Chemical Co., Ltd.): | 1.0 part |
| Rosin (KE-311, manufactured by Arakawa Chemical Industries, Ltd.): | 2.8 parts |
| Pentaerythritol tetraacrylate (NK Ester A-TMMT, manufactured by Shin-Nakamura Chemical Co., Ltd.): | 1.7 parts |
| Surfactant (Megafac F-176PF, manufactured by Dainippon Ink and Chemicals, Incorporated, solids content: 20%): | 1.7 parts |
| n-Propyl alcohol: | 890 parts |
| Methyl ethyl ketone: | 247 parts |

The resulting image forming layer had the following physical properties.

It is preferable that the image forming layer has a surface hardness of 10 g or more in terms of a sapphire stylus, and concretely, the surface hardness was 200 g or more.

It is preferable that the surface has a Smooster's value at 23° C. and 55% RH of from 0.5 to 50 mmHg (≅ from 0.0665 to 6.65 kPa), and concretely, the Smooster's value was 7.0 mmHg (≅0.93 kPa).

It is preferable that the surface has a coefficient of static friction of not more than 0.8, and concretely, the coefficient of static friction was 0.08.

Surface energy was 25 mJ/$m^2$. A contact angle against water was 98.8°.

At the time of recording using laser beam having a light intensity on the exposed surface of 1,000 W/$mm^2$ or more at a linear rate of 1 m/sec or more, the photothermal converting layer had a rate of deformation of 165%.

Preparation of Image Receiving Sheet

A coating solution for cushioning layer and a coating solution for image receiving layer each having the following formulation were prepared.

| [Coating solution for cushioning layer] | |
|---|---|
| Vinyl chloride-vinyl acetate copolymer (major binder) (MPR-TSL, manufactured by Nissin Chemical Industry Co., Ltd.): | 20 parts |
| Plasticizer (Paraplex G-40, manufactured by The CP. Hall Company): | 10 parts |
| Surfactant (fluorine based coating aid) (Megafac F-177, manufactured by Dainippon Ink and Chemicals, Incorporated): | 0.5 parts |
| Antistatic agent (quaternary ammonium salt) (SAT-5 Supper (IC), manufactured by Nihon Junyaku Co., Ltd.): | 0.3 parts |
| Methyl ethyl ketone: | 60 parts |
| Toluene: | 10 parts |
| N,N-Dimethylformamide: | 3 parts |

| [Coating solution for image receiving layer] | |
|---|---|
| Polyvinyl butyral (S-Lec B BL-SH, manufactured by Sekisui Chemical Co., Ltd.): | 8 parts |
| Antistatic agent (Sanstat 2012A, manufactured by Sanyo Chemical Industries, Ltd.): | 0.7 parts |
| Surfactant (Megafac F-177, manufactured by Dainippon Ink and Chemicals, Incorporated): | 0.1 parts |
| n-Propyl alcohol | 20 parts |
| Methanol: | 20 parts |
| 1-Methoxy-2-propanol: | 50 parts |

The foregoing coating solution for cushioning layer was coated on a white PET (polyethylene terephthalate) support (Lumirror #130E58, manufactured by Toray Industries, Inc., thickness: 130 μm) using a coating machine for small width, the coated layer was dried, and the coating solution for image receiving layer was subsequently coated, followed by drying. The coating amounts were adjusted such that after drying, the layer thickness of the cushioning layer and the image receiving layer was about 20 μm and about 2 μm, respectively. The white PET support is a void-containing plastic support comprising a laminate (total thickness: 130 μm, specific gravity: 0.8) of a void-containing polyethylene terephthalate layer (thickness: 116 μm, porosity: 20%) having a titanium oxide-containing polyethylene terephthalate layer (thickness: 7 μm, titanium oxide content: 2%) provided on the both surfaces thereof. The thus prepared material was wound up in the roll state, stored at room temperature for one week, and then used for the following image recording using laser beam.

The resulting image receiving layer had the following physical properties.

It is preferable that the surface roughness Ra is from 0.4 to 0.01 μm, and concretely, the surface roughness was 0.02 μm.

It is preferable that the image receiving layer has a surface waviness of not more than 2 μm, and concretely, the surface waviness was 1.2 μm.

It is preferable that the surface of the image receiving layer has a Smooster's value at 23° C. and 55% RH of from 0.5 to 50 mmHg (≅ from 0.0665 to 6.65 kPa), and concretely, the Smooster's value was 0.8 mmHg (≅0.11 kPa).

It is preferable that the surface has a coefficient of static friction of not more than 0.8, and concretely, the coefficient of static friction was 0.37.

Surface energy was 29 mJ/m$^2$. A contact angle against water was 87.0°.

Incidentally, a rate of heat shrinkage in the machine direction (M) and a rate of heat shrinkage in the transverse direction (T) of the image receiving sheet were shown in Table 2. The measurement method of the rate of heat shrinkage is according to the following method.

Measurement Method of Rate of Heat Shrinkage:

A sample having a size of 10 mm in width and 300 mm in length is heat treated at 150° C. for 30 minutes while applying a load of 3 gf in the lengthwise direction, the dimension before and after the treatment is measured, and the rate of heat shrinkage is calculated according to the following equation.

$$\text{Rate of heat shrinkage }(\%)=(L1-L2)\times 100/L1$$

L1; Length before the treatment

L2: Length after the treatment

Formation of Transferred Image

Figure 4:
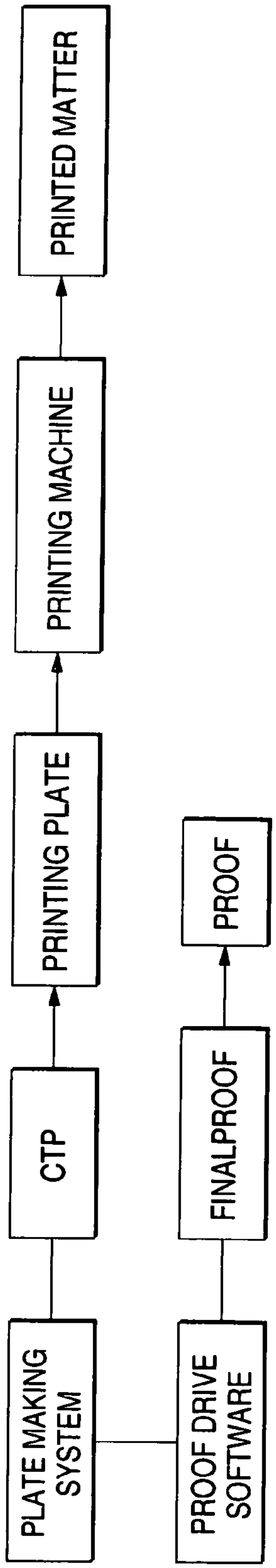
FIG. 4 is a view to show a constitutional example of a system using a laser thermal transfer recording device FINALPROOF.

With respect to the image forming system, Luxel FINALPROOF 5600 was used as the recording device in the system described in FIG. 4, and a transferred image onto an actual paper stock was obtained by the image forming sequence of the present system and the transfer method of actual paper stock to be used in the present system.

The image receiving sheet prepared above (56 cm×79 cm) was wound around a rotating drum having a diameter of 38 cm and provided with vacuum section holes having a diameter of 1 mm (at a surface density of one hole per area of 3 cm×8 cm) and vacuum adsorbed. Next, the foregoing thermal transfer sheet K (black) having been cut into a size of 61 cm×84 cm was superposed in such a manner that it was uniformly projected from the foregoing image receiving sheet and then brought into intimate contact therewith and laminated thereon while squeezing using a squeezing roll in such a manner that air was sucked into the section holes. A degree of vacuum in the state that the section holes were plugged was −150 mmHg (≅81.13 kPa) against one atmosphere. The laminate was subjected to laser image (line image) recording by rotating the foregoing drum and converging semiconductor laser beam having a wavelength of 808 nm from the outside on the surface of the laminate on the drum in such a manner that it became a spot of 7 m on the surface of the photothermal converting layer while moving in the perpendicular direction (sub-scanning direction) to the rotating direction (main scanning direction) of the rotating drum. The laser irradiation condition is as follows. Also, as the laser beam used in this Example, laser beam comprising of a multi-beam two-dimensional array made of five rows of parallelograms in the main scanning direction and three rows of parallelograms in the sub-scanning direction was used.

| | |
|---|---|
| Laser power: | 110 mW |
| Revolution number of drum: | 500 rpm |
| Sub-scanning pitch: | 6.35 μm |

Ambient temperature-humidity: Three conditions of at 20° C. and 40%, at 23° C. and 50%, and at 26° C. and 65%

It is preferable that the exposure drum has a diameter of 360 mm or more, and concretely, one having a diameter of 380 mm was used.

Incidentally, the image size is 515 mm×841 mm, and the resolution is 2,600 dpi.

After completion of the laser recording, the laminate was taken off from the drum, and the thermal transfer sheet K was manually peeled away from the image receiving sheet. As a result, it was confirmed that only the light irradiated region of the image forming layer of the thermal transfer sheet K was transferred onto the image receiving sheet from the thermal transfer sheet K.

The image was transferred onto the image receiving sheet from each of the foregoing thermal transfer sheet Y, thermal transfer sheet M and thermal transfer C in the same manner. The transferred images of four colors were further transferred onto recording paper to form a multicolor image. As a result, under a different temperature-humidity condition, even in the case of laser recording with high energy by laser beam of a multi-beam two-dimensional array, a multicolor image having good image quality and stable transfer density could be formed.

Transfer onto the actual paper stock was carried out using a thermal transfer device having a coefficient of dynamic friction of from 0.1 to 0.7 against polyethylene terephthalate as a material quality of the insertion table and a traveling rate of from 15 to 50 mm/sec. It is preferable that the heat roll material quality of the thermal transfer device has a Vickers hardness of from 10 to 100, and concretely, one having a Vickers hardness of 70 was used.

The resulting image was good under all of three ambient temperature-humidity conditions.

With respect to the optical density, an image having been subjected to actual paper stock transfer onto tokubishi art paper was measured for reflection optical density (OD) for each of Y, M, C and K colors at each of the Y, M, C and K modes by a densitometer, X-rite 938 (manufactured by X-rite).

The optical density (OD) of each color and optical density/layer thickness of image forming layer (μm) were those shown in the following Table 1.

TABLE 1

| Color | Reflection optical density (OD) | OD/ (Layer thickness) |
|---|---|---|
| Y | 1.01 | 2.40 |
| M | 1.51 | 3.97 |
| C | 1.59 | 3.03 |
| K | 1.82 | 3.03 |

Further, the register accuracy and the state of generation of wrinkles at the time of actual paper stock transfer were evaluated in the following methods. The results are shown in Table 2.

Evaluation Method of Register Accuracy:

With respect to each of the Y, M, C and X colors, one dot line was printed (hereinafter referred to as "register mark") in the same place in the longitudinal direction/crosswise direction, and a deviation was measured and evaluated according to the following three grades.

○: The maximum deviation is not more than 4 μm including the longitudinal direction/crosswise direction.

Δ: The maximum deviation is within the range of from 5 to 20 μm including the longitudinal direction/crosswise direction.

X: The maxim=m deviation exceeds 20 μm including the longitudinal direction/crosswise direction.

Wrinkles at the Time of Transfer Onto Actual Paper Stock:

Transfer on lightweight coated paper, Henry Coat 64 (basis weight: 649 /$m^2$) was carried out at a rate of 10 mm/sec using Laminator CP5600 (manufactured by Fuji Photo Film Co., Ltd.), and the generation of wrinkles was visually observed and evaluated according to the following two grades.

○: The generation cannot be visualized.

X: The generation can be visualized.

Also, a transferred image was formed in the same manner as described above, except that Proof Setter Spectrum, manufactured by Creo Scitex was used in place of the Luxel FINALPROOF 5600. As a result, a good image was similarly obtained.

COMPARATIVE EXAMPLES 1-1 and 1-2

Image receiving sheets having a rate of heat shrinkage in the machine direction (M) and a rate of heat shrinkage in the transverse direction (T) as shown in Table 2 were obtained in the same manner as in Example 1-1, except using a support of the image receiving sheet obtained by changing the film forming temperature and having a different rate of heat shrinkage.

The register accuracy and the state of generation of wrinkles at the time of actual paper stock transfer were evaluated in the foregoing methods. The results are shown in Table 2.

TABLE 2

| | Rate of heat shrinkage (%) | | | Wrinkles at the time of transfer |
|---|---|---|---|---|
| | Machine direction | Transverse direction | Register accuracy | onto actual paper stock |
| Example 1-1 | 0.84 | 0.2 | ○ | ○ |
| Comparative Example 1-1 | 1.2 | 1.1 | x | x |
| Comparative Example 1-2 | 0.56 | 0.9 | ○ | x |

It is clear from the results shown in Table 2 that the multicolor image forming material constructed of the image receiving sheet falling within the ranges specified in the invention with respect to the rate of heat shrinkage in the machine direction (M) and the rate of heat shrinkage in the transverse direction (T) is good in register accuracy and suppressed in the generation of wrinkles at the time of actual paper stock transfer.

EXAMPLE 2-1

Preparation of Thermal Transfer Sheets K, Y, M and C

Thermal transfer sheets K (black), Y (yellow), M (magenta) and C (cyan) were prepared in the same manner as in Example 1-1, except that in Example 1-1, a matting agent dispersion having the following formulation was used as the matting agent dispersion in preparing a coating solution for photothermal converting layer. The physical properties of the photothermal converting layer and the image forming layer in each of the thermal transfer sheets were substantially identical with those obtained in Example 1-1.

Formulation of Matting Agent Dispersion:

| | |
|---|---|
| N-Methyl-2-pyrrolidone (NMP): | 69 parts |
| Methyl ethyl ketone: | 20 parts |
| Styrene-acrylic resin (Joncryl 611, manufactured by Johnson Polymer Corporation): | 3 parts |

-continued

| | |
|---|---|
| $SiO_2$ particle (Seahostar KE-P150, manufactured by Nippon Shokubai Co., Ltd., which is a silica particle): | 8 parts |

Preparation of Image Receiving Sheet

A coating solution for cushioning layer having the same formulation as in Example 1-1 and a coating solution for image receiving layer having the following formulation were prepared.

| [Coating solution for image receiving layer] | |
|---|---|
| Polyvinyl butyral (S-Lec B BL-SH, manufactured by Sekisui Chemical Co., Ltd.): | 8 parts |
| Acrylic fine particle (matting agent, mean particle size: 5 μm) (MX 500, manufactured by The Soken Chemical & Engineering Co., Ltd.): | 0.3 parts |
| Antistatic agent (Sanstat 2012A, manufactured by Sanyo Chemical Industries, Ltd.): | 0.7 parts |
| Surfactant (Megafac F-177, manufactured by Dainippon Ink and Chemicals, Incorporated): | 0.1 parts |
| n-Propyl alcohol | 20 parts |
| Methanol: | 20 parts |
| 1-Methoxy-2-propanol: | 50 parts |

The foregoing coating solution for cushioning layer was coated on a white PET (polyethylene terephthalate) support (Lumirror #130E58, manufactured by Toray Industries, Inc., thickness: 130 μm) using a coating machine for small width, the coated layer was dried, and the coating solution for image receiving layer was subsequently coated, followed by drying. The coating amounts were adjusted such that after drying, the layer thickness of the cushioning layer and the image receiving layer was about 20 μm and about 2 μm, respectively. The white PET support is a void-containing plastic support comprising a laminate (total thickness: 130 μm, specific gravity: 0.8) of a void-containing polyethylene terephthalate layer (thickness: 116 μm, porosity: 20%) having a titanium oxide-containing polyethylene terephthalate layer (thickness: 7 μm, titanium oxide content: 2%) provided on the both surfaces thereof. The thus prepared material was wound up in the roll state, stored at room temperature for one week, and then used for the following image recording using laser beam.

The resulting image receiving layer had the following physical properties.

It is preferable that the surface roughness Ra is from 0.4 to 0.01 μm, and concretely, the surface roughness was 0.3 μm.

It is preferable that the image receiving layer has a surface waviness of not more than 2 μm, and concretely, the surface waviness was 1.2 μm.

It is preferable that the surface of the image receiving layer has a Smooster's value at 23° C. and 55% RH of from 0.5 to 50 mmHg (≅ from 0.0665 to 6.65 kPa), and concretely, the Smooster's value was 8 mmHg (≅1.1 kPa).

It is preferable that the surface has a coefficient of static friction of not more than 0.8, and concretely, the coefficient of static friction was 0.37.

Formation of Transferred Image

With respect to the image forming system, Luxel FINALPROOF 5600 was used, and a transferred image onto an actual paper stock was obtained by the image forming sequence of the present system and the transfer method of actual paper stock to be used in the present system.

The image receiving sheet prepared above (56cm×79 cm) was wound around a rotating drum having a diameter of 38 cm and provided with vacuum section holes having a diameter of 1 mm. (at a surface density of one hole per area of 3 cm×8 cm) and vacuum adsorbed. Next, the foregoing thermal transfer sheet K (black) having been cut into a size of 61 cm×84 cm was superposed in such a manner that it was uniformly projected from the foregoing image receiving sheet and then brought into intimate contact therewith and laminated thereon while squeezing using a squeezing roll in such a manner that air was sucked into the section holes. A degree of vacuum in the state that the section holes were plugged was −150 mmHg (≅81.13 kPa) against one atmosphere. The laminate was subjected to laser image (line image) recording by rotating the foregoing drum and converging semiconductor laser beam having a wavelength of 808 nm from the outside on the surface of the laminate on the drum in such a manner that it became a spot of 7 μm on the surface of the photothermal converting layer while moving in the perpendicular direction (sub-scanning direction) to the rotating direction (main scanning direction) of the rotating drum. The laser irradiation condition is as follows. Also, as the laser beam used in this Example, laser beam comprising of a multi-beam two-dimensional array made of five rows of parallelograms in the main scanning direction and three rows of parallelograms in the sub-scanning direction was used.

| | |
|---|---|
| Laser power: | 110 mW |
| Revolution number of drum: | 500 rpm |
| Sub-scanning pitch: | 6.35 μm |

Ambient temperature-humidity: Three conditions of at 18° C. and 30%, at 23° C. and 50%, and at 26° C. and 65%

It is preferable that the exposure drum has a diameter of 360 mm or more, and concretely, one having a diameter of 380 mm was used.

Incidentally, the image size is 515 mm×841 mm, and the resolution is 2,600 dpi.

After completion of the laser recording, the laminate was taken off from the drum, and the thermal transfer sheet K was manually peeled away from the image receiving sheet. As a result, it was confirmed that only the light irradiated region of the image forming layer of the thermal transfer sheet K was transferred onto the image receiving sheet from the thermal transfer sheet K.

The image was transferred onto the image receiving sheet from each of the foregoing thermal transfer sheet Y, thermal transfer sheet M and thermal transfer C in the same manner. The transferred images of four colors were further transferred onto recording paper to form a multicolor image. As a result, under a different temperature-humidity condition, even in the case of laser recording with high energy by laser beam of a multi-beam two-dimensional array, a multicolor image having good image quality and stable transfer density could be formed.

Transfer onto the actual paper stock was carried out using a thermal transfer device having a coefficient of dynamic friction of from 0.1 to 0.7 against polyethylene terephthalate as a material quality of the insertion table and a traveling rate of from 15 to 50 mm/sec. It is preferable that the heat roll material quality of the thermal transfer device has a Vickers hardness of from 10 to 100, and concretely, one having a Vickers hardness of 70 was used.

The resulting image was good under all of three ambient temperature-humidity conditions.

EXAMPLE 2-2

An image receiving sheet was prepared, and a transferred image was formed in the same manner as in Example 2-1, except that in Example 2-1, a biaxially stretched polyethylene terephthalate support having a thickness of 97 μm as used in the thermal transfer sheet was used in place of the white PET (polyethylene terephthalate) support (Lumirror #130E58, manufactured by Toray Industries, Inc., thickness: 130 μm) as used in the image receiving sheet. As a result, an image similar to that in Example 2-1 was obtained.

The image receiving layer of the resulting image receiving sheet had the following physical properties.

The surface roughness Ra was 0.3 μm. The surface waviness of the image receiving layer was 1.2 μm. The Smooster's value of the surface of the image receiving layer at 23° C. and 55% RH of was 8 mmHg (≅1.1 kPa). The coefficient of static friction of the surface of the image receiving slayer was 037.

EXAMPLE 2-3

An image receiving sheet was prepared, and a transferred image was formed in the same manner as in Example 2-1, except that in Example 2-1, 0.7 parts of the antistatic agent (Sanstat 2012A) was not added to the coating solution for image receiving layer in preparing the image receiving sheet. As a result, an image similar to that in Example 2-1 was obtained.

The image receiving layer of the resulting image receiving sheet had the following physical properties.

The surface roughness Ra was 0.3 μm. The surface waviness of the image receiving layer was 1.2 μm. The Smooster's value of the surface of the image receiving layer at 23° C. and 55% RH of was 8 mmHg (≅1.1 kPa). The coefficient of static friction of the surface of the image receiving slayer was 0.40.

COMPARATIVE EXAMPLE 2-1

An image receiving sheet was prepared, and a transferred image was formed in the same manner as in Example 2-3, except that in Example 2-3, 0.3 parts of the acrylic fine particles (MX500 as the matting agent having a mean particle size of 5 μm) was not added to the coating solution for image receiving layer in preparing the image receiving sheet. As a result, dilution, etc. was observed, and the image quality was inferior to that in Example 2-1.

The image receiving layer of the resulting image receiving sheet had the following physical properties.

The surface roughness Ra was 0.06 μm. The surface waviness of the image receiving layer was 0.2 μm. The Smooster's value of the surface of the image receiving layer at 23° C. and 55% RH of was 0.8 mmHg (≅0.11 kPa). The coefficient of static friction of the surface of the image receiving slayer was 0.52.

Respective characteristics of the resulting image receiving sheets used in Examples 2-1 to 2-3 and Comparative Example 2-1 were measured in the following manners.

<Measurement of Stiffness>

The measurement was carried out using a loop stiffness tester manufactured by Toyo Seiki Seisaku-sho, Ltd. The sample had a width of 2 cm, and its length was a length sufficient for applying to the analyzer. Also, the measurement was carried out in such a manner that the film surface was faced upwardly.

<Measurement of Surface Electrical Resistance of Image Receiving Layer>

Two electrodes having a length of 10 cm and a width of 1 cm were each brought into contact with the sample at a gap of 2 mm, a voltage of 100 V was applied, the quantity of electricity was measured, and the surface electrical resistance was then calculated from computation.

<Measurement of Coefficient of Dynamic Friction>

Solid images were successively transferred onto image receiving sheets using each of the thermal transfer sheets of black (K), cyan (C), magenta (M) and yellow (Y), and a coefficient of dynamic friction between the exposed are of the thermal transfer sheet and the image receiving surface of the image receiving sheet was measured according to JIS K7125 in such a manner that the thermal transfer sheet on which the transferred photothermal converting layer was exposed was positioned downwardly. Values of coefficient of dynamic friction of four pairs of the thermal transfer sheet and the image receiving sheet were substantially identical with each other.

<Evaluation Test of Accumulation Property>

Solid images were successively transferred onto image receiving sheets using each of the thermal transfer sheets of black (K), cyan (C), magenta (M) and yellow (Y) by a printer of laser thermal transfer system "Proof Setter Spectrum", manufactured by Creo Scitex, and the accumulation property of such a system of accumulating the thermal transfer sheet of the uppermost portion in a tray in such a manner that the photothermal converting layer side is faced upwardly and that the image receiving side of the image receiving sheet is faced downwardly was observed. The evaluation criteria are as follows. The results are shown in Table 3.

Evaluation Criteria

○: There is no problem with respect to the accumulation property.

Δ: The sheets are deviated in the longitudinal direction but accumulated.

X: The image receiving sheet drops the thermal transfer sheet from the accumulation tray, or the image receiving sheet is curled.

TABLE 3

| Multicolor image forming material used | Coefficient of dynamic friction | Stiffness of image receiving sheet (g) | Surface electrical resistance of image receiving sheet | Accumulation property |
|---|---|---|---|---|
| Example 2-1 | 0.51 | 72 | $5 \times 10^{14}$ | ○ |
| Example 2-2 | 0.51 | 54 | $5 \times 10^{14}$ | Δ |
| Example 2-3 | 0.51 | 72 | $2 \times 10^{15}$ | Δ |
| Comparative Example 2-1 | 0.75 | 54 | $2 \times 10^{15}$ | x |

As is clear from the results of Table 3, Examples 2-1 to 2-3 in which the coefficient of dynamic friction falls within the range of the invention exhibited good accumulation property. On the other hand, Comparative Example 2-1 in which the coefficient of dynamic friction falls outside the range of the invention could not be satisfied with respect to the accumulation property.

EXAMPLE 3-1

Preparation of Thermal Transfer Sheets K, Y, M and C

Thermal transfer sheets K (black), Y (yellow), M (magenta) and C (cyan) were prepared in the same manner as in Example 1-1. Physical properties of the photothermal converting layer and the image forming layer of each of the resulting thermal transfer sheets are substantially identical with those obtained in Example 1-1. The image forming layer of the thermal transfer sheet K had a reflection optical density (OD) of 1.82, a layer thickness of 0.60 μm, and an OD/(layer thickness) of 3.03; the image forming layer of the thermal transfer sheet Y had a reflection optical density (OD) of 1.01, a layer thickness of 0.42 μm, and an OD/(layer thickness) of 2.40; the image forming layer of the thermal transfer sheet M had a reflection optical density (OD) of 1.51, a layer thickness of 0.38 μm, and an OD/(layer thickness) of 3.97; and the image forming layer of the thermal transfer sheet C had a reflection optical density (OD) of 1.59, a layer thickness of 0.45 μm, and an OD/(layer thickness) of 3.53.

Preparation of Image Receiving Sheet

A coating solution for cushioning layer having the same formulation as in Example 1-1 and a coating solution for image receiving layer having the same formulation as in Example 1-1 were prepared.

The foregoing coating solution for cushioning layer was coated on a white PET (polyethylene terephthalate) support (Lumirror #130E58, manufactured by Toray Industries, Inc., thickness: 130 μm) using a coating machine for small width, the coated layer was dried, and the coating solution for image receiving layer was subsequently coated, followed by drying. The coating amounts were adjusted such that after drying, the layer thickness of the cushioning layer and the image receiving layer was about 20 μm and about 2 μm, respectively. The white PET support is a void-containing plastic support comprising a laminate (total thickness: 130 μm, specific gravity: 0.8) of a void-containing polyethylene terephthalate layer (thickness; 116 μm, porosity: 20%) having a titanium oxide-containing polyethylene terephthalate layer (thickness; 7 μm, titanium oxide content: 2%) provided on the both surfaces thereof. The thus prepared material was wound up in the roll state, stored at room temperature for one week, and then used for the following image recording using laser beam.

The resulting image receiving layer had the following physical properties.

It is preferable that the surface roughness Ra is from 0.4 to 0.01 μm, and concretely, the surface roughness was 0.02 It is preferable that the image receiving layer has a surface waviness of not more than 2 μm, and concretely, the surface waviness was 1.2 μm.

It is preferable that the surface of the image receiving layer has a Smooster's value at 23° C. and 55% RH of from 0.5 to 50 mmHg (≅ from 0.0665 to 6.65 kPa), and concretely, the Smooster's value was 0.8 mmHg (≅0.11 kPa).

It is preferable that the surface has a coefficient of static friction of not more than 0.8, and concretely, the coefficient of static friction was 0.37.

Surface energy was 29 $mJ/m^2$. A contact angle against water was 87.0°.

Also, the resulting various thermal transfer sheets and image receiving sheets were measured for Msh, Tsh, Msr and Tsr.

Formation of Transferred Image

With respect to the image forming system, Luxel FINALPROOF 5600 was used as the recording device in the system described in FIG. 4, and a transferred image onto an actual paper stock was obtained by the image forming sequence of the present system and the transfer method of actual paper stock to be used in the present system.

The image receiving sheet prepared above (56 cm×79 cm) was wound around a rotating drum having a diameter of 38 cm and provided with vacuum section holes having a diameter of 1 mm (at a surface density of one hole per area of 3 cm ×8 cm) and vacuum adsorbed. Next, the foregoing thermal transfer sheet K (black) having been cut into a size of 61 cm×84 cm was superposed in such a manner that it was uniformly projected from the foregoing image receiving sheet and then brought into intimate contact therewith and laminated thereon while squeezing using a squeezing roll in such a manner that air was sucked into the section holes. A degree of vacuum in the state that the section holes were plugged was −150 mmHg (≅81.13 kPa) against one atmosphere. The laminate was subjected to laser image (line image) recording by rotating the foregoing drum and converging semiconductor laser beam having a wavelength of 808 nm from the outside on the surface of the laminate on the drum in such a manner that it became a spot of 7 μm on the surface of the photothermal converting layer while moving in the perpendicular direction (sub-scanning direction) to the rotating direction (main scanning direction) of the rotating drum. The laser irradiation condition is as follows. Also, as the laser beam used in this Example, laser beam comprising of a multi-beam two-dimensional array made of five rows of parallelograms in the main scanning direction and three rows of parallelograms in the sub-scanning direction was used.

| | |
|---|---|
| Laser power: | 110 mW |
| Revolution number of drum: | 500 rpm |
| Sub-scanning pitch: | 6.35 μm |

Ambient temperature-humidity: Three conditions of at 20° C. and 40%, at 23° C. and 50%, and at 26° C. and 65%

It is preferable that the exposure drum has a diameter of 360 mm or more, and concretely, one having a diameter of 380 mm was used.

Incidentally, the image size is 515 mm×841 mm, and the resolution is 2,600 dpi.

After completion of the laser recording, the laminate was taken off from the drum, and the thermal transfer sheet K was manually peeled away from the image receiving sheet. As a result, it was confirmed that only the light irradiated region of the image forming layer of the thermal transfer sheet K was transferred onto the image receiving sheet from the thermal transfer sheet K.

The image was transferred onto the image receiving sheet from each of the foregoing thermal transfer sheet Y, thermal transfer sheet M and thermal transfer C in the same manner. The transferred images of four colors were further transferred onto recording paper to form a multicolor image. As a result, under a different temperature-humidity condition, even in the case of laser recording with high energy by laser beam of a multi-bean two-dimensional array, a multicolor image having good image quality and stable transfer density could be formed.

Transfer onto the actual paper stock was carried out using a thermal transfer device having a coefficient of dynamic friction of from 0.1 to 0.7 against polyethylene terephthalate as a material quality of the insertion table and a traveling rate of from 15 to 50 mm/sec. It is preferable that the heat roll material quality of the thermal transfer device has a Vickers hardness of from 10 to 100, and concretely, one having a Vickers hardness of 70 was used.

The resulting image was good under all of three ambient temperature-humidity conditions.

EXAMPLES 3-2 to 3-3 AND COMPARATIVE EXAMPLES 3-1

Multicolor image forming materials were prepared in the same manner as in Example 3-1, except that the stiffness of the thermal transfer sheet and/or the image receiving sheet was changed by the kind of the support. Also, multicolor images were formed in the same manner as in Example 3-1 using the same device and system as in Example 3-1.

The traveling property of the multicolor image forming materials in the foregoing multicolor image forming device was evaluated according to the following way, and the results are shown in Table 4.

TABLE 4

| | Msh | Tsh | Msh/Tsh | Msr | Tsr | Msr/Tsr | Msr − Msh | Tsr − Tsh | Traveling property |
|---|---|---|---|---|---|---|---|---|---|
| Example 3-1 | 43.5 | 39.4 | 1.10 | 73.5 | 72.5 | 1.01 | 30.0 | 33.1 | ⊙ |
| Example 3-2 | 41.5 | 39.4 | 1.10 | 63.0 | 62.0 | 1.01 | 21.5 | 22.6 | ⊙ |
| Example 3-3 | 43.7 | 48.9 | 0.89 | 58.0 | 67.5 | 0.86 | 14.3 | 18.6 | ○ |
| Comparative Example 3-1 | 23.5 | 24.0 | 0.98 | 73.5 | 72.5 | 1.01 | 50.0 | 48.5 | X |

⊙: Jamming or wrinkle is not generated at all in the way of traveling the material.
○: Jamming or wrinkle is generated a little in the way of traveling the material.
X: Jamming or wrinkle is generated in the way of traveling the material so that the image may possibly be influenced.

The multicolor image forming materials of the invention could achieve smooth travel without causing jamming in the recording device.

EXAMPLE 4-1

Preparation of Thermal Transfer Sheets K, Y, M and C

Thermal transfer sheets K (black), Y (yellow), M (magenta) and C (cyan) were prepared in the same manner as in Example 1-1, except that a coating solution for photothermal converting layer having the following formulation was used and that a photothermal converting layer was formed on the support surface in the following manner. Physical properties of the photothermal converting layer and the image forming layer of each of the resulting thermal transfer sheets are substantially identical with those obtained in Example 1-1. The image forming layer of the thermal transfer sheet K had a reflection optical density (OD) of 1.82, a layer thickness of 0.60 μm, and an OD/(layer thickness) of 3.03; the image forming layer of the thermal transfer sheet Y had a reflection optical density (OD) of 1.01, a layer thickness of 0.42 μm, and an OD/(layer thickness) of 2.40; the image forming layer of the thermal transfer sheet M had a reflection optical density (OD) of 1.51, a layer thickness of 0.38 μm, and an OD/(layer thickness) of 3.97; and the image forming layer of the thermal transfer sheet C had a reflection optical density (OD) of 1.59, a layer thickness of 0.45 μm, and an OD/(layer thickness) of 3.53.

| [Formation of coating solution for photothermal converting layer] | |
|---|---|
| Infrared absorbing coloring matter (NK-2014, manufactured by Hayashibara Biochemical Laboratories, Inc., which is a cyanine coloring matter having the same structure as that used in Example 1-1): | 10 parts |
| Polyimide resin (Rikacoat SN-20F, manufactured by New Japan Chemical Co., Ltd., which is a polyimide resin having the same structure as that used in Example 1-1): | 4 parts |
| N-Methyl-2-pyrrolidone (NMP) (manufactured by Mitsubishi Chemical Corporation): | 1,900 parts |
| Methyl ethyl ketone: | 300 parts |
| Matting agent (Seahostar KE-P150, manufactured by Nippon Shokubai Co., Ltd.): | 2 parts |
| Surfactant (Megafac F-176p, manufactured by Dainippon Ink and Chemicals, Incorporated): | 1 part |

[Formation of Photothermal Converting Layer on the Support Surface]

The foregoing coating solution for photothermal converting layer was coated on one surface of a polyethylene terephthalate film (support) having a thickness of 75 μm using a wire bar, and the coated material was dried for 2 minutes in an oven at 120° C. to form a photothermal converting layer on the support. The resulting photothermal converting layer was measured for optical density at a wavelength of 808 nm using a UV spectrophotometer, UV-240, manufactured by Shimadzu Corporation and found to be OD=1.03. As a result of observation of the cross section of the photothermal converting layer by a scanning electron microscope, the layer thickness was 0.3 μm in average.

Incidentally, the optical density (OD) of the photothermal converting layer of the thermal transfer sheet as referred to in the invention means an absorbance of the photothermal converting layer at the peak wavelength of laser beam to be used in recording the image forming material of the invention and can be measured using a known spectrophotometer.

In the invention, a UV-spectrophotometer UV-240, manufactured by Shimadzu Corporation was used as described previously. Also, the foregoing optical density (OD) was defined as a value resulting from subtraction of a value of the only support from a value of the support-containing sheet.

Preparation of Image Receiving Sheet

A coating solution for cushioning layer having the same formulation as in Example 1-1 and a coating solution for image receiving layer having the same formulation as in Example 1-1 were prepared.

The foregoing coating solution for cushioning layer was coated on a white PET (polyethylene terephthalate) support (Lumirror #130E58, by Toray Industries, Inc., thickness: 130 μm) using a coating machine for small width, the coated layer was dried, and the coating solution for image receiving layer was subsequently coated, followed by drying. The coating amounts were adjusted such that after drying, the layer thickness of the cushioning layer and the image receiving layer was about 20 μm and about 2 μm, respectively. The white PET support is a void-containing plastic support comprising a laminate (total thickness: 130 μm, specific gravity: 0.8) of a void-containing polyethylene terephthalate layer (thickness: 116 μm, porosity: 20%) having a titanium oxide-containing polyethylene terephthalate layer (thickness; 7 μm, titanium oxide content: 2%) provided on the both surfaces thereof. The thus prepared material was wound up in the roll state, stored at room temperature for one week, and then used for the following image recording using laser beam.

The resulting image receiving layer had the following physical properties.

It is preferable that the surface roughness Ra is from 0.4 to 0.01 μm, and concretely, the surface roughness was 0.02 μm.

It is preferable that the image receiving layer has a surface waviness of not more than 2 μm, and concretely, the surface waviness was 1.2 μm.

It is preferable that the surface of the image receiving layer has a Smooster's value at 23° C. and 55% RH of from 0.5 to 50 mmHg (≅ from 0.0665 to 6.65 kPa), and concretely, the Smooster's value was 0.8 mmHg (≅0.11 kPa).

It is preferable that the surface has a coefficient of static friction of not more than 0.8, and concretely, the coefficient of static friction was 0.37.

Surface energy was 29 $mJ/m^2$. A contact angle against water was 85.0°.

Formation of Transferred Image

With respect to the image forming system, Luxel FINALPROOF 5600 was used as the recording device in the system described in FIG. 4, and a transferred image onto an actual paper stock was obtained by the image forming sequence of the present system and the transfer method of actual paper stock to be used in the present system.

The image receiving sheet prepared above (56 cm×79 cm) was wound around a rotating drum having a diameter of 38 cm and provided with vacuum section holes having a diameter of 1 mm (at a surface density of one hole per area of 3 cm×8 cm) and vacuum adsorbed. Next, the foregoing thermal transfer sheet K (black) having been cut into a size of 61 cm×84 cm was superposed in such a manner that it was uniformly projected from the foregoing image receiving sheet and then brought into intimate contact therewith and laminated thereon while squeezing using a squeezing roll in such a manner that air was sucked into the section holes. A degree of vacuum in the state that the section holes were plugged was −150 mmHg (≅81.13 kPa) against one atmosphere. The laminate was subjected to laser image (line image) recording by rotating the foregoing drum and converging semiconductor laser beam having a wavelength of 808 nm from the outside on the surface of the laminate on the drum in such a manner that it became a spot of 7 μm on the surface of the photothermal converting layer while moving in the perpendicular direction (sub-scanning direction) to the rotating direction (main scanning direction) of the rotating drum. The laser irradiation condition is as follows. Also, as the laser beam used in this Example, laser beam comprising of a multi-beam two-dimensional array made of five rows of parallelograms in the main scanning direction and three rows of parallelograms in the sub-scanning direction was used.

| | |
|---|---|
| Laser power: | 110 mW |
| Revolution number of drum: | 500 rpm |
| Sub-scanning pitch: | 6.35 μm |

Ambient temperature-humidity: Three conditions of at 18° C. and 30%, at 23° C. and 50%, and at 26° C. and 65%

It is preferable that the exposure drum has a diameter of 360 mm or more, and concretely, one having a diameter of 380 mm was used.

Incidentally, the image size is 515 mm×841 mm, and the resolution is 2,600 dpi.

After completion of the laser recording, the laminate was taken off from the drum, and the thermal transfer sheet K was manually peeled away from the image receiving sheet. As a result, it was confirmed that only the light irradiated region of the image forming layer of the thermal transfer sheet K was transferred onto the image receiving sheet from the thermal transfer sheet K.

The image was transferred onto the image receiving sheet from each of the foregoing thermal transfer sheet Y, thermal transfer sheet M and thermal transfer C in the same manner. The transferred images of four colors were further transferred onto recording paper to form a multicolor image. As a result, under a different temperature-humidity condition, even in the case of laser recording with high energy by laser beam of a multi-beam two-dimensional array, a multicolor image having good image quality and stable transfer density could be formed.

Transfer onto the actual paper stock was carried out using a, thermal transfer device having a coefficient of dynamic friction of from 0.1 to 0.7 against polyethylene terephthalate as a material quality of the insertion table and a traveling rate of from 15 to 50 mm/sec. It is preferable that the heat roll material quality of the thermal transfer device has a Vickers hardness of from 10 to 100, and concretely, one having a Vickers hardness of 70 was used.

The resulting image was good under all of three ambient temperature-humidity conditions.

EXAMPLE 4-2

A thermal transfer sheet was prepared, and a transferred image was formed in the same manner as in Example 4-1, except that in Example 4-1, Tetoron (manufactured by Teijin Limited) was used as the support in place of the polyethylene terephthalate film and that the foregoing coating solution for photothermal converting layer was coated in such a manner that the winding direction of Tetoron was the machine direction of the thermal transfer sheet.

COMPARATIVE EXAMPLE 4-1

A thermal transfer sheet was prepared, and a transferred image was formed in the same manner as in Example 4-1, except that in Example 4-1, the foregoing coating solution for photothermal converting layer was coated in such a manner that the stretching direction of the polyethylene terephthalate film was changed from the machine direction to the crosswise direction of the thermal transfer sheet.

COMPARATIVE EXAMPLE 4-2

A thermal transfer sheet was prepared, and a transferred image was formed in the same manner as in Example 4-1, except that in Example 4-1, the foregoing coating solution for photothermal converting layer was coated in such a manner that the winding direction of the polyethylene terephthalate film was the crosswise direction of the thermal transfer sheet.

<Evaluation Test of Cutting Performance>

Each of the multicolor image forming materials prepared in Examples 4-1 and 4-2 and Comparative Examples 4-1 and 4-2 was passed through TCP5600 (manufactured by Fuji Photo Film Co., Ltd.) and cut using a cutter. The cutting performance was evaluated by observing the cut cross section using a scanning electron microscope. A breaking stress and a breaking elongation were measured at a drawing rate of 40 mm/min using a tensiron (RTM-100, manufactured by ORIENTIC Co.). With respect to SEM photography, S-570 (manufactured by Hitachi, Ltd.) was used. The results are shown in the following Table 5. Also, the evaluation of the cut cross section was observed according to the following evaluation criteria. The results are also shown in the following Table 5.

Evaluation Criteria:

TABLE 5

| | Breaking stress (MPa) | | Breaking elongation (%) | | |
|---|---|---|---|---|---|
| | Crosswise direction (CD) | Machine direction (MD) | Crosswise direction (CD) | Machine direction (MD) | Cut surface |
| Example 4-1 | 239 | 180 | 128 | 163 | ○ |
| Example 4-2 | 250 | 208 | 124 | 193 | ○ |
| Comparative Example 4-1 | 180 | 240 | 166 | 130 | X |
| Comparative Example 4-2 | 205 | 248 | 190 | 121 | X |

○: Scuffing is not observed, and a very sharp edge is revealed.
X: Scuffing is observed, and the cut surface is not clean.

As is clear from the results of Table 5, the multicolor image forming materials obtained in Examples 4-1 and 4-2 exhibited good breaking stress and breaking elongation, and the cut surfaces cut using a cutter were good as compared with the multicolor image forming materials obtained in Comparative Examples 4-1 and 4-2.

INDUSTRIAL APPLICABILITY

According to the invention, the conventional problems in the laser thermal transfer system are overcome, and high image quality is realized on a basis of a thin-layer transfer technology. Accordingly, it is possible to realize sharp halftone dots by a thin-layer transfer system into which the foregoing various technologies are incorporated; to realize an image forming material of a B2 size or more, which is of an actual paper stock transfer, actual halftone dot output or pigment type, and a laser thermal transfer recording system for DDCP comprising an output machine and a high-grade CMS software; and to realize a system construction capable of sufficiently exhibiting an ability of a material with high resolving power. Concretely, it is possible to provide a contract proof corresponding to film-less needs in the CTP era in place of proof printing or color proof of analog system, and this proof can reproduce color reproduction coincident with the printed matter or color proof of analog system for the purpose of obtaining an approval from a client. It is possible to undergo actual paper stock transfer using pigment based coloring materials the same as printing inks, and a DDCP system free from Moire fringe. Also, according to the invention, it is possible to provide a digital direct color proof system of a large size (A2/B2 or more) with high approximation property to a printed matter using pigment based coloring materials the same as printing inks. The invention is suitable for actual paper stock transfer by undergoing actual halftone dot recording using a laser thin-layer thermal transfer system and using pigment coloring materials. Even in the case where laser recording is performed with high energy by laser beam as a multi-beam two-dimensional array under a different temperature-humidity condition, the image quality is good, and an image having a good image quality and a stable transfer density can be formed on an image receiving sheet. Especially, according to the invention, there are provided a multicolor image forming material in which the register accuracy is good, and the generation of wrinkles at the time of actual paper stock transfer is suppressed; a multicolor image forming material in which the accumulation property between a thermal transfer sheet and an image receiving sheet after image recording by transfer onto an image receiving layer of the image receiving sheet from the thermal transfer sheet is good; a multicolor image forming material having excellent traveling property; and a multicolor image forming material in which the a thermal transfer sheet has excellent cutting performance and which is free from a lowering of the image quality caused by scuffs on the cut surface or foreign matters generated at the time of cutting, such as contaminants. Also, there is provided a multicolor image forming method using these excellent multicolor image forming materials having excellent performances.

The invention claimed is:

1. A multicolor image forming material comprising an image receiving sheet containing an image receiving layer and thermal transfer sheets of different colors of 4 or more kinds of at least yellow, magenta, cyan and black, each containing a support and at least a photothermal converting layer and an image forming layer, wherein the image forming layer of each of the thermal transfer sheets and the image receiving layer of the image receiving sheet are superposed opposite to each other, and upon irradiation with a laser beam, a laser beam irradiated region of the image forming layer is transferred onto the image receiving layer of the image receiving sheet to undergo multicolor image recording, wherein:

a) a ratio of an optical density COD) to a film thickness (μm) (OD/film thickness) of the image forming layer of each of the thermal transfer sheets is 1.50 or more, b) a recording area of a multicolor image of each of the thermal transfer sheets is of a size of 515 mm×728 mm or more, c) a resolution of the transferred image onto the image receiving layer of the image receiving sheet is 2,400 dpi or more, d) a rate of heat shrinkage in a machine direction (M) and a rate of heat shrinkage in a transverse direction (T) of the image receiving sheet are both not more than 1%, and e) the rate of heat shrinkage in a transverse direction (T) of the image receiving sheet is smaller than the rate of heat shrinkage in a machine direction (M) thereof.

2. The multicolor image forming material according to claim 1, wherein the image forming layer of each of the thermal transfer sheets and the image receiving layer of the image receiving sheet each has a contact angle against water in a range of from 7.0 to 120.0°.

3. The multicolor image forming material according to claim 1 or 2, wherein the ratio of an optical density (OD) to a film thickness (μm) (OD/film thickness) of the image forming layer of each of the thermal transfer sheets is 1.80 or more and the contact angle of the image receiving sheet against water is 86° or more.

4. The multicolor image forming method including using a multicolor image forming material comprising an image receiving sheet containing an image receiving layer and thermal transfer sheets of different colors of 4 or more kinds, each containing a support and at least a photothermal converting layer and an image forming layer, superposing the image forming layer of each of the thermal transfer sheets and the image receiving layer of the image receiving sheet opposite to each other, and irradiating with a laser beam to transfer a laser beam irradiated region of the image forming layer onto the image receiving layer of the image receiving sheet, thereby undergoing multicolor image recording, wherein the multicolor image forming material is the multicolor image forming material according to claim 1.

* * * * *